(12) United States Patent
Fukuzawa et al.

(10) Patent No.: US 9,841,444 B2
(45) Date of Patent: Dec. 12, 2017

(54) CURRENT SENSOR AND CURRENT SENSOR MODULE

(71) Applicant: KABUSHIKI KAISHA TOSHIBA, Tokyo (JP)

(72) Inventors: Hideaki Fukuzawa, Kanagawa (JP); Yoshihiko Fuji, Kanagawa (JP); Shiori Kaji, Kanagawa (JP); Yoshihiro Higashi, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 14/574,437

(22) Filed: Dec. 18, 2014

(65) Prior Publication Data

US 2015/0177284 A1 Jun. 25, 2015

(30) Foreign Application Priority Data

Dec. 25, 2013 (JP) .................................. 2013-268000

(51) Int. Cl.
*G01R 19/00* (2006.01)
*G01R 33/09* (2006.01)

(52) U.S. Cl.
CPC ....... *G01R 19/0092* (2013.01); *G01R 33/093* (2013.01)

(58) Field of Classification Search
CPC .......................... G01R 19/0092; G01R 33/093
See application file for complete search history.

(56) References Cited

U.S. PATENT DOCUMENTS

| 2002/0097533 A1 | 7/2002 | Funayama et al. |
| 2004/0257719 A1 | 12/2004 | Ohba et al. |
| 2007/0139827 A1 | 6/2007 | Gao et al. |

(Continued)

FOREIGN PATENT DOCUMENTS

| DE | 10 2007 040 399 A1 | 3/2009 |
| JP | 2002-280644 | 9/2002 |

(Continued)

OTHER PUBLICATIONS

Extended European Search Report issued by the European Patent Office dated Dec. 17, 2015, for European Patent Application No. 14199285.9.

*Primary Examiner* — Jermele M Hollington
*Assistant Examiner* — Feba Pothen
(74) *Attorney, Agent, or Firm* — Finnegan, Henderson, Farabow, Garrett & Dunner, L.L.P.

(57) ABSTRACT

According to one embodiment, a current sensor includes a first sensor element and a power line. The first sensor element includes a first electrode, a second electrode, and a first stacked body. The first stacked body is provided between the first electrode and the second electrode. The first stacked body includes a first magnetic layer, a second magnetic layer and a first intermediate layer. The second magnetic layer is provided between the first magnetic layer and the second electrode. The first intermediate layer is provided between the first magnetic layer and the second magnetic layer. The first intermediate layer is nonmagnetic. A magnetization of the second magnetic layer changes according to a magnetic field generated by a current flowing through the power line. At least a portion of the second magnetic layer is amorphous.

20 Claims, 35 Drawing Sheets

(56) References Cited

U.S. PATENT DOCUMENTS

| | | |
|---|---|---|
| 2008/0007877 A1 | 1/2008 | Takashita et al. |
| 2009/0097170 A1* | 4/2009 | Sato .................. B82Y 10/00 360/324.12 |
| 2009/0302404 A1 | 12/2009 | Matsuda et al. |
| 2009/0303640 A1* | 12/2009 | Mizuno .................. B82Y 25/00 360/324 |
| 2010/0061023 A1* | 3/2010 | Ohta .................. B82Y 10/00 360/324.12 |
| 2010/0202088 A1* | 8/2010 | Ohta .................. G11B 5/3932 360/324.11 |
| 2011/0202295 A1 | 8/2011 | Tamura et al. |
| 2011/0261478 A1 | 10/2011 | Takeo et al. |
| 2012/0062224 A1 | 3/2012 | Ide et al. |
| 2013/0057274 A1 | 3/2013 | Ide et al. |
| 2013/0164549 A1 | 6/2013 | Nishioka |
| 2015/0082900 A1 | 3/2015 | Fuji et al. |
| 2015/0082901 A1 | 3/2015 | Fuji et al. |
| 2015/0377985 A1 | 12/2015 | Ide |

FOREIGN PATENT DOCUMENTS

| | | |
|---|---|---|
| JP | 2002-305338 | 10/2002 |
| JP | 2008-16738 | 1/2008 |
| JP | 2009-099741 | 5/2009 |
| JP | 2009-283963 | 12/2009 |
| JP | 2009-295737 | 12/2009 |
| JP | 2011-164019 | 8/2011 |
| JP | 2011-228545 | 11/2011 |
| JP | 2013-113799 | 3/2013 |
| JP | 2013-102178 | 5/2013 |
| JP | 2013-113799 | 6/2013 |
| JP | 5250109 | 7/2013 |
| JP | 2015-59932 | 3/2015 |
| JP | 2015-61070 | 3/2015 |
| WO | WO 2014-119345 | 8/2014 |

* cited by examiner

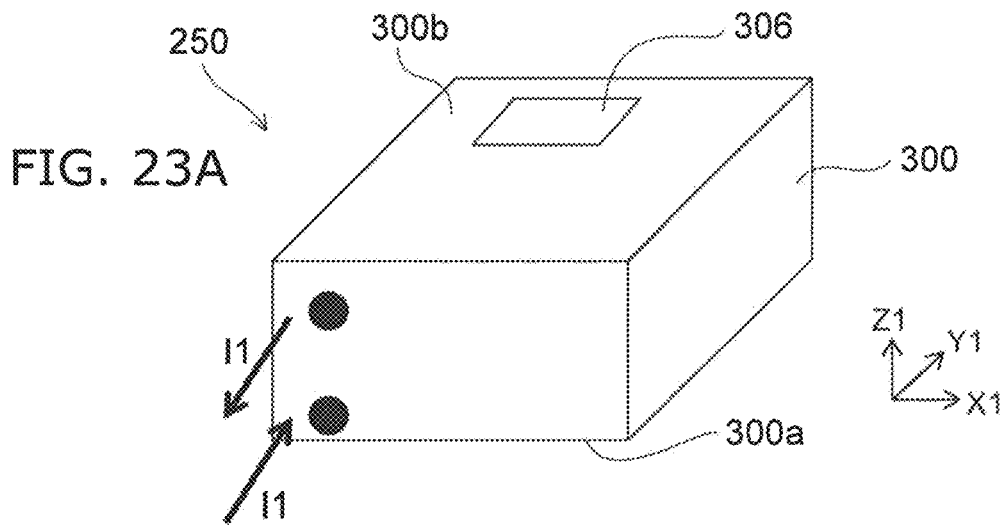
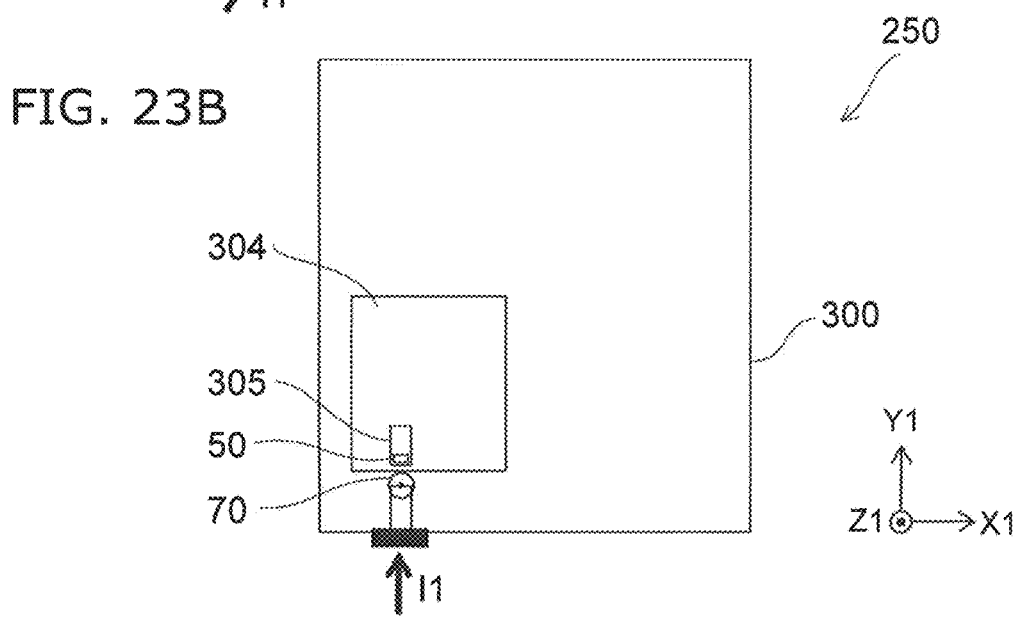
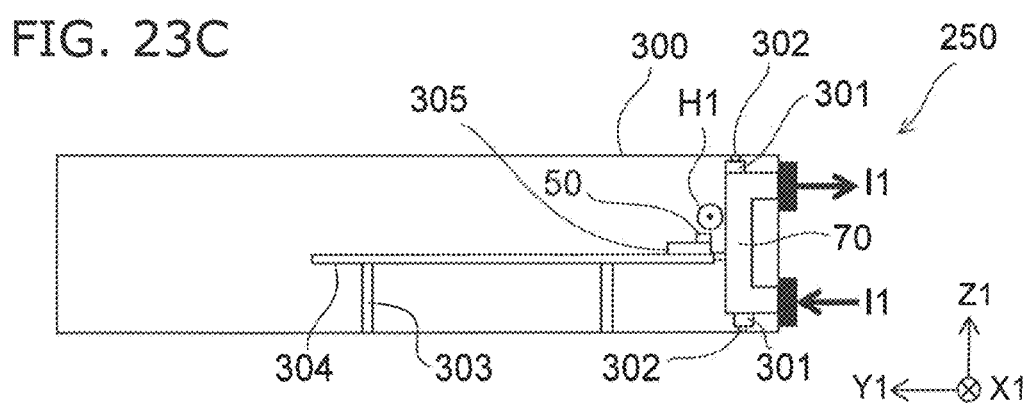

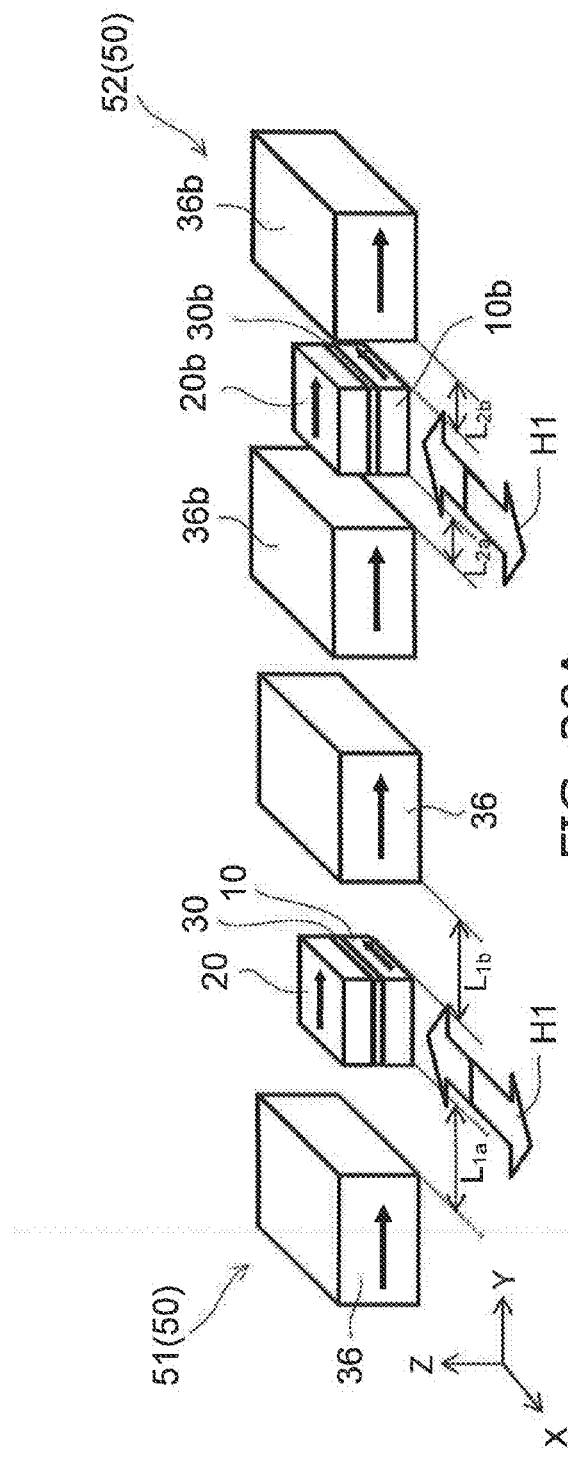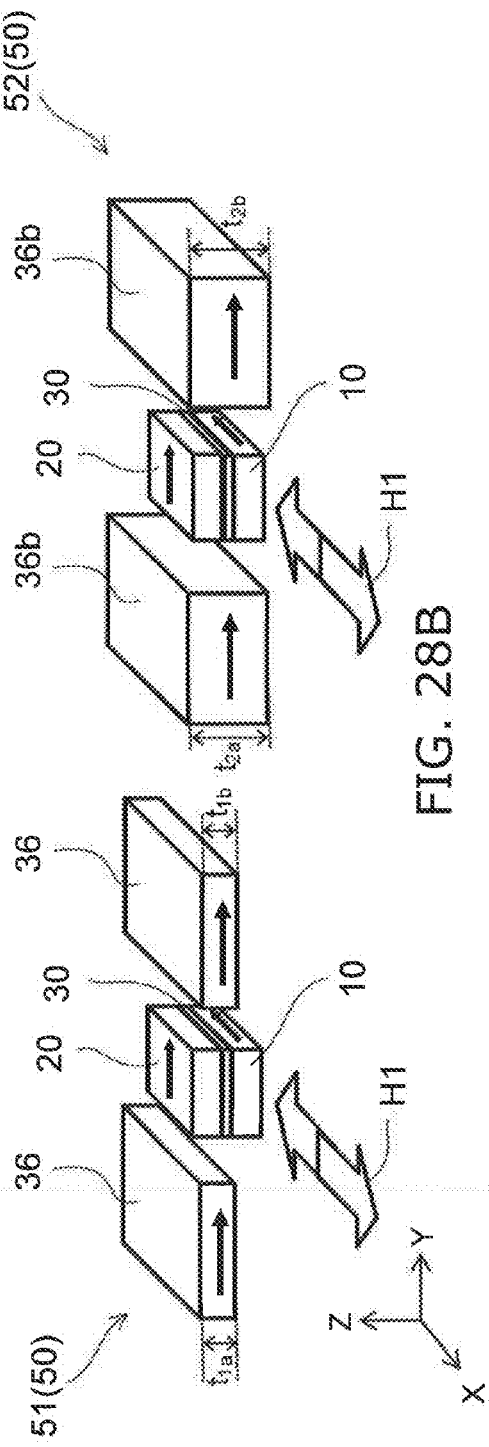

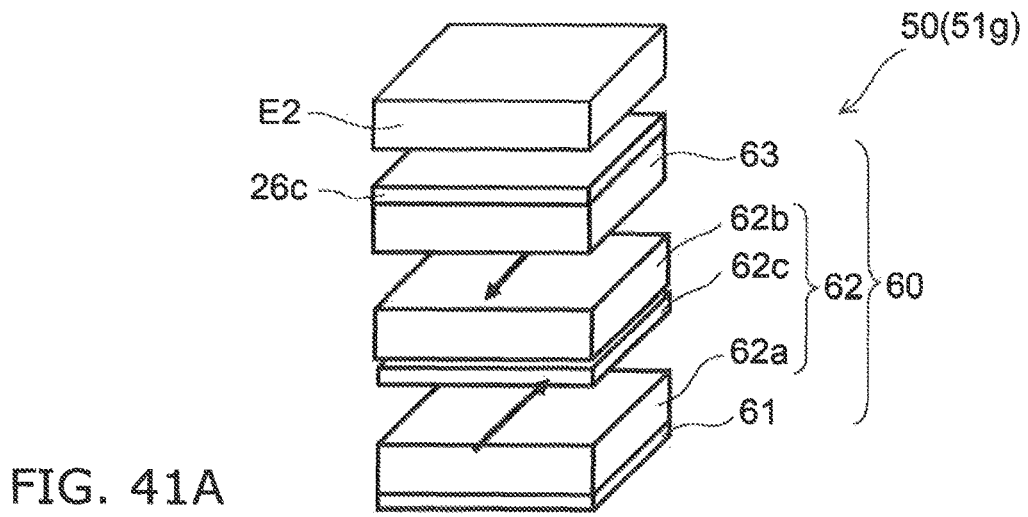
FIG. 41A
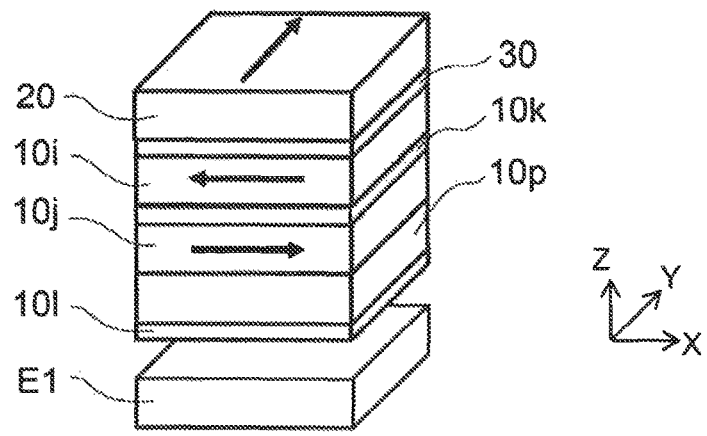
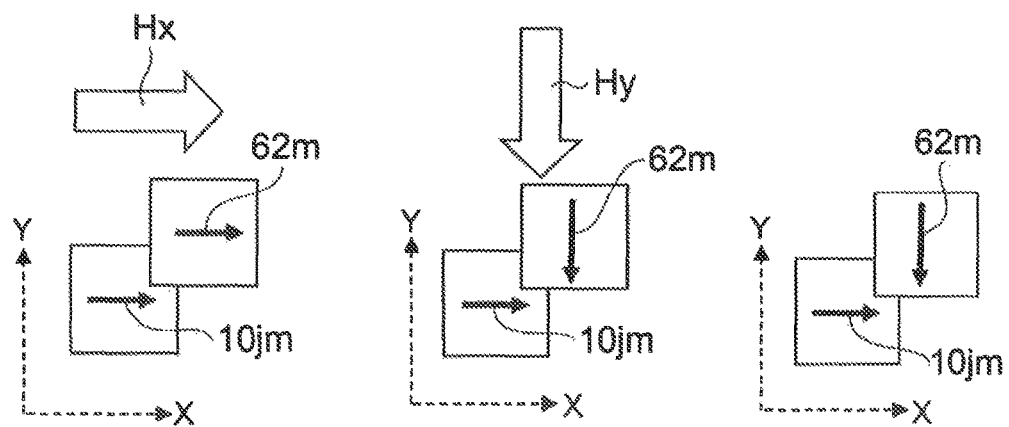
FIG. 41B  FIG. 41C  FIG. 41D

CURRENT SENSOR AND CURRENT SENSOR MODULE

CROSS-REFERENCE TO RELATED APPLICATIONS

This application is based upon and claims the benefit of priority from Japanese Patent Application No. 2013-268000, filed on Dec. 25, 2013; the entire contents of which are incorporated herein by reference.

FIELD

Embodiments described herein relate generally to a current sensor and a current sensor module.

BACKGROUND

A current sensor that uses spin technology has been proposed. The current sensor is used in, for example, smart meters and HEMS (Home Energy Management Systems). It is desirable to increase the precision of such a current sensor for a wide dynamic range.

BRIEF DESCRIPTION THE DRAWINGS

FIG. 23A to FIG. 23C are schematic views illustrating a current sensor module according to a third embodiment;

FIG. 28A and FIG. 28B are schematic perspective views illustrating sensor elements used in the current sensor module according to the third embodiment;

FIG. 41A to FIG. 41D are schematic views illustrating the current sensor module according to the third embodiment.

DETAILED DESCRIPTION

Figure 1A:
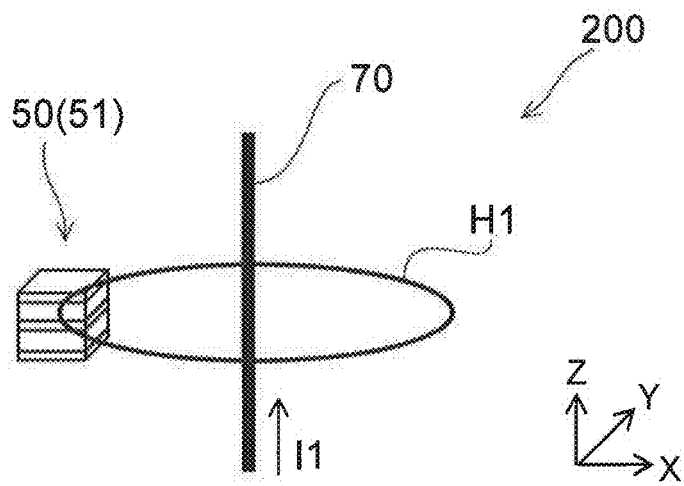
FIG. 1A and FIG. 1B are schematic perspective views illustrating a current sensor according to a first embodiment.

According to one embodiment, a current sensor includes a first sensor element and a power line. The first sensor element includes a first electrode, a second electrode, and a first stacked body. The first stacked body is provided between the first electrode and the second electrode. The first stacked body includes a first magnetic layer, a second magnetic layer and a first intermediate layer. The second magnetic layer is provided between the first magnetic layer and the second electrode. The first intermediate layer is provided between the first magnetic layer and the second magnetic layer. The first intermediate layer is nonmagnetic. A magnetization of the second magnetic layer changes according to a magnetic field generated by a current flowing through the power line. At least a portion of the second magnetic layer is amorphous.

According to one embodiment, a current sensor includes a first sensor element and a power line. The first sensor element includes a first electrode, a second electrode, and a first stacked body. The first stacked body is provided between the first electrode and the second electrode. The first stacked body includes a first magnetic layer, a second magnetic layer and a first intermediate layer. The second magnetic layer is provided between the first magnetic layer and the second electrode. The first intermediate layer is provided between the first magnetic layer and the second magnetic layer. The first intermediate layer is nonmagnetic. A magnetization of the second magnetic layer changes according to a magnetic field generated by a current flowing through the power line. A concentration of boron in at least a portion of the second magnetic layer is not less than 5 atomic percent and not more than 35 atomic percent.

According to one embodiment, a current sensor module includes a current sensor, a housing, a first supporter and a second supporter. The current sensor includes a first sensor element and a power line. The first sensor element includes a first electrode, a second electrode, and a first stacked body. The first stacked body is provided between the first electrode and the second electrode. The first stacked body includes a first magnetic layer, a second magnetic layer and a first intermediate layer. The second magnetic layer is provided between the first magnetic layer and the second electrode. The first intermediate layer is provided between the first magnetic layer and the second magnetic layer. The first intermediate layer is nonmagnetic. A magnetization of the second magnetic layer changes according to a magnetic field generated by a current flowing through the power line. At least a portion of the second magnetic layer is amorphous. The first supporter regulates relative positions of the power line and the housing. The second supporter regulates relative positions of the current sensor and the housing.

Various embodiments will now be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
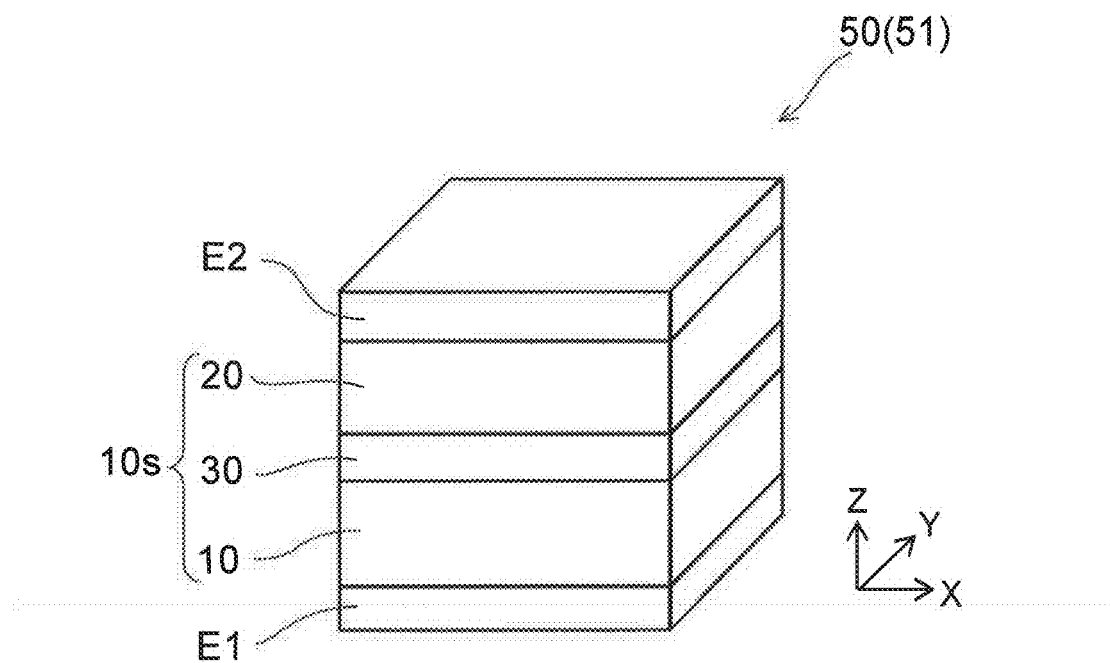

FIG. 1A and FIG. 1B are schematic perspective views illustrating a current sensor according to a first embodiment.

FIG. 1A shows the configuration of the current sensor 200 according to the first embodiment.

As shown in FIG. 1A, the current sensor 200 according to the embodiment includes a sensor element 50 (a first sensor element 51). The current sensor 200 may further include a power line 70 (a current line). In the example, the sensor element 50 is arranged with (e.g., separated from) the power line 70 in a direction intersecting the direction in which the power line 70 extends. The current sensor 200 senses a current flowing in the power line 70.

For example, a current I1 flows in the power line 70. A magnetic field H1 is generated by the current I1 around the power line 70. The current sensor 200 senses the current I1 flowing in the power line 70 by using the magnetic field H1.

FIG. 1B is a schematic perspective view showing the configuration of the sensor element 50 (the first sensor element 51).

As shown in FIG. 1B, the first sensor element 51 includes a first electrode E1, a second electrode E2, and a first stacked body 10s.

The first stacked body 10s is provided between the first electrode E1 and the second electrode E2. The first stacked body 10s includes a first magnetic layer 10, a second magnetic layer 20, and an intermediate layer 30 (a first intermediate layer).

The first magnetic layer 10 is provided between the first electrode E1 and the second electrode E2. The second magnetic layer 20 is provided between the first magnetic layer 10 and the second electrode E2. The intermediate layer 30 is provided between the first magnetic layer 10 and the second magnetic layer 20.

A direction from the first magnetic layer 10 toward the second magnetic layer 20 is taken as a Z-axis direction. One direction perpendicular to the Z-axis direction is taken as an X-axis direction. A direction perpendicular to the X-axis direction and perpendicular to the Z-axis direction is taken as a Y-axis direction.

In the example, the direction in which the power line 70 extends is aligned with the Z-axis direction. The direction in which the power line 70 extends may be aligned with the X-axis direction. However, in the embodiment, the direction in which the power line 70 extends is not limited to that recited above.

The second magnetic layer 20 includes an amorphous portion. The second magnetic layer 20 includes, for example, boron (B). The magnetization (the direction of the magnetization) of the second magnetic layer 20 is changeable. The magnetization of the second magnetic layer 20 changes according to the magnetic field H1. The second magnetic layer 20 has, for example, an amorphous structure. As described below, the second magnetic layer 20 may include an amorphous portion and a crystalline portion. In other words, at least a portion of the second magnetic layer 20 is amorphous.

The intermediate layer 30 is, for example, a nonmagnetic layer. The second magnetic layer 20 is, for example, a free magnetic layer. The first magnetic layer 10 is, for example, a reference layer. A fixed magnetic layer or a free magnetic layer is used as the reference layer. For example, the change of the magnetization of the second magnetic layer 20 is easier than the change of the magnetization of the first magnetic layer 10. When the magnetic field H1 is generated, the relative angle between the magnetization of the first magnetic layer 10 and the magnetization of the second magnetic layer 20 changes.

A current can be caused to flow in the first stacked body 10s including the first magnetic layer 10, the intermediate layer 30, and the second magnetic layer 20 by applying a voltage between the first electrode E1 and the second electrode E2. The current flows along, for example, the Z-axis direction between the first magnetic layer 10 and the second magnetic layer 20. Thereby, the electrical resistance of the sensor element 50 can be measured. The electrical resistance of the sensor element 50 changes due to the magnetic field H1. The current I1 that flows in the power line 70 is sensed by using the change of the electrical resistance.

The operation of the sensor element when functioning as a sensor is based on an application of the "magnetoresistance effect". The "magnetoresistance effect" arises, for example, in the stacked film of the free magnetic layer, the intermediate layer, and the reference layer (e.g., the fixed magnetic layer). The direction of the magnetization of the free magnetic layer changes when a magnetic field is applied to the free magnetic layer. As a result, the relative angle between the magnetization of the free magnetic layer and the magnetization of the reference layer (e.g., the fixed magnetic layer) changes. In such a case, the change of the electrical resistance is caused by the "magnetoresistance effect (MR effect)". The MR effect includes, for example, a GMR (giant magnetoresistance) effect, a TMR (tunneling magnetoresistance) effect, etc. The MR effect arises by causing a current to flow in the first stacked body 10s and by reading the change of the relative angle of the orientation of magnetization as the electrical resistance change. For example, the magnetic field H1 is applied to the first stacked body 10s; and the orientation of magnetization of the second magnetic layer 20 (the free magnetic layer) is changed by the magnetic field H1. The relative angle between the orientation of magnetization of the second magnetic layer 20 and the orientation of magnetization of the first magnetic layer 10 (the reference layer) changes. In other words, the MR effect arises due to the magnetic field H1 generated by the current I1 flowing through the power line 70.

In the case where the combination of the materials of the stacked body of the free magnetic layer, the intermediate layer, and the reference layer (e.g., the fixed magnetic layer) has a positive magnetoresistance effect, the electrical resistance decreases when the relative angle between the free magnetic layer and the fixed magnetic layer is small. In the case where the combination of the materials of the stacked body of the free magnetic layer, the intermediate layer, and the fixed magnetic layer has a negative magnetoresistance effect, the electrical resistance increases when the relative angle between the free magnetic layer and the fixed magnetic layer is small.

An example of the sensor element 50 will now be described.

Hereinbelow, "material A/material B" indicates the state in which a layer of material B is provided on a layer of material A.

Figure 2:
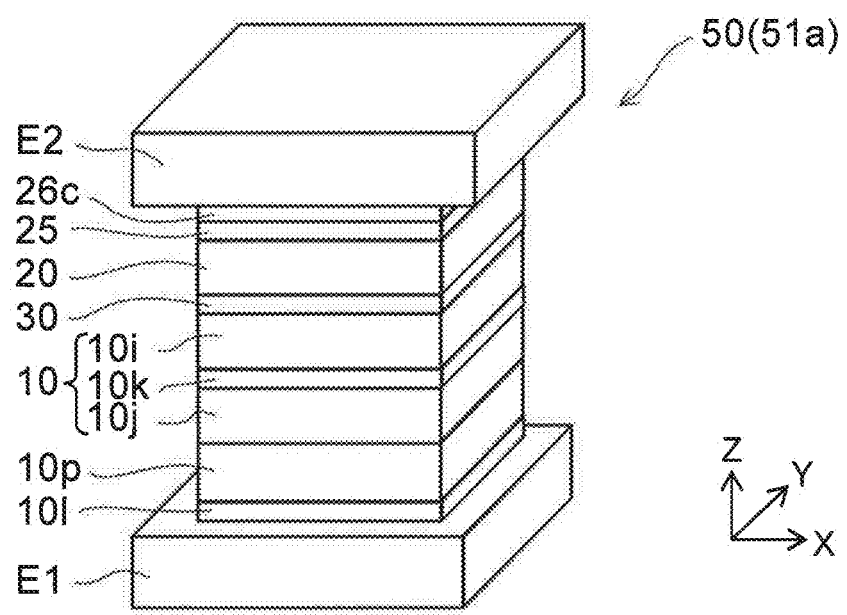
FIG. 2 is a schematic perspective view illustrating a portion of the current sensor according to the first embodiment.

FIG. 2 is a schematic perspective view illustrating a portion of the current sensor according to the first embodiment.

As shown in FIG. 2, the sensor element 50 (a sensor element 51a) that is used in the embodiment includes the first electrode E1, a foundation layer 10l, a pinning layer 10p, the first magnetic layer 10, the intermediate layer 30, the second magnetic layer 20, a functional layer 25, and a capping layer 26c. The foundation layer 10l is provided between the first electrode E1 and the first magnetic layer 10. The pinning layer 10p is provided between the foundation layer 10l and the first magnetic layer 10. The functional layer 25 is provided between the second electrode E2 and the second magnetic layer 20. The capping layer 26c is provided between the functional layer 25 and the second electrode E2. In the example, the first magnetic layer 10 includes a first fixed magnetic layer 10i, a second fixed magnetic layer 10j, and a magnetic coupling layer 10k. The first fixed magnetic layer 10i is provided between the second fixed magnetic layer 10j and the intermediate layer 30. The magnetic coupling layer 10k is provided between the second fixed magnetic layer 10j and the first fixed magnetic layer 10i.

The foundation layer 10l includes, for example, Ta/Ru. The thickness (the length in the Z-axis direction) of the Ta layer is, for example, 3 nanometers (nm). The thickness of the Ru layer is, for example, 2 nm.

The pinning layer 10p includes, for example, an IrMn layer having a thickness of 7 nm.

The second fixed magnetic layer 10j includes, for example, a $Co_{75}Fe_{25}$ layer having a thickness of 2.5 nm.

The magnetic coupling layer 10k includes, for example, a Ru layer having a thickness of 0.9 nm.

The first fixed magnetic layer 10i includes, for example, a $Co_{40}Fe_{40}B_{20}$ layer having a thickness of 3 nm.

The intermediate layer 30 includes, for example, a Mg—O layer having a thickness of 1.6 nm.

The second magnetic layer 20 includes, for example, a $CO_{40}Fe_{40}B_{20}$ layer having a thickness of 4 nm.

The functional layer 25 includes, for example, a Mg—O layer having a thickness of 1.5 nm.

The capping layer 26c includes, for example, Ta/Ru. The thickness of the Ta layer is, for example, 1 nm. The thickness of the Ru layer is, for example, 5 nm.

The first electrode E1 and the second electrode E2 include, for example, a metal.

An example of the characteristics of the sensor element according to the embodiment will now be described.

The materials and thicknesses of the layers included in a first sample S01 are as follows.

Foundation layer 10l: Ta (1 nm)/Ru (2 nm)
Pinning layer 10p: $Ir_{22}Mn_{78}$ (7 nm)
Second fixed magnetic layer 10j: $Co_{75}Fe_{25}$ (2.5 nm)
Magnetic coupling layer 10k: Ru (0.9 nm)
First fixed magnetic layer 10i: $Co_{40}Fe_{40}B_{20}$ (3 nm)
Intermediate layer 30: Mg—O (1.6 nm)
Second magnetic layer 20: $Co_{40}Fe_{40}B_{20}$ (4 nm)
Functional layer 25: Mg—O (1.5 nm)
Capping layer 26c: Cu (1 nm)/Ta (20 nm)/Ru (50 nm)

In the first sample S01, the second magnetic layer 20 includes an amorphous portion. For example, the second magnetic layer 20 can be amorphous by providing the functional layer 25.

In a second sample S02 of a reference example, the second magnetic layer 20 does not include an amorphous portion. For example, the functional layer 25 is not provided in the second sample S02. Otherwise, the configuration of the second sample S02 is the same as that of the first sample S01.

The stacked film recited above is formed on the first electrode E1; and the second electrode E2 is formed on the stacked film. The stacked film (the first sample S01 and the second sample S02) recited above is patterned into an element having a dot configuration. The element size of the stacked film (the samples) is 20 μm by 20 μm. The vertical conduction characteristics between the first electrode E1 and the second electrode E2 are evaluated.

Figure 3A:
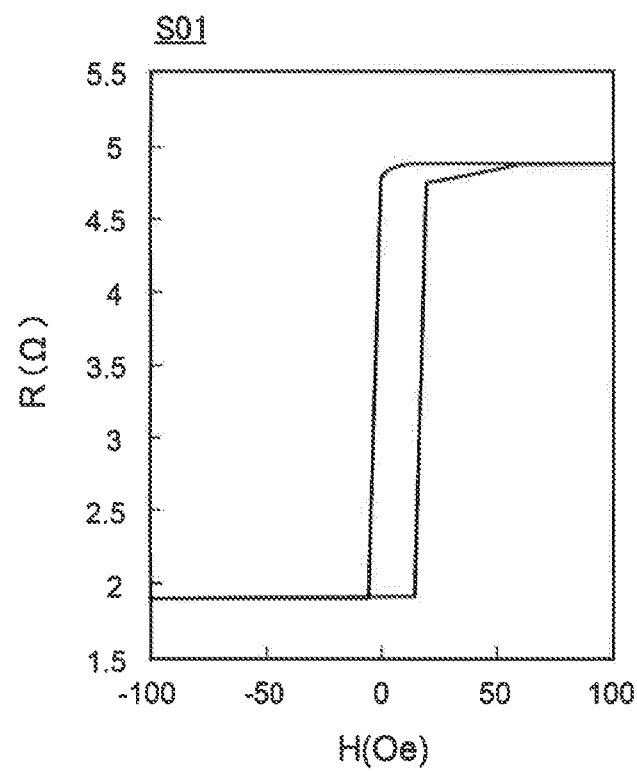
FIG. 3A and FIG. 3B are graphs of characteristics of the current sensors.
Figure 3B:
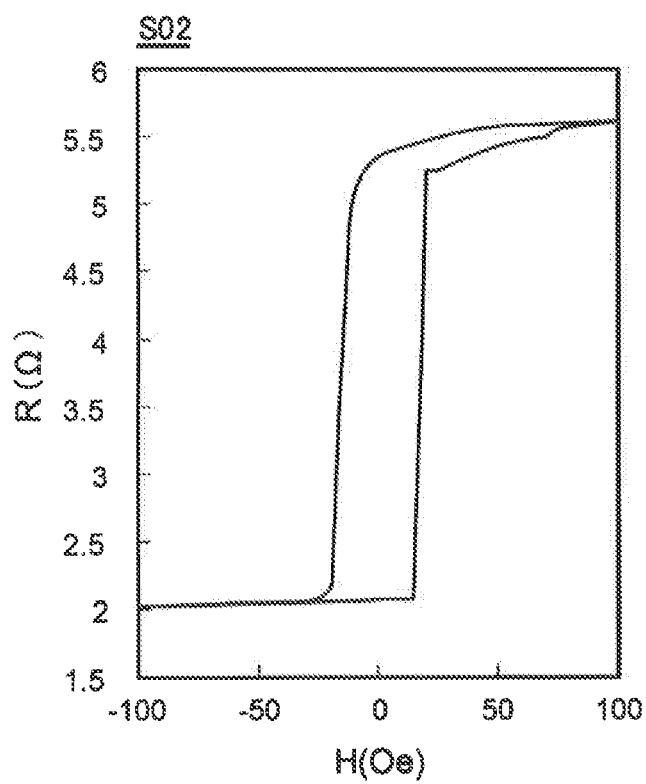

FIG. 3A and FIG. 3B are graphs of characteristics of the current sensors.

FIG. 3A shows the magnetic field dependence of the electrical resistance of the first sample S01. FIG. 3B shows the magnetic field dependence of the electrical resistance of the second sample S02.

In these figures, the horizontal axis is an external magnetic field H (oersteds (Oe)). The vertical axis is an electrical resistance R (ohms (Ω)). The direction of the external magnetic field H of the measurement is a direction parallel to the plane of the layer of the first fixed magnetic layer 10i.

A negative external magnetic field H corresponds to a magnetic field in the same direction as the direction of the magnetization of the first fixed magnetic layer 10i.

As shown in FIG. 3A and FIG. 3B, the configuration of the R-H loop of the first sample S01 and the configuration of the R-H loop of the second sample S02 are different. In the region where the magnetization is not saturated, the change of the first sample S01 due to the external magnetic field occurs at a lower magnetic field than the change of the second sample S02 due to the external magnetic field, has good squareness, and is abrupt. Such good characteristics are linked to higher linearity of the sensor. The soft magnetic properties of the first sample S01 are better than the soft magnetic properties of the second sample S02. For example, the soft magnetic properties are improved by the free magnetic layer (the second magnetic layer 20) including the amorphous portion. This is based on the reduction of the fluctuation of the magnetic anisotropy based on the crystal grains. Specifically, it can be seen that a coercive force Hc of the easy magnetization axis of the free magnetic layer is small. The difference between the soft magnetic properties of the first sample S01 and the soft magnetic properties of the second sample S02 of the reference example is clear. The improvement of the characteristics by the invention is clear. This means that the magnetization direction is changeable even in a weak magnetic field without unnecessary effects of the magnetic anisotropy of the free magnetic layer.

Figure 4A:
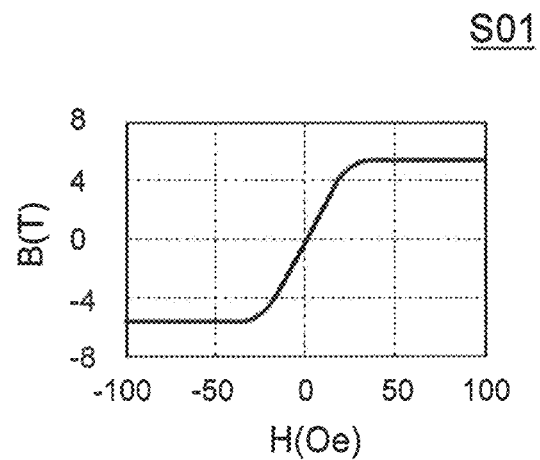
FIG. 4A and FIG. 4B are graphs of characteristics of the current sensors.
Figure 4B:
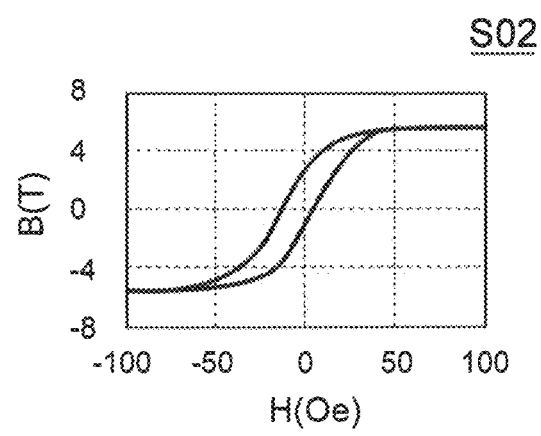

FIG. 4A and FIG. 4B are graphs of characteristics of the current sensors.

FIG. 4A shows the relationship between a magnetization B and the external magnetic field H for the first sample S01.

FIG. 4B shows the relationship between the magnetization B and the external magnetic field H for the second sample S02 of the reference example.

In FIG. 4A and FIG. 4B, a magnetic field is applied in the hard magnetization axis direction of the free magnetic layer.

In the first sample S01 as shown in FIG. 4A, it can be seen that even in the hard magnetization axis direction, a response having good straight-line properties and good linearity is obtained; and magnetic anisotropy is provided appropriately. Thereby, good characteristics can be obtained in an analog sensor outputting an analog value.

On the other hand, in the second sample S02 of the reference example in which the free magnetic layer includes crystalline CoFeB as shown in FIG. 4B, a coercive force occurs even in the B-H loop of the hard axis direction. Such a B-H loop cannot be utilized as an analog sensor.

In the case where the free magnetic layer includes amorphous CoFeB as in the embodiment, the coercive force is small (or nil); and the B-H loop has good linearity. This is caused by, for example, the induced magnetic anisotropy provided by performing the film formation in a magnetic field. There are cases where the induced magnetic anisotropy is additionally provided by annealing in a magnetic field in post-processing after film formation. For example, the first sample S01 is annealed in a magnetic field at 300° C. For example, in the case where the coercive force Hc of the easy axis direction is small, there is a possibility of anisotropy not being provided in any direction. However, in the embodiment as shown in FIG. 4A, it can be seen that the magnetic anisotropy is provided appropriately by a small coercive force Hc. The difference between the invention and the reference example and the improvement of the characteristics by the invention are clear.

FIG. 4A and FIG. 4B show the characteristics in the case where a sheet film is used in which a magnetic field bias is not provided to the free magnetic layer. A bias mechanism such as a hard bias film, an in-stack bias, or the like is provided in the actual current sensor. Thereby, the characteristics have even better linearity.

On the other hand, an amorphous structure causes the MR ratio to decrease. In the case where a free magnetic layer having the crystal structure of the reference example is used, the MR ratio is about 200%. Conversely, in the case where a free magnetic layer having an amorphous structure as in the embodiment is used, the MR ratio decreases to, for example, about 150%.

It is known that in the case where the intermediate layer includes Mg—O, the MR ratio does not increase unless crystallization of the free magnetic layer is promoted. In MRAM (Magnetic Random Access Memory) and the magnetic head of a HDD (Hard Disk Drive), such a decrease of the MR ratio is a crucial disadvantage. This is because HDD heads and MRAM are devices that read digital signals of "0" or "1". Therefore, in HDD heads and MRAM, the strength of the output signal based on the MR change is directly linked to the performance of the device.

However, in applications of analog sensors in which the magnitude of the magnetic field is sensed using the current as in the current sensor according to the embodiment, the magnitude of the MR ratio is not the greatest performance indicator. Analog sensors are similar in that it is desirable for the MR ratio to be large. However, an analog sensor is not a device that reads one-bit information of "0" or "1". An analog sensor senses, as an analog value, the change between the low resistance state and the high resistance state based on the magnetization alignment of the free magnetic layer. In the case where the analog value is converted to a digital value, the analog value corresponds to, for example, 16 bits to 24 bits. The analog sensor performs such extremely high-precision sensing. The analog sensor can be contrasted to devices such as HDD heads and MRAM that sense one-bit information. The performance of the analog sensor is greatly different from the performance of HDD heads and MRAM. Such an analog sensor identifies an enormous amount of information corresponding to digital information of 16 bits to 24 bits. Such an analog sensor provides not only the output magnitude but also good linear response (linearity) in the hard axis direction as shown in FIG. 4A and FIG. 4B. Thereby, enormous amounts of information can be identified. The performance of the analog sensor is improved because the linear response in the hard axis direction responds without hysteresis in many regions. In the case where the free magnetic layer includes an amorphous portion, the characteristics greatly improve compared to the reference example as shown in FIG. 4A and FIG. 4B. Therefore, the inventor discovered that it is desirable for the free magnetic layer to include an amorphous portion even when the MR ratio is reduced by a factor of 3/4 from 200% to 150%. Such considerations are different from those discussed in the field of conventional HDD heads or the field of MRAM.

In the fields of HDD heads, MRAM, and the like, it is more desirable to set the output to be large than to have a good linear response (linearity). Therefore, contrivances are made so that the MR ratio does not decrease.

Figure 5:
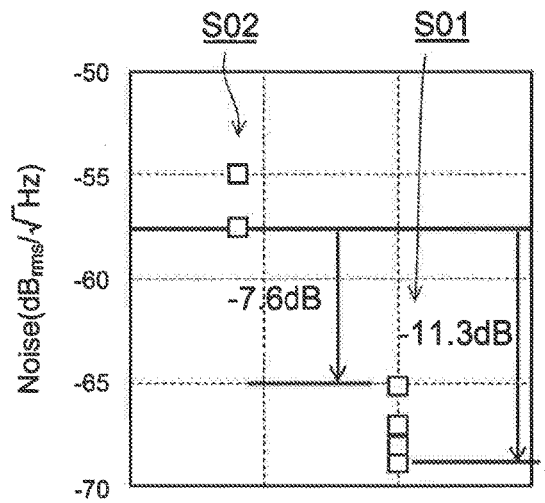
FIG. 5 is a graph of characteristics of the current sensors.

FIG. 5 is a graph of characteristics of the current sensors.

FIG. 5 shows noise of a current sensor using the first sample S01 and noise of a current sensor using the second sample S02. It was experimentally discovered that, in addition to the improvement of the linearity such as that described above, the noise is reduced markedly by using a free magnetic layer having an amorphous structure as in the embodiment. In the case of an analog sensor, information corresponding to a digital information amount of 16 to 24 bits can be sensed by greatly reducing the noise of the sensor itself. Advantages far superior to the reduction of the MR ratio by a factor of about 3/4 were experimentally confirmed. The reduction of the MR ratio by a factor of 3/4 means that the signal output is reduced by a factor of 3/4. This corresponds to the SNR (the Signal to Noise Ratio) decreasing 2.5 dB due to the decrease of the signal output. On the other hand, the decrease of the noise experimentally corresponds to 7 dB to 11 dB. That is, even if the SNR decreases 2.5 dB due to the decrease of the signal output, when the decrease of the noise is considered, the SNR is improved by about 4.5 dB to 8.5 dB. In the embodiment, in addition to the increase of the linearity such as that described above, a large advantage is obtained in that the SNR is improved by about 4.5 dB to 8.5 dB.

The overview of the experiment will now be elaborated.

A comparison is performed for the first sample S01 in which the free magnetic layer has the amorphous structure and the second sample S02 of the reference example in which the free magnetic layer has the crystal structure.

Figure 6:
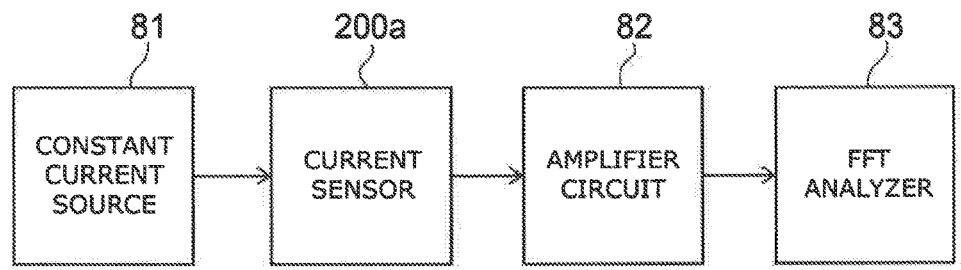
FIG. 6 is a schematic view illustrating the measurement of noise of a current sensor.

FIG. 6 is a schematic view illustrating the measurement of noise of a current sensor.

As shown in FIG. 6, a voltage is generated at two ends of the current sensor 200a by a constant current source 81 providing a constant DC current to the current sensor 200a. The voltage of the two ends of the current sensor that is generated is amplified to a measurable voltage by using an amplifier circuit 82. Power spectrum measurement is performed by using a FFT analyzer 83. The constant current source and the amplifier circuit are driven by a battery to perform a high-precision measurement.

Three types of noise are dominant for the self-noise of the current sensor according to the embodiment. The three types of noise are two types of non-frequency correlated noise and one type of frequency correlated noise.

The current sensor according to the embodiment is, for example, a variable resistance body that uses tunneling conduction. The non-frequency correlated noise includes Johnson noise (thermal noise) determined by the resistance value, and shot noise determined by the resistance value and the current value. Therefore, the non-frequency correlated noise is determined (e.g., uniquely) by the resistance value and the current value.

The frequency correlated noise of the current sensor according to the embodiment is, for example, the flicker noise determined similarly to a CMOS transistor by the element voltage (element resistance×current value), the element size, and the physical property parameter (the Hooge value). Therefore, the non-frequency correlated noise is determined (e.g., uniquely) by the resistance value, the current value, the element size, and the physical property parameter.

In the noise measurement, the resistance value, current value, and element size of the first sample S01 are set to be substantially the same as the resistance value, current value, and element size of the second sample S02, respectively. Therefore, the difference between the noise of the first sample S01 and the noise of the second sample S02 indicates the difference between the physical property parameters.

The vertical axis of FIG. 5 is the noise output Noise ($dB_{rms}/\sqrt{HZ}$) after amplification. The horizontal axis of FIG. 5 is the difference between the samples. As shown in FIG. 5, the noise of the first sample S01 is lower than the noise of the second sample S02 by about 7.6 dB to 11.3 dB. This indicates that the 1/f noise parameter (the Hooge value) of the first sample S01 is lower than the physical property parameter of the second sample S02.

As shown in FIG. 5, the noise N of the first sample S01 is lower than that of the second sample S02 by about 7.6 dB to 11.3 dB. Thus, by setting the free magnetic layer (the second magnetic layer 20) to be amorphous, the soft magnetic properties are improved; and the noise can be suppressed.

For example, the sensitivity is relatively high for a stacked body in which the free magnetic layer does not include an amorphous portion as in the second sample S02. Therefore, the stacked body in which the free magnetic layer does not include an amorphous portion is used widely. For example, such a stacked body is used in magnetic heads of hard disks, etc.

On the other hand, in an analog sensor, for example, it is more desirable to increase the precision than to increase the sensitivity. The soft magnetic properties are better for the first sample S01 than for the second sample S02. There are cases where it is difficult to sense the current with high precision when the current sensor includes the second sample S02. Conversely, by setting the free magnetic layer to be amorphous in the embodiment, the linearity of the MR effect increases; and the noise is suppressed. By using the first sample S01 in an analog sensor such as a current sensor, high-precision sensing can be realized.

FIG. 7A to FIG. 7D are micrographs illustrating characteristics of the current sensor according to the first embodiment.

Figure 7A:
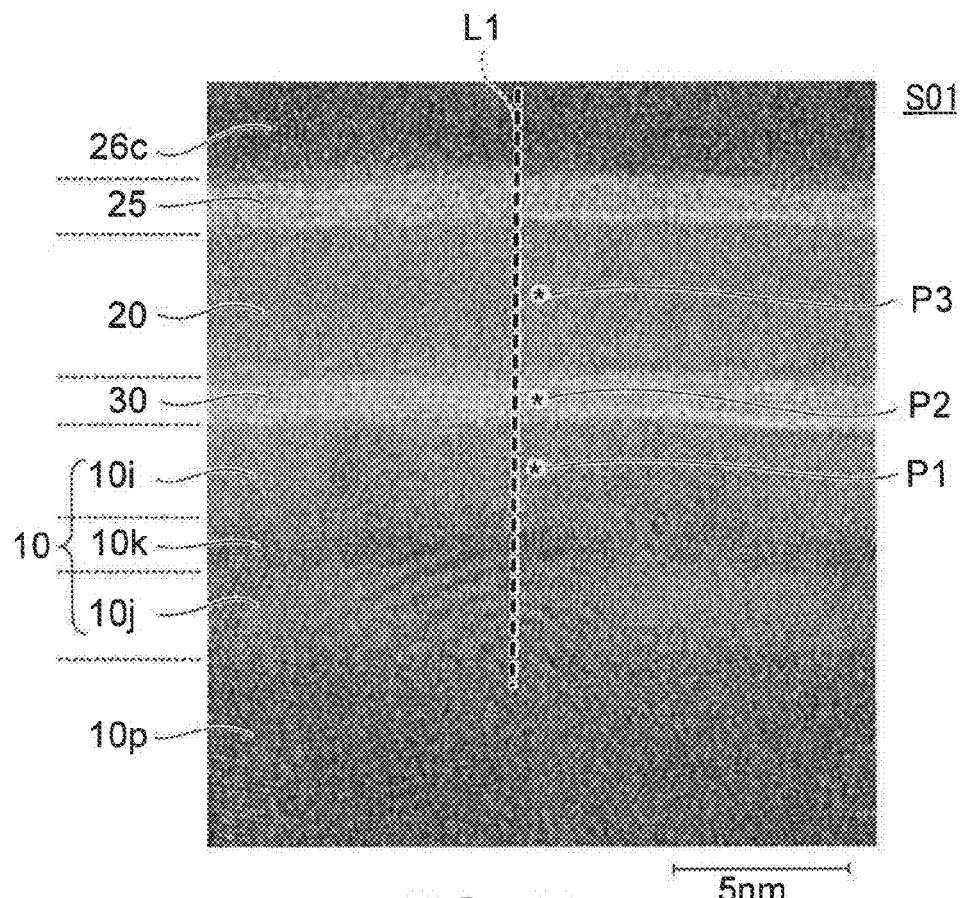
FIG. 7A to FIG. 7D are micrographs illustrating characteristics of the current sensor according to the first embodiment.

FIG. 7A is a cross-section transmission electron microscope (cross section TEM) photograph of the sensor element of the first sample S01. FIG. 7A is a photograph of the stacked structure of the first sample S01.

Figures 7B, 7C, 7D:
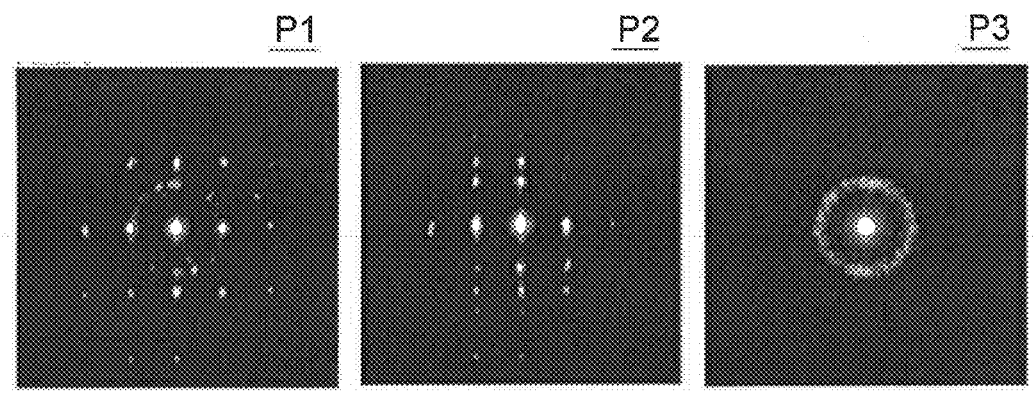

FIG. 7B to FIG. 7D are crystal lattice diffraction images of nanodiffraction of an electron beam at points P1 to P3 of FIG. 7A, respectively.

FIG. 7A shows a region from a portion of the second fixed magnetic layer 10j (the $Co_{50}Fe_{50}$ layer) to a portion of the capping layer 26c (the Ru layer).

It can be seen from FIG. 7A that the first fixed magnetic layer 10i (the Co—Fe—B layer) includes a crystalline portion. The intermediate layer 30 (the Mg—O layer) also is a crystal. On the other hand, a regular arrangement of the atoms is not observed for the greater part of the second magnetic layer 20 (the Co—Fe—B layer that is the free magnetic layer) interposed between the intermediate layer 30 and the functional layer 25 (the Mg—O layer). In other words, the second magnetic layer 20 is amorphous.

The crystalline state can be confirmed by crystal lattice diffraction images. The crystal lattice diffraction images of points P1 to P3 of FIG. 7A are shown respectively in FIG. 7B to FIG. 7D. Point P1 corresponds to the first fixed magnetic layer 10i. Point P2 corresponds to the intermediate layer 30. Point P3 corresponds to the second magnetic layer 20 (the free magnetic layer).

Diffraction spots are observed in the diffraction image of point P1 corresponding to the first fixed magnetic layer 10i (the Co—Fe—B layer) as shown in FIG. 7B. The diffraction spots are caused by the first fixed magnetic layer 10i having a crystal structure.

Diffraction spots are observed in the diffraction image of point P2 corresponding to the intermediate layer 30 (the Mg—O layer) as shown in FIG. 7C. The diffraction spots are caused by the intermediate layer 30 having a crystal structure.

On the other hand, distinct diffraction spots are not observed in the diffraction image of point P3 corresponding to the second magnetic layer 20 (the Co—Fe—B layer which is the free magnetic layer) as shown in FIG. 7D. A diffraction image having a ring configuration that reflects an amorphous structure is observed in this diffraction image. From this result, it can be seen that the second magnetic layer 20 (the Co—Fe—B layer which is the free magnetic layer) of the first sample S01 includes an amorphous portion.

FIG. 8A to FIG. 8D are micrographs illustrating characteristics of the current sensor.

Figure 8A:
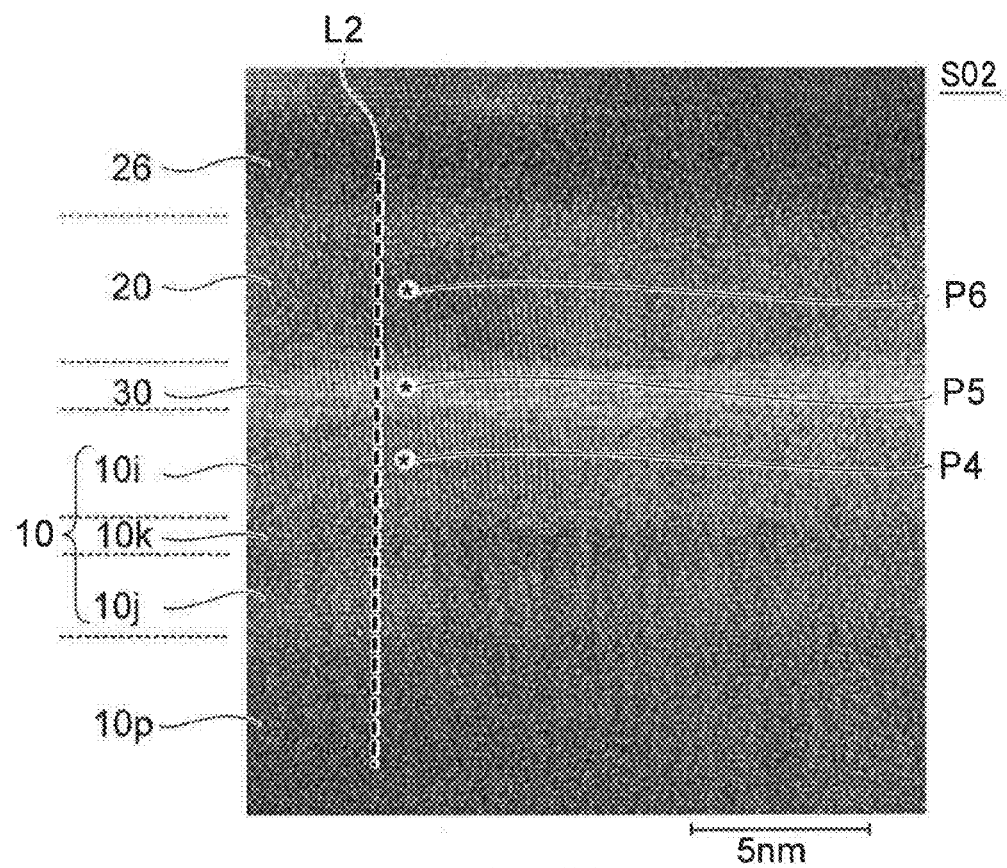
FIG. 8A to FIG. 8D are micrographs illustrating characteristics of the current sensor.
Figure 8B:
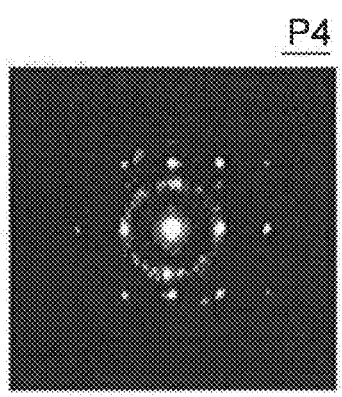
Figure 8C:
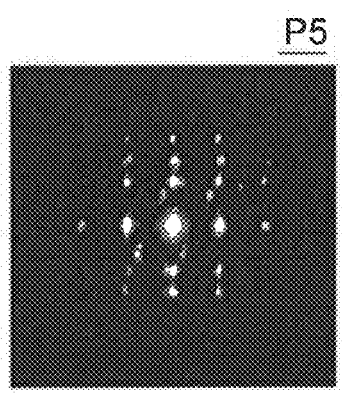
Figure 8D:
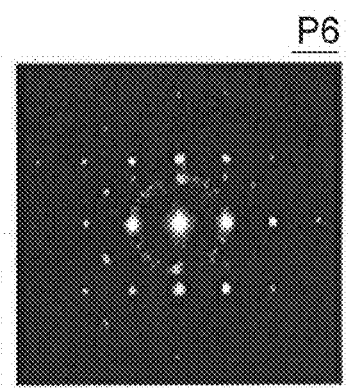

FIG. 8A is a cross-section transmission electron microscope (cross section TEM) photograph of the sensor element of the second sample S02. FIG. 8B to FIG. 8D are crystal lattice diffraction images of nanodiffraction of an electron beam for points P4 to P6 of FIG. 8A, respectively.

It can be seen from FIG. 8A that the first fixed magnetic layer 10i (the Co—Fe—B layer) includes a crystalline portion; and the intermediate layer 30 (the Mg—O layer) also is a crystal. The second magnetic layer 20 (the Co—Fe—B layer that is the free magnetic layer) on the intermediate layer 30 also includes many crystalline portions.

Diffraction spots caused by a crystal structure are confirmed in the diffraction image of the first fixed magnetic layer 10i (the Co—Fe—B layer) as shown in FIG. 8B.

Diffraction spots caused by a crystal structure are confirmed in the diffraction image of the intermediate layer 30 (the Mg—O layer) as shown in FIG. 8C.

Diffraction spots caused by a crystal structure are confirmed also in the diffraction image of the second magnetic layer 20 (the Co—Fe—B layer which is the free magnetic layer) as shown in FIG. 8D. From this result, it can be seen that the greater part of the second magnetic layer 20 (the Co—Fe—B layer which is the free magnetic layer) of the second sample S02 has a crystal structure.

It can be seen from FIG. 7A to FIG. 7D that the free magnetic layer of the first sample S01 has good soft magnetic properties and an amorphous structure. On the other hand, it can be seen from FIG. 8A to FIG. 8D that the free magnetic layer of the second sample S02 has a crystal structure.

In the specification, the crystal structure and the amorphous structure are discriminated as having a spot configuration or having a ring configuration by using diffraction spot measurement as described above. The amorphous structure has a ring configuration when the diffraction of the region is observed.

Differences between the crystalline states of the free magnetic layer for the first sample S01 and the second sample S02 will now be described further.

FIG. 9A, FIG. 9B, FIG. 10A, and FIG. 10B are schematic views illustrating characteristics of the current sensors.

Figures 9A, 9B:
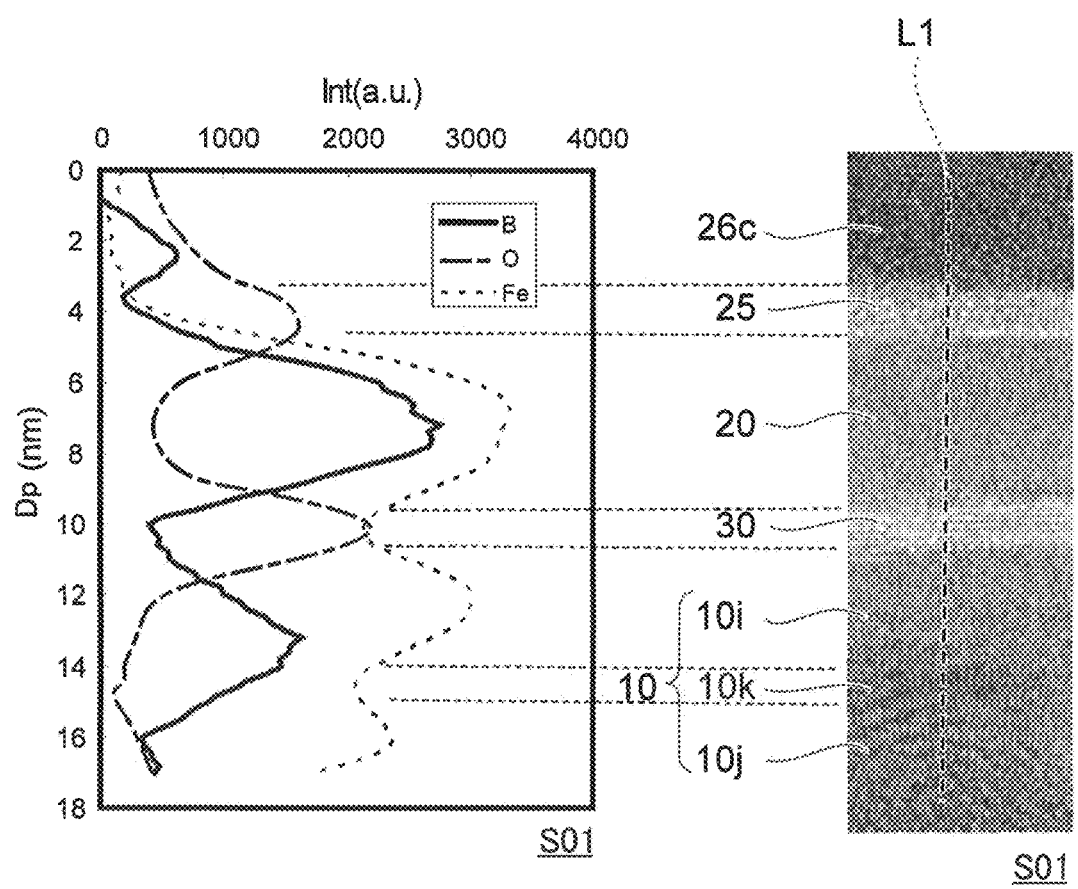
FIG. 9A and FIG. 9B are schematic views illustrating characteristics of the current sensors.
Figures 10A, 10B:
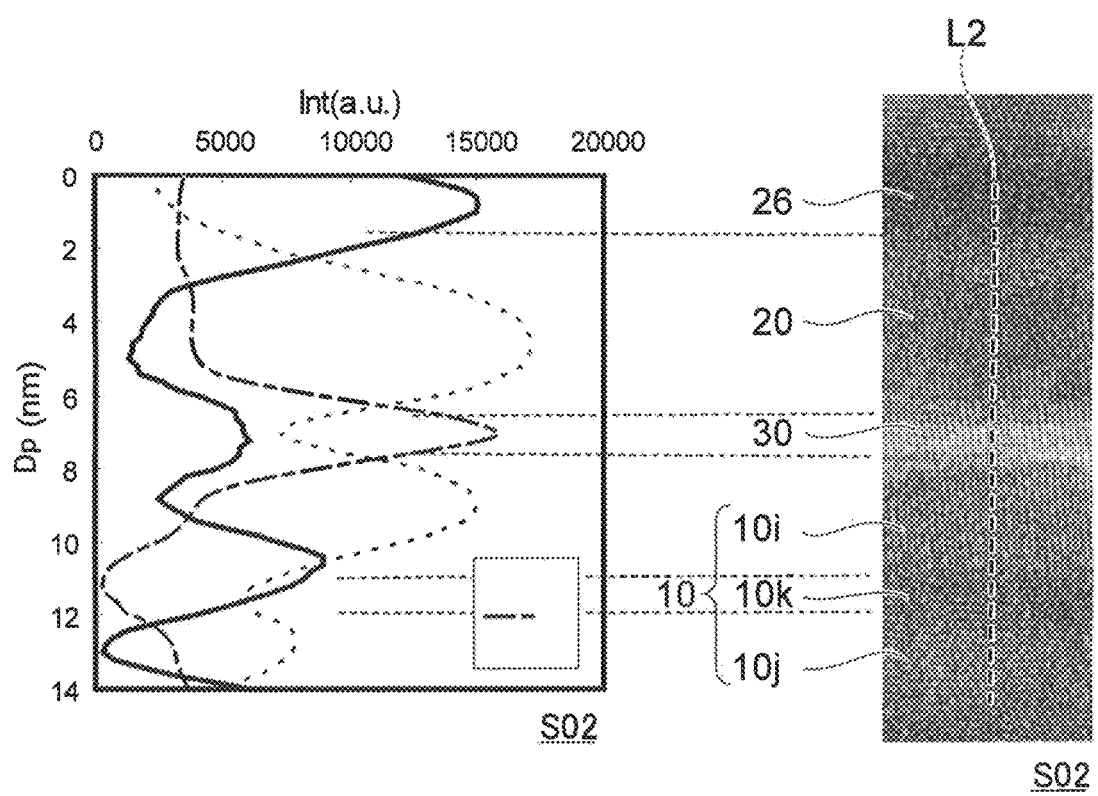
FIG. 10A and FIG. 10B are schematic views illustrating characteristics of the current sensors.

FIG. 9B corresponds to a portion of FIG. 7A; and FIG. 10B corresponds to a portion of FIG. 8A.

FIG. 9A and FIG. 10A are the evaluation results of element depth profiles of the samples using electron energy-loss spectroscopy (EELS). FIG. 9A corresponds to the first sample S01 and shows the element depth profiles along line L1 shown in FIG. 7A. FIG. 10A corresponds to the second sample S02 and shows the element depth profiles along line L2 shown in FIG. 8A. In these figures, the horizontal axis is a detection intensity Int of the elements (arbitrary units). The vertical axis is a depth Dp (nm). The depth Dp corresponds to, for example, the distance in the Z-axis direction. These figures show the depth profiles of iron, boron, and oxygen.

In the second sample S02 as shown in FIG. 10A, the intensity Int of the boron in the capping layer 26c is higher than the intensity Int of the boron in the second magnetic layer 20 (the Co—Fe—B layer that is the free magnetic layer). The intensity Int of the boron in the portion of the second magnetic layer 20 on the capping layer 26c side is higher than the intensity Int of the boron in the central portion of the second magnetic layer 20. It is considered that the concentration of the boron in the second magnetic layer 20 decreases because the boron diffuses from the second magnetic layer 20 toward the capping layer 26c side.

On the other hand, in the first sample S01 as shown in FIG. 9A, a peak of the boron occurs in the central portion of the second magnetic layer 20 (the Co—Fe—B layer which is the free magnetic layer). Also, the boron content of the capping layer 26c is low. The boron concentration of the second magnetic layer 20 (the Co—Fe—B layer which is the free magnetic layer) is maintained in the initial state of the film formation substantially without diffusing into the other layers. For example, the diffusion of the boron from the second magnetic layer 20 is suppressed by the functional layer 25.

From the results recited above, it can be said that the crystallization of the $Co_{40}Fe_{40}B_{20}$ layer of the second sample S02 in which the functional layer 25 is not provided has progressed more than that of the $CO_{40}Fe_{40}B_{20}$ layer of the first sample S01. In other words, in the first sample S01, the amorphous structure of the $Co_{40}Fe_{40}B_{20}$ layer is maintained. On the other hand, in the second sample S02, the crystallization has progressed. For example, in the embodiment, the second magnetic layer 20 includes boron. Thereby, the amorphous structure of the second magnetic layer 20 is maintained.

An example of the sensor element according to the embodiment will now be described.

The first electrode E1 and the second electrode E2 include, for example, at least one selected from aluminum (Al), an aluminum copper alloy (Al—Cu), copper (Cu), silver (Ag), and gold (Au). By using such materials having relatively small electrical resistances as the first electrode E1 and the second electrode E2, the current can be caused to flow efficiently in the sensor element 51a. The first electrode E1 may include a nonmagnetic material. The first electrode E1 may include, for example, a foundation layer (not shown) for the first electrode E1, a capping layer (not shown) for the first electrode E1, and a layer of at least one selected form Al, Al—Cu, Cu, Ag, and Au provided between the foundation layer and the capping layer. The foundation layer and the capping layer include, for example, Ta, Ti, TiN, etc.

The foundation layer 10l may have, for example, a stacked structure including a buffer layer (not shown) and a seed layer (not shown). For example, the buffer layer relaxes the roughness of the surface of the first electrode E1 and improves the crystallinity of the layers stacked on the buffer layer. For example, at least one selected from the group consisting of tantalum (Ta), titanium (Ti), vanadium (V), tungsten (W), zirconium (Zr), hafnium (Hf), and chrome (Cr) is used as the buffer layer. An alloy including at least one material selected from these materials may be used as the buffer layer.

It is favorable for the thickness of the buffer layer of the foundation layer 10l to be not less than 1 nm and not more than 10 nm. It is more favorable for the thickness of the buffer layer to be not less than 1 nm and not more than 5 nm. In the case where the thickness of the buffer layer is too thin, the buffering effect is lost. In the case where the thickness of the buffer layer is too thick, the thickness of the sensor element 51a becomes excessively thick. A seed layer may be formed on the buffer layer; and the seed layer may have a buffering effect. In such a case, the buffer layer may be omitted. The buffer layer includes, for example, a Ta layer having a thickness of 3 nm.

The seed layer of the foundation layer 10*l* controls the crystal orientation of the layers stacked on the seed layer. The seed layer controls the crystal grain size of the layers stacked on the seed layer. A metal having a fcc structure (face-centered cubic structure), a hcp structure (hexagonal close-packed structure), a bcc structure (body-centered cubic structure), or the like is used as the seed layer.

For example, the crystal orientation of a spin-valve film on the seed layer can have a fcc (111) orientation by using ruthenium (Ru) having a hcp structure, NiFe having a fcc structure, or Cu having a fcc structure as the seed layer of the foundation layer 10*l*. The seed layer includes, for example, a Cu layer having a thickness of 2 nm or a Ru layer having a thickness of 2 nm. To increase the crystal orientation of the layer formed on the seed layer, it is favorable for the thickness of the seed layer to be not less than 1 nm and not more than 5 nm. It is more favorable for the thickness of the seed layer to be not less than 1 nm and not more than 3 nm. Thereby, the function of the seed layer improving the crystal orientation is realized sufficiently.

On the other hand, the seed layer may be omitted in the case where, for example, it is unnecessary for the layers formed on the seed layer to have a crystal orientation (e.g., in the case where an amorphous free magnetic layer is formed, etc.). For example, a Ru layer having a thickness of 2 nm is used as the seed layer.

For example, the pinning layer 10*p* provides the first magnetic layer 10 (the ferromagnetic layer) formed on the pinning layer 10*p* with unidirectional anisotropy (unidirectional anisotropy) and fixes a magnetization 10*m* of the first magnetic layer 10. The pinning layer 10*p* includes, for example, an antiferromagnetic layer. The pinning layer 10*p* includes, for example, at least one selected from the group consisting of Ir—Mn, Pt—Mn, Pd—Pt—Mn, and Ru—Rh—Mn. The thickness of the pinning layer 10*p* is set appropriately to provide a unidirectional anisotropy of sufficient strength.

In the case where PtMn or PdPtMn is used as the pinning layer 10*p*, it is favorable for the thickness of the pinning layer 10*p* to be not less than 8 nm and not more than 20 nm. It is more favorable for the thickness of the pinning layer 10*p* to be not less than 10 nm and not more than 15 nm. The unidirectional anisotropy can be provided with a smaller thickness when IrMn is used as the pinning layer 10*p* than when PtMn is used as the pinning layer 10*p*. In such a case, it is favorable for the thickness of the pinning layer 10*p* to be not less than 4 nm and not more than 18 nm. It is more favorable for the thickness of the pinning layer 10*p* to be not less than 5 nm and not more than 15 nm. The pinning layer 10*p* includes, for example, an $Ir_{22}Mn_{78}$ layer having a thickness of 7 nm.

A hard magnetic layer may be used as the pinning layer 10*p*. For example, CoPt (the proportion of Co being not less than 50 at. % and not more than 85 at. %), $(Co_xPt_{100-x})_{100-y}Cr_y$ (x being not less than 50 at. % and not more than 85 at. % and y being not less than 0 at. % and not more than 40 at. %), FePt (the proportion of Pt being not less than 40 at. % and not more than 60 at. %), etc., may be used as the hard magnetic layer.

The second fixed magnetic layer 10*j* includes, for example, a $Co_xFe_{100-x}$ alloy (x being not less than 0 at. % and not more than 100 at. %), a $Ni_xFe_{100-x}$ alloy (x being not less than 0 at. % and not more than 100 at. %), or a material in which a nonmagnetic element is added to these alloys. For example, at least one selected from the group consisting of Co, Fe, and Ni is used as the second fixed magnetic layer 10*j*. An alloy including at least one material selected from these materials may be used as the second fixed magnetic layer 10*j*. A $(Co_xF_{100-x})_{100-y}B_y$ alloy (x being not less than 0 at. % and not more than 100 at. % and y being not less than 0 at. % and not more than 30 at. %) also may be used as the second fixed magnetic layer 10*j*. By using an amorphous alloy of $(Co_xFe_{100-x})_{100-y}B_y$ as the second fixed magnetic layer 10*j*, the fluctuation of the characteristics of the sensor element 51*a* can be suppressed even in the case where the sensor element 51*a* is small.

It is favorable for the thickness of the second fixed magnetic layer 10*j* to be, for example, not less than 1.5 nm and not more than 5 nm. Thereby, for example, the strength of the unidirectional anisotropic magnetic field due to the pinning layer 10*p* can be stronger. For example, the strength of the antiferromagnetic coupling magnetic field between the second fixed magnetic layer 10*j* and the first fixed magnetic layer 10*i* can be set to be stronger by interposing the magnetic coupling layer 10*k* formed on the second fixed magnetic layer 10*j*. For example, it is favorable for the magnetic thickness (the product of a saturation magnetization Bs and a thickness t (Bs·t)) of the second fixed magnetic layer 10*j* to be substantially equal to the magnetic thickness of the first fixed magnetic layer 10*i*.

The saturation magnetization of $Co_{40}Fe_{40}B_{20}$ for a thin film is about 1.9 T (teslas). For example, in the case where a $Co_{40}Fe_{40}B_{20}$ layer having a thickness of 3 nm is used as the first fixed magnetic layer 10*i*, the magnetic thickness of the first fixed magnetic layer 10*i* is 1.9 T×3 nm, or 5.7 Tnm. On the other hand, the saturation magnetization of $Co_{75}Fe_{25}$ is about 2.1 T. The thickness of the second fixed magnetic layer 10*j* for which a magnetic thickness equal to that recited above is obtained is 5.7 Tnm/2.1. T, or 2.7 nm. In such a case, it is favorable for a $Co_{75}Fe_{25}$ layer having a thickness of about 2.7 nm to be used as the second fixed magnetic layer 10*j*. For example, a $Co_{75}Fe_{25}$ layer having a thickness of 2.5 nm is used as the second fixed magnetic layer 10*j*.

In the sensor element 51*a*, the first magnetic layer 10 has a synthetic pinned structure due to the second fixed magnetic layer 10*j*, the magnetic coupling layer 10*k*, and the first fixed magnetic layer 10*i*. The first magnetic layer 10 may have a single pinned structure made of one fixed magnetic layer. In the case where the single pinned structure is used, for example, a $Co_{40}Fe_{40}B_{20}$ layer having a thickness of 3 nm is used as the fixed magnetic layer. The same material as the second fixed magnetic layer 10*j* may be used as the ferromagnetic layer of the fixed magnetic layer having the single pinned structure.

The magnetic coupling layer 10*k* causes antiferromagnetic coupling to occur between the second fixed magnetic layer 10*j* and the first fixed magnetic layer 10*i*. The magnetic coupling layer 10*k* forms a synthetic pinned structure. For example, Ru is used as the magnetic coupling layer 10*k*. It is favorable for the thickness of the magnetic coupling layer 10*k* to be, for example, not less than 0.8 nm and not more than 1 nm. A material other than Ru may be used as the magnetic coupling layer 10*k* if the material causes sufficient antiferromagnetic coupling to occur between the second fixed magnetic layer 10*j* and the first fixed magnetic layer 10*i*. The thickness of the magnetic coupling layer 10*k* may be set to be a thickness not less than 0.8 nm and not more than 1 nm that corresponds to the second peak (2nd peak) of RKKY (Ruderman-Kittel-Kasuya-Yosida) coupling. Further, the thickness of the magnetic coupling layer 10*k* may be set to be a thickness not less than 0.3 nm and not more than 0.6 nm that corresponds to the first peak (1st peak) of RKKY coupling. For example, Ru having a thickness of 0.9 nm is used as the magnetic coupling layer 10k. Thereby, highly reliable coupling is obtained more stably.

The magnetic layer that is used in the first fixed magnetic layer 10i contributes directly to the MR effect. For example, a Co—Fe—B alloy is used as the first fixed magnetic layer 10i. Specifically, a $(Co_xFe_{100-x})_{100-y}B_y$ alloy (x being not less than 0 at. % and not more than 100 at. % and y being not less than 0 at. % and not more than 30 at. %) may be used as the first fixed magnetic layer 10i. In the case where an amorphous alloy of $(Co_xFe_{100-x})_{100-y}B_y$ is used as the first fixed magnetic layer 10i, for example, the fluctuation between the elements caused by the crystal grains can be suppressed even in the case where the sensor element 51a is small.

A layer (e.g., a tunneling insulating layer (not shown)) that is formed on the first fixed magnetic layer 10i may be planarized. By planarizing the tunneling insulating layer, the defect density of the tunneling insulating layer can be reduced. Thereby, a higher MR ratio having a lower resistance per area is obtained. For example, in the case where Mg—O is used as the material of the tunneling insulating layer, the (100) orientation of the Mg—O layer formed on the tunneling insulating layer can be improved by using an amorphous alloy of $(Co_xFe_{100-x})_{100-y}B_y$ as the first fixed magnetic layer 10i. A higher MR ratio is obtained by improving the (100) orientation of the Mg—O layer. The $(Co_xFe_{100-x})_{100-y}B_y$ alloy crystallizes using the (100) plane of the Mg—O layer as a template when annealing. Therefore, good crystal conformation between the Mg—O and the $(Co_xFe_{100-x})_{100-y}B_y$ alloy is obtained. A higher MR ratio is obtained by obtaining good crystal conformation.

Other than the Co—Fe—B alloy, for example, an Fe—Co alloy may be used as the first fixed magnetic layer 10i.

A higher MR ratio is obtained as the thickness of the first fixed magnetic layer 10i increases. A thinner first fixed magnetic layer 10i is favorable to obtain a larger fixed magnetic field. A trade-off relationship between the MR ratio and the fixed magnetic field exists for the thickness of the first fixed magnetic layer 10i. In the case where the Co—Fe—B alloy is used as the first fixed magnetic layer 10i, it is favorable for the thickness of the first fixed magnetic layer 10i to be not less than 1.5 nm and not more than 5 nm. It is more favorable for the thickness of the first fixed magnetic layer 10i to be not less than 2.0 nm and not more than 4 nm.

Other than the materials described above, the first fixed magnetic layer 10i may include a $Co_{90}Fe_{10}$ alloy having a fcc structure, Co having a hcp structure, or a Co alloy having a hcp structure. For example, at least one selected from the group consisting of Co, Fe, and Ni is used as the first fixed magnetic layer 10i. An alloy including at least one material selected from these materials is used as the first fixed magnetic layer 10i. For example, a higher MR ratio is obtained by using an FeCo alloy material having a bcc structure, a Co alloy including a cobalt composition of 50 at. % or more, or a material (a Ni alloy) having a Ni composition of 50 at. % or more as the first fixed magnetic layer 10i.

For example, a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, $Co_2FeGa_{0.5}Ga_{0.5}$, etc., may be used as the first fixed magnetic layer 10i. For example, a $Co_{40}Fe_{40}B_{20}$ layer having a thickness of, for example, 3 nm is used as the first fixed magnetic layer 10i.

For example, the intermediate layer 30 separates the magnetic coupling between the first magnetic layer 10 and the second magnetic layer 20. The intermediate layer 30 includes, for example, a metal, an insulator, or a semiconductor. For example, Cu, Au, Al, or the like is used as the metal. In the case where a metal is used as the intermediate layer 30, the thickness of the intermediate layer 30 is, for example, not less than about 1 nm and not more than about 7 nm. For example, magnesium oxide (Mg—O, etc.), aluminum oxide ($Al_2O_3$, etc.), titanium oxide (T—O, etc.), zinc oxide (Zn—O, etc.), gallium oxide (Ga—O), or the like is used as the insulator or the semiconductor. In the case where the insulator or the semiconductor is used as the intermediate layer 30, the thickness of the intermediate layer 30 is, for example, not less than about 0.6 nm and not more than about 2.5 nm. For example, a CCP (Current-Confined-Path) spacer layer may be used as the intermediate layer 30. In the case where the CCP spacer layer is used as the spacer layer, for example, a structure is used in which a copper (Cu) metal path is formed inside an insulating layer of aluminum oxide ($Al_2O_3$). For example, a Mg—O layer having a thickness of 1.6 nm is used as the intermediate layer 30.

The second magnetic layer 20 includes a ferromagnet material. In the embodiment, good soft magnetic properties can be realized by using a ferromagnetic material having an amorphous structure including boron as the second magnetic layer 20.

The second magnetic layer 20 may include an alloy including boron (B) and at least one element selected from the group consisting of Fe, Co, and Ni. For example, the second magnetic layer 20 may include a Co—Fe—B alloy, an Fe—B alloy, an Fe—Co—Si—B alloy, etc. For example, the second magnetic layer 20 may include a $Co_{40}Fe_{40}B_{20}$ layer having a thickness of 4 nm.

The second magnetic layer 20 may have a multilayered structure. The second magnetic layer 20 may have, for example, a two-layer structure. In the case where a tunneling insulating layer of Mg—O is used as the intermediate layer 30, it is favorable for a layer of a Co—Fe—B alloy or an Fe—B alloy to be provided in the portion of the second magnetic layer 20 contacting the intermediate layer 30. Thereby, a high magnetoresistance effect is obtained.

For example, the second magnetic layer 20 includes a first portion on the intermediate layer 30 side and a second portion on the functional layer 25 side. The first portion includes, for example, a portion of the second magnetic layer 20 contacting the intermediate layer 30. The first portion includes a layer of a Co—Fe—B alloy. The second portion includes, for example, an Fe—B alloy. In other words, for example, a Co—Fe—B/Fe—B alloy is used as the second magnetic layer 20. The thickness of the $Co_{40}Fe_{40}B_{20}$ layer is, for example, 0.5 nm. The thickness of the Fe—B alloy layer recited above used as the second magnetic layer 20 is, for example, 6 nm.

In the embodiment, a ferromagnetic material including an amorphous portion including boron is used as the second magnetic layer 20. Thereby, good soft magnetic properties can be obtained. Examples of materials that can be included in the second magnetic layer 20 are described below.

In the embodiment, the functional layer 25 may include an oxide or a nitride. For example, a Mg—O layer having a thickness of 1.5 nm may be used as the functional layer 25.

The capping layer 26c protects the layers provided under the capping layer 26c. The capping layer 26c includes, for example, multiple metal layers. The capping layer 26c has, for example, a two-layer structure (Ta/Ru) of a Ta layer and a Ru layer. The thickness of the Ta layer is, for example, 1 nm; and the thickness of the Ru layer is, for example, 5 nm. Another metal layer may be provided as the capping layer 26c instead of the Ta layer and/or the Ru layer. The configuration of the capping layer 26c is arbitrary. For example, a nonmagnetic material may be used as the capping layer 26c. Another material may be used as the capping layer 26c as long as the material can protect the layers provided under the capping layer 26c.

Examples of the configuration and materials of the second magnetic layer 20 (the free magnetic layer) will now be described further.

The second magnetic layer 20 may include an alloy including boron (B) and at least one element selected from Fe, Co, and Ni. The second magnetic layer 20 may include, for example, a Co—Fe—B alloy, an Fe—B alloy, an Fe—Si—B alloy, an Fe—Al—Si alloy, etc. The second magnetic layer 20 may include, for example, a $(Co_xFe_{100-x})_{100-y}B_y$ alloy (x being not less than 0 at. % and not more than 100 at. % and y being greater than 0 at. % and not more than 40 at. %). The second magnetic layer 20 may include, for example, a $Co_{40}Fe_{40}B_{20}$ layer having a thickness of 4 nm or an $Fe_{30}B_{20}$ layer having a thickness of 4 nm. For example, an Fe—Ga—B alloy, an Fe—Co—Ga—B alloy, or an Fe—Co—Si—B alloy may be used as the second magnetic layer 20.

The second magnetic layer 20 includes an amorphous portion as recited above. A portion of the second magnetic layer 20 may be crystallized. The second magnetic layer 20 may include an amorphous portion while including a crystallized portion.

It is favorable for the boron concentration (e.g., the composition ratio of boron) of the second magnetic layer 20 to be 5 at. % (atomic percent) or more. Thereby, the amorphous structure is obtained easily. It is favorable for the boron concentration of the second magnetic layer 20 to be 35 at. % or less. In the case where the boron concentration is too high, for example, the magnetostriction constant decreases. It is favorable for the boron concentration of the second magnetic layer 20 to be, for example, not less than 5 at. % and not more than 35 at. %, and more favorable to be not less than 10 at. % and not more than 30 at. %.

For example, the second magnetic layer 20 includes the first portion on the intermediate layer 30 side and the second portion on the functional layer 25 side. The first portion includes, for example, a portion of the second magnetic layer 20 contacting the intermediate layer 30. The first portion includes a layer of a Co—Fe—B alloy. The second portion includes, for example, an Fe—Ga—B alloy. In other words, for example, a Co—Fe—B/Fe—Ga—B alloy is used as the second magnetic layer 20. The thickness of the $Co_{40}Fe_{40}B_{20}$ layer is, for example, 2 nm. The thickness of the Fe—Ga—B layer is, for example, 6 nm. Also, a Co—Fe—B/Fe—B alloy may be used. The thickness of the $Co_{40}Fe_{40}B_{20}$ is, for example, 0.5 nm. The Fe—B thickness is, for example, 4 nm. As described above, for example, a Co—Fe—B/Fe—B alloy may be used as the second magnetic layer 20. In such a case, the thickness of the $Co_{40}Fe_{40}B_{20}$ layer is, for example, 0.5 nm. The thickness of the Fe—B layer is, for example, 4 nm. Thus, a high MR ratio can be obtained in the first portion on the intermediate layer 30 side by using the Co—Fe—B alloy.

The first portion of the second magnetic layer 20 including the interface between the second magnetic layer 20 and the intermediate layer 30 may include crystallized $Fe_{50}Co_{50}$ (having a thickness of 0.5 nm). The first portion of the second magnetic layer 20 including the interface between the second magnetic layer 20 and the intermediate layer 30 may have a two-layer structure such as crystallized $Fe_{50}Co_{50}$ (having a thickness of 0.5 nm)/$Co_{40}Fe_{40}B_{20}$ (having a thickness of 2 nm).

A stacked film of $Fe_{50}Co_{50}$ (having a thickness of 0.5 nm)/$Co_{40}Fe_{40}B_{20}$ (having a thickness of 4 nm) may be used as the second magnetic layer 20. A stacked film of $Fe_{50}Co_{50}$ (having a thickness of 0.5 nm)/$Co_{40}Fe_{40}B_{20}$ (having a thickness of 2 nm)/$Co_{35}Fe_{35}B_{30}$ (having a thickness of 4 nm) may be used as the second magnetic layer 20. In such stacked films, the boron concentration increases away from the intermediate layer 30.

Figure 11:
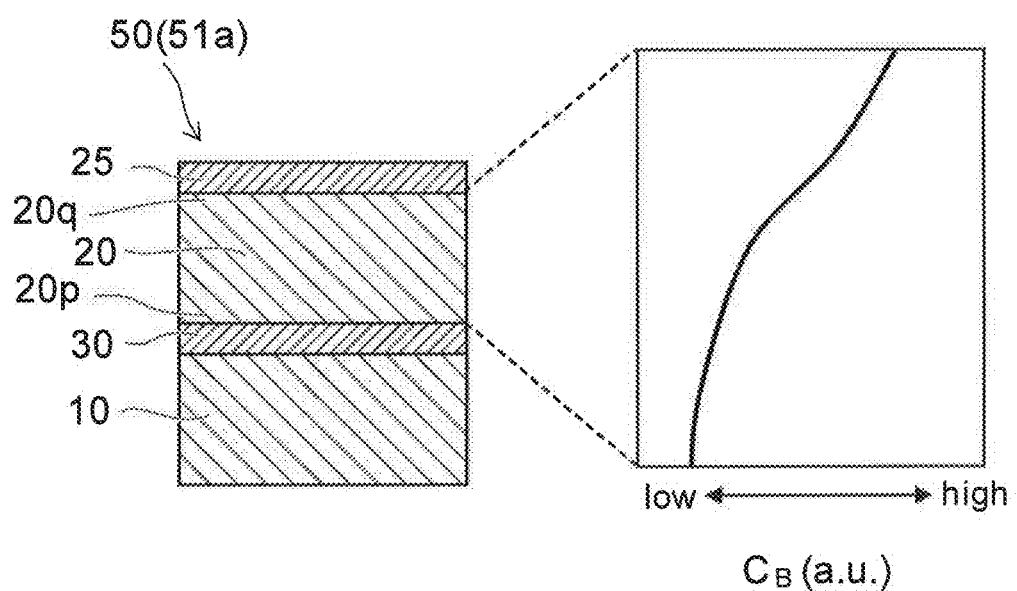
FIG. 11 is a schematic view illustrating the current sensor according to the first embodiment.

FIG. 11 is a schematic view illustrating the current sensor according to the first embodiment.

FIG. 11 shows the distribution of the boron concentration of the sensor element 50 (the sensor element 51a) according to the embodiment.

As shown in FIG. 11, the second magnetic layer 20 includes a first portion 20p and a second portion 20q. The first portion 20p is provided between the intermediate layer 30 and the second portion 20q. For example, the first portion 20p includes the portion of the second magnetic layer 20 contacting the intermediate layer 30. For example, the second portion 20q includes the portion of the second magnetic layer 20 contacting the functional layer 25.

As shown in FIG. 11, the MR ratio of the first portion 20p can be increased by setting a boron concentration $C_B$ of the first portion 20p (the portion on the intermediate layer 30 side) of the second magnetic layer 20 to be low. Thereby, the change of the electrical resistance R per change of the magnetization (the direction of the magnetization) can be large. On the other hand, by setting the boron concentration $C_B$ of the second portion 20q (the portion distal to the intermediate layer 30) to be high, the coercive force Hc of the second portion 20q can be small; and the coercive force Hc of the entire second magnetic layer 20 can be small.

In the case where a tunneling magnetoresistance effect is used in which the intermediate layer includes Mg—O, etc., the MR ratio is dependent on the composition and/or crystal structure of the magnetic material that has a thickness of about 0.5 nm and contacts the intermediate layer. That is, the MR ratio is determined by only the magnetic layer of the intermediate layer vicinity. On the other hand, in the case where the free magnetic layer is a stacked film, for the magnetic properties such as the magnetostriction, coercive force, etc., the characteristics according to the thicknesses of the layers included in the stacked film, e.g., the characteristics of the thickest layer, are most strongly reflected. This is because the stacked body of the magnetic materials included in the free magnetic layer is averaged by exchange coupling. In the embodiment, for example, a layer of a magnetic material having crystallinity is provided at the vicinity of the intermediate layer. Thereby, a high MR ratio is obtained. On the other hand, a layer of an amorphous magnetic material containing boron is provided in the second portion 20q not contacting the intermediate layer. Thereby, a low coercive force is obtained. Thereby, both a high MR ratio and a low coercive force can be obtained.

Such information relating to the distribution of the boron concentration $C_B$ is obtained by, for example, SIMS analysis (secondary ion mass spectrometry). The information is obtained by a combination of cross section TEM and EELS. The information is obtained by EELS analysis. The information also is obtained by three dimensional atom probe analysis.

The thickness of the first portion 20p (the portion where the degree of the crystallization is relatively high) is, for example, thinner than the thickness of the second portion 20q (the portion where the degree of the crystallization is relatively low, i.e., the amorphous portion). Thereby, for example, a small coercive force Hc is easy to obtain. The thickness of the first portion 20p is, for example, ⅓ of the thickness of the second portion 20q or less.

A third sample S03 will now be described. In the third sample S03, the boron concentration of the first portion 20p of the second magnetic layer 20 is lower than the boron concentration of the second portion 20q.

The materials and thicknesses of the layers included in the third sample S03 are as follows.

Foundation layer 10l: Ta (1 nm)/Ru (2 nm)
Pinning layer 10p: $Ir_{22}Mn_{78}$ (7 nm)
Second fixed magnetic layer 10j: $Co_{75}Fe_{25}$ (2.5 nm)
Magnetic coupling layer 10k: Ru (0.9 nm)
First fixed magnetic layer 10i: $Co_{40}Fe_{40}B_{20}$ (3 nm)
Intermediate layer 30: Mg—O (1.6 nm)
Second magnetic layer 20: $Co_{50}Fe_{50}$ (0.5 nm)/ $CO_{40}Fe_{40}B_{20}$ (8 nm)
Functional layer 25: Mg—O (1.5 nm)
Capping layer 26c: Cu (1 nm)/Ta (2 nm)/Ru (5 nm)

In the third sample S03, the free magnetic layer includes $Co_{50}Fe_{50}$ (0.5 nm)/$Co_{40}Fe_{40}B_{20}$ (8 nm); and the first portion 20p having a low boron concentration and the second portion 20q having a high boron concentration are provided in the free magnetic layer.

An example of the evaluation results of the third sample S03 will now be described.

Figure 12:
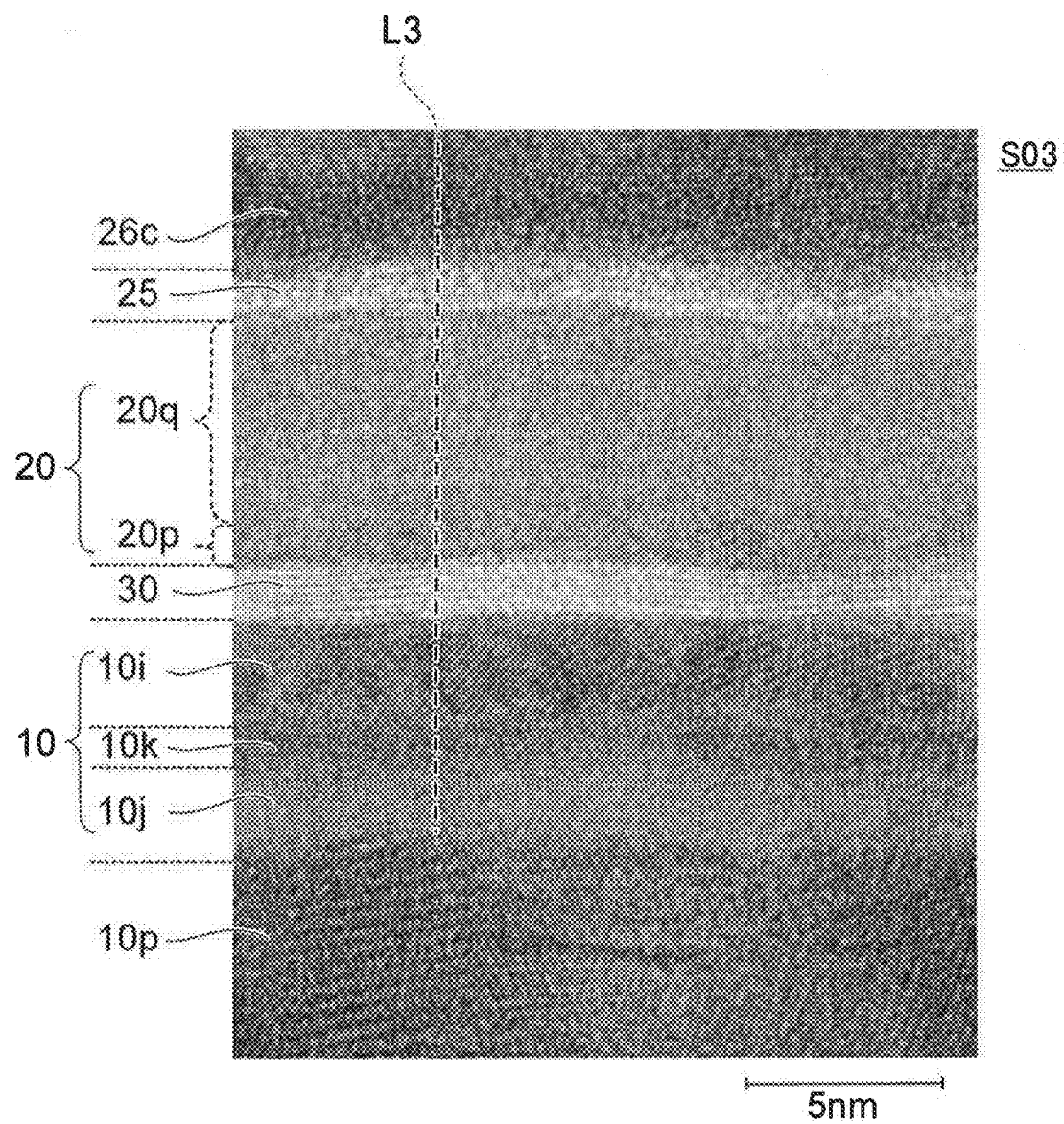
FIG. 12 is a micrograph illustrating characteristics of the current sensor according to the first embodiment.

FIG. 12 is a micrograph illustrating characteristics of the current sensor according to the first embodiment.

FIG. 12 is a cross-section transmission electron microscope photograph of the sensor element of the third sample S03.

It can be seen from FIG. 12 that the first portion 20p of the second magnetic layer 20 on the intermediate layer 30 side has a crystal structure. It can be seen that the second portion 20q on the functional layer 25 side has an amorphous structure.

Figures 13A, 13B:
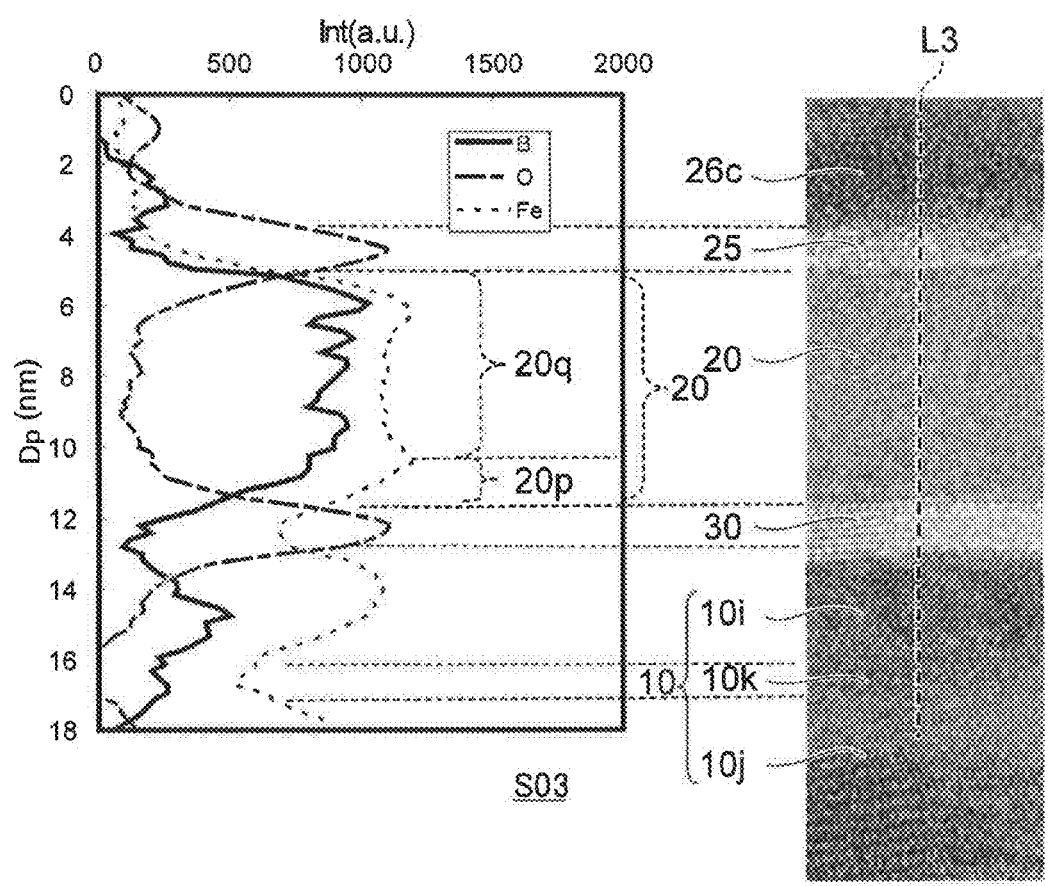
FIG. 13A and FIG. 13B are schematic views illustrating characteristics of the current sensor according to the first embodiment.

FIG. 13A and FIG. 13B are schematic views illustrating characteristics of the current sensor according to the first embodiment.

FIG. 13B corresponds to a portion of FIG. 12A.

FIG. 13A is the evaluation results of the element depth profiles of the third sample S03 by EELS. FIG. 13A shows the element depth profiles along line L3 shown in FIG. 12A.

As shown in FIG. 13A, the EELS intensity of boron of the first portion 20p of the free magnetic layer on the intermediate layer 30 side is lower than the EELS intensity of boron of the second portion 20q on the functional layer 25 side.

The value of the MR of the third sample S03 is 187%. The value of the MR of the third sample S03 is higher than the value of the MR of the first sample S01. In the third sample S03, the MR ratio increases. It is considered that this is caused by providing the first portion 20p which has crystallinity on the intermediate layer 30 (the Mg—O layer) side.

In the third sample S03, the magnetostriction is 20 ppm; and the coercive force is 3.8 Oe. As a result, even in the case where the first portion 20p having crystallinity is provided, a low coercive force can be realized by providing the second portion 20q having the amorphous structure. The magnetic properties of the second magnetic layer 20 are, for example, the sum of the magnetic properties of the first portion 20p and the magnetic properties of the second portion 20q.

The functional layer 25 includes an oxide material or a nitride material. In the oxide material or the nitride material, the atoms inside the material are chemically bonded. Thereby, for example, the diffusion of the boron is suppressed.

An oxide material including at least one element selected from a first group consisting of Mg, Al, Si, Ti, V, Cr, Zn, Zr, Nb, Mo, Hf, Ta, and W or a nitride material including at least one element selected from the first group may be used as the oxide material or the nitride material of the functional layer 25 (the first functional layer).

The functional layer 25 does not contribute to the magnetoresistance effect. Therefore, it is favorable for the resistance per area of the functional layer 25 to be low. For example, it is favorable for the resistance per area of the functional layer 25 to be lower than the resistance per area of the intermediate layer 30 contributing to the magnetoresistance effect. The functional layer 25 includes, for example, an oxide including at least one element selected from the group consisting of Mg, Ti, V, Zn, Sn, Cd, and Ga or a nitride including these elements. The barrier height of the oxide or nitride of these elements is low. The resistance per area of the functional layer 25 can be reduced by using the oxide or nitride of these elements.

In the specification of the application, oxynitrides are included in either the oxide or the nitride. For example, in the case where the proportion of oxygen is higher than the proportion of nitrogen in the oxynitride, the oxynitride may be included in the oxide. For example, in the case where the proportion of nitrogen is higher than the proportion of oxygen, the oxynitride may be included in the nitride.

In the case where the functional layer 25 includes the oxide or the nitride, it is favorable for the thickness of the functional layer 25 to be not less than 0.5 nm and not more than 5 nm, and more favorable to be not less than 1 nm and not more than 3 nm.

Figure 14:
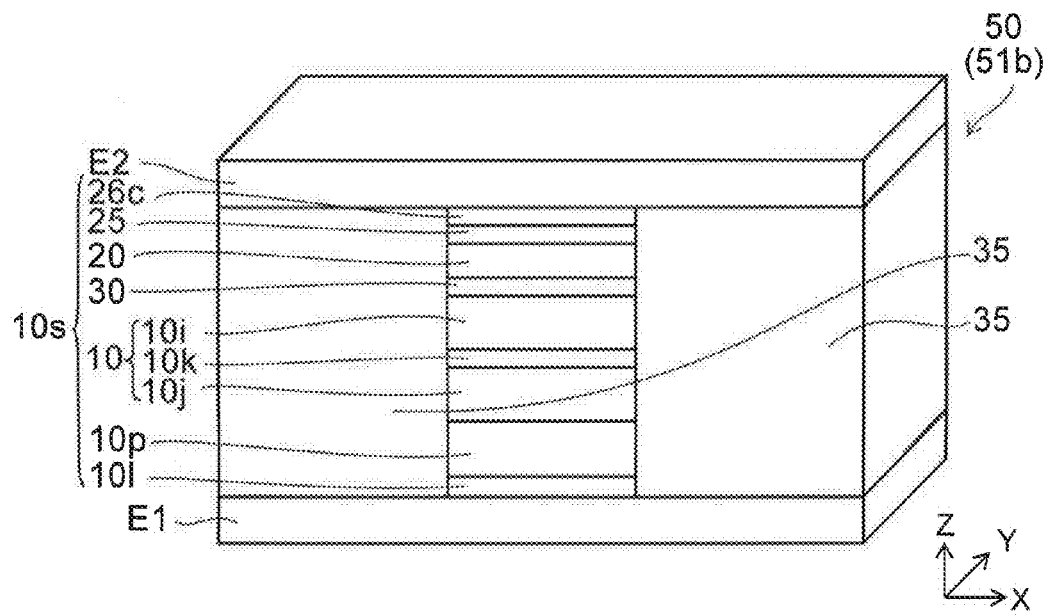
FIG. 14 is a schematic perspective view illustrating a portion of the current sensor according to the first embodiment.

FIG. 14 is a schematic perspective view illustrating a portion of the current sensor according to the first embodiment.

As shown in FIG. 14, an insulating layer 35 is provided in the sensor element 50 (a sensor element 51b) used in the embodiment. For example, the insulating layer 35 (the insulating portion) is provided between the first electrode E1 and the second electrode E2. The insulating layer 35 is provided around the first stacked body 10s between the first electrode E1 and the second electrode E2. The insulating layer 35 is provided to oppose the side wall of the first stacked body 10s.

The insulating layer 35 may include, for example, aluminum oxide (e.g., $Al_2O_3$), silicon oxide (e.g., $SiO_2$), etc. Leakage current around the first stacked body 10s can be suppressed by the insulating layer 35.

Figure 15:
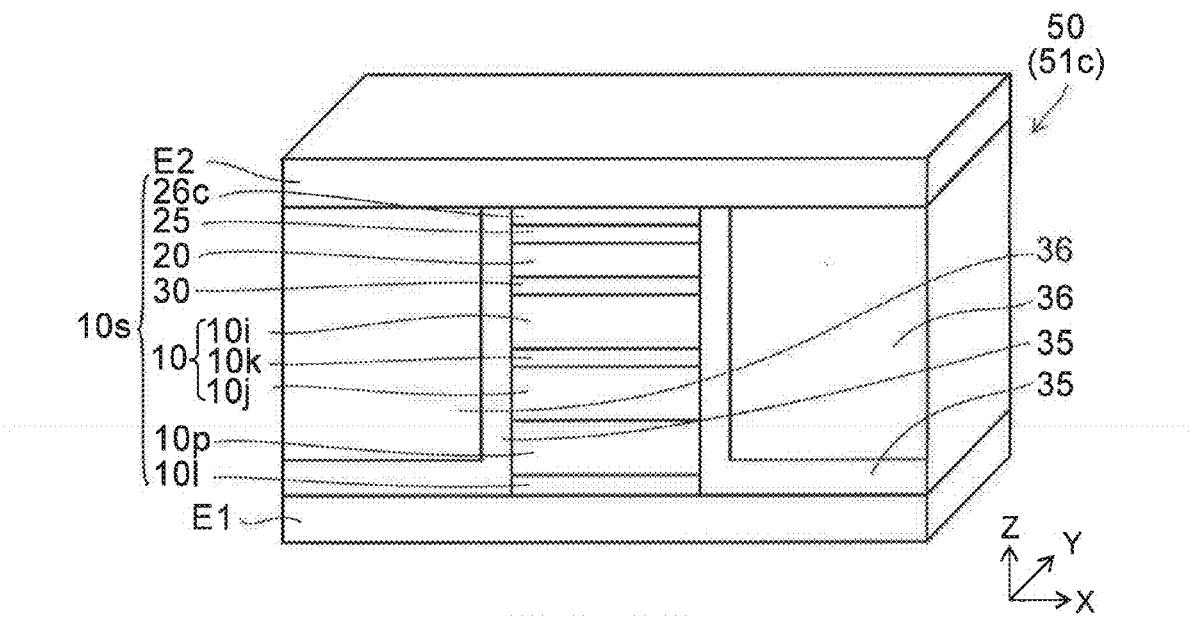
FIG. 15 is a schematic perspective view illustrating a portion of the current sensor according to the first embodiment.

FIG. 15 is a schematic perspective view illustrating a portion of the current sensor according to the first embodiment.

As shown in FIG. 15, a hard bias layer 36 (a first hard bias layer and a first magnetic bias layer) are further provided in the sensor element 50 (a sensor element 51c) used in the embodiment. The hard bias layer 36 is provided between the first electrode E1 and the second electrode E2. For example, the hard bias layer 36 is arranged with the first stacked body 10s in a second direction intersecting a first direction from the first electrode E1 toward the second electrode E2. For example, the insulating layer 35 is disposed between the hard bias layer 36 and the stacked body 10s. In the example, the insulating layer 35 extends between the hard bias layer 36 and the first electrode E1.

At least one selected from the magnetization 10m of the first magnetic layer 10 and a magnetization 20m of the second magnetic layer 20 is set to a desired direction by the magnetization of the hard bias layer 36. At least one selected from the magnetization 10m and the magnetization 20m is set to the desired direction by the hard bias layer 36 in the state in which the magnetic field H1 is not applied to the sensor element.

The hard bias layer 36 includes, for example, a hard ferromagnetic material having a relatively high magnetic anisotropy such as CoPt, CoCrPt, FePt, etc. The hard bias layer 36 may have a structure in which an antiferromagnetic layer is stacked with a layer of a soft magnetic material such as FeCo, Fe, etc. In such a case, the magnetization is aligned with the prescribed direction by exchange coupling. The thickness (e.g., the length along the direction from the first electrode E1 toward the second electrode E2) of the hard bias layer 36 is, for example, not less than 5 nm and not more than 50 nm.

The hard bias layer 36 and the insulating layer 35 recited above are applicable to any of the sensor elements described above and described below.

Figure 16:
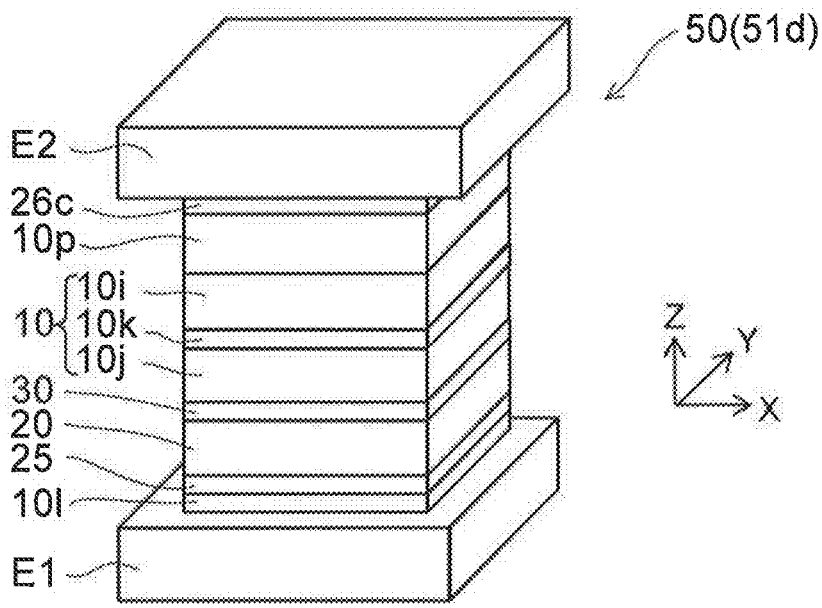
FIG. 16 is a schematic perspective view illustrating a portion of the current sensor according to the first embodiment.

FIG. 16 is a schematic perspective view illustrating a portion of the current sensor according to the first embodiment.

As shown in FIG. 16, the sensor element 50 (a sensor element 51$d$) used in the embodiment includes the first electrode E1 (e.g., a lower electrode), the foundation layer 10$l$, the functional layer 25, the second magnetic layer 20 (the free magnetic layer), the intermediate layer 30, the second fixed magnetic layer 10$j$, the magnetic coupling layer 10$k$, the first fixed magnetic layer 10$i$, the pinning layer 10$p$, the capping layer 26$c$, and the second electrode E2 (e.g., an upper electrode) arranged in order. The sensor element 51$d$ is a top spin-valve type.

The foundation layer 10$l$ includes, for example, Ta/Ru. The thickness of the Ta layer is, for example, 3 nm. The thickness of the Ru layer is, for example, 5 nm.

The functional layer 25 includes, for example, Mg—O. The thickness of the Mg—O layer is, for example, 1.5 nm.

The second magnetic layer 20 includes, for example, $Co_{40}Fe_{40}B_{20}$.

The thickness of the $Co_{40}Fe_{40}B_{20}$ layer is, for example, 4 nm.

The intermediate layer 30 includes, for example, a Mg—O layer having a thickness of 1.6 nm.

The first fixed magnetic layer 10$i$ includes, for example, $Co_{40}Fe_{40}B_{20}$/$Fe_{50}Co_{50}$. The thickness of the $Co_{40}Fe_{40}B_{20}$ layer is, for example, 2 nm. The thickness of the $Fe_{50}Co_{50}$ layer is, for example, 1 nm.

The magnetic coupling layer 10$k$ includes, for example, a Ru layer having a thickness of 0.9 nm.

The second fixed magnetic layer 10$j$ includes, for example, a $Co_{75}Fe_{25}$ layer having a thickness of 2.5 nm.

The pinning layer 10$p$ includes, for example, an IrMn layer having a thickness of 7 nm.

The capping layer 26$c$ includes Ta/Ru. The thickness of the Ta layer is, for example, 1 nm. The thickness of the Ru layer is, for example, 5 nm.

Each of the layers included in the sensor element 51$d$ may include, for example, the materials described in regard to the sensor element 51$a$.

Figure 17:
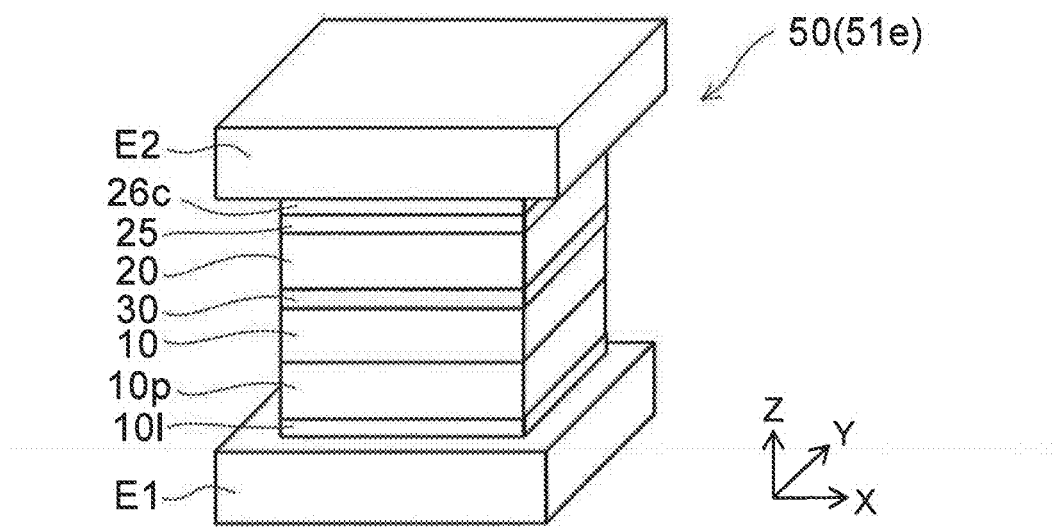
FIG. 17 is a schematic perspective view illustrating a portion of the current sensor according to the first embodiment.

FIG. 17 is a schematic perspective view illustrating a portion of the current sensor according to the first embodiment.

As shown in FIG. 17, the sensor element 50 (a sensor element 51$e$) used in the embodiment includes the first electrode E1 (e.g., the lower electrode), the foundation layer 10$l$, the pinning layer 10$p$, the first magnetic layer 10, the intermediate layer 30, the second magnetic layer 20, the functional layer 25, the capping layer 26$c$, and the second electrode E2 (e.g., the upper electrode) arranged in order.

The sensor element 51$e$ has a single pinned structure in which a single fixed magnetic layer is used.

The foundation layer 10$l$ includes, for example, Ta/Ru. The thickness of the Ta layer is, for example, 3 nm. The thickness of the Ru layer is, for example, 2 nm.

The pinning layer 10$p$ includes, for example, an IrMn layer having a thickness of 7 nm.

The first magnetic layer 10 includes, for example, a $Co_{40}Fe_{40}B_{20}$ layer having a thickness of 3 nm.

The intermediate layer 30 includes, for example, a Mg—O layer having a thickness of 1.6 nm.

The second magnetic layer 20 includes, for example, $Co_{40}Fe_{40}B_{20}$. The thickness of the $Co_{40}Fe_{40}B_{20}$ layer is, for example, 4 nm.

The functional layer 25 includes, for example, a Mg—O layer having a thickness of 1.5 nm.

The capping layer 26$c$ includes, for example, Ta/Ru. The thickness of the Ta layer is, for example, 1 nm. The thickness of the Ru layer is, for example, 5 nm.

Each of the layers included in the sensor element 51$e$ may include, for example, the materials described in regard to the sensor element 51$a$.

Figure 18:
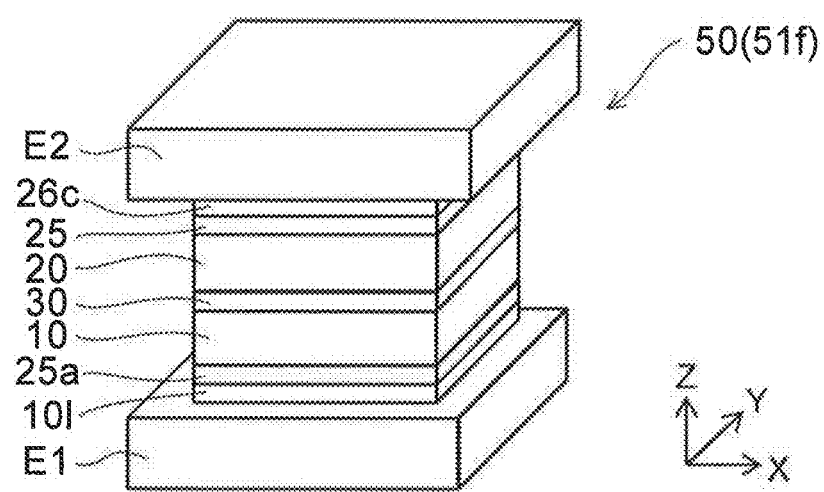
FIG. 18 is a schematic perspective view illustrating a portion of the current sensor according to the first embodiment.

FIG. 18 is a schematic perspective view illustrating a portion of the current sensor according to the first embodiment.

As shown in FIG. 18, the sensor element 50 (a sensor element 51$f$) used in the embodiment includes the first electrode E1 (e.g., the lower electrode), the foundation layer 10$l$, another functional layer 25$a$ (a second functional layer), the first magnetic layer 10, the intermediate layer 30, the second magnetic layer 20, the functional layer 25 (the first functional layer), the capping layer 26$c$, and the second electrode E2 (e.g., the upper electrode) arranged in order. In the example, the first magnetic layer 10 is a free magnetic layer; and the second magnetic layer 20 is a free magnetic layer.

The foundation layer 10$l$ includes, for example, Ta/Ru. The thickness of the Ta layer is, for example, 3 nm. The thickness of the Ru layer is, for example, 45 nm.

The functional layer 25$a$ includes, for example, a Mg—O layer having a thickness of 1.5 nm.

The first magnetic layer 10 includes, for example, a $Co_{40}Fe_{40}B_{20}$ layer having a thickness of 4 nm.

The intermediate layer 30 includes, for example, a Mg—O layer having a thickness of 1.6 nm.

The second magnetic layer 20 includes, for example, $Co_{40}Fe_{40}B_{20}$. The thickness of the $Co_{40}Fe_{40}B_{20}$ layer is, for example, 4 nm.

The functional layer 25 includes, for example, a Mg—O layer having a thickness of 1.5 nm.

The capping layer 26$c$ includes, for example, Ta/Ru. The thickness of the Ta layer is, for example, 1 nm. The thickness of the Ru layer is, for example, 5 nm.

Each of the layers included in the sensor element 51$f$ may include, for example, the materials described in regard to the sensor element 51$a$. The materials and configuration described in regard to the second magnetic layer 20 of the sensor element 51$a$ are applicable to the first magnetic layer 10 of the sensor element 51$f$. The materials and configuration described in regard to the functional layer 25 of the sensor element 51$a$ are applicable to the functional layer 25$a$ of the sensor element 51$f$.

In the example, the first magnetic layer 10 may be considered to be the second magnetic layer 20; and the functional layer 25 may be considered to be the functional layer 25$a$.

In the case where two free magnetic layers are provided as in the sensor element 51f, the relative angle between the magnetizations of the two free magnetic layers changes according to the magnetic field H1. Thereby, the sensor can function as a magnetic field sensor. In such a case, the response to the magnetic field of the second free magnetic layer and the response to the magnetic field of the first free magnetic layer can be designed to be different from each other. Thereby, the relative angle between the magnetizations of each of the two free magnetic layers changes according to the magnetic field H1.

Second Embodiment

Figure 19A:
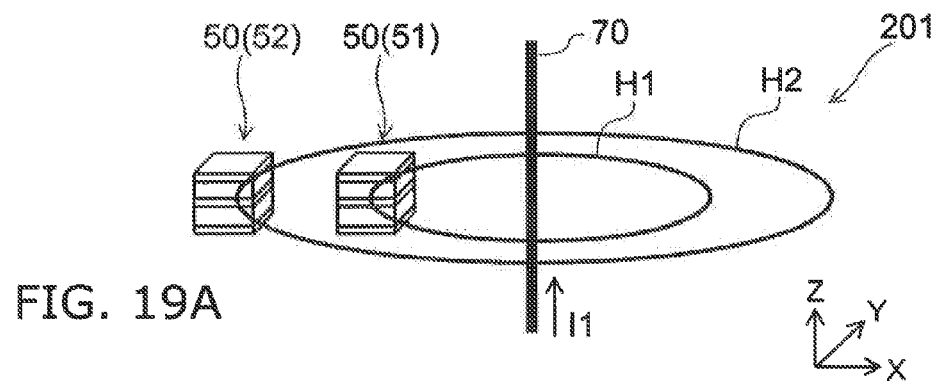
FIG. 19A to FIG. 19C are schematic perspective views illustrating a current sensor according to a second embodiment.
Figure 19B:
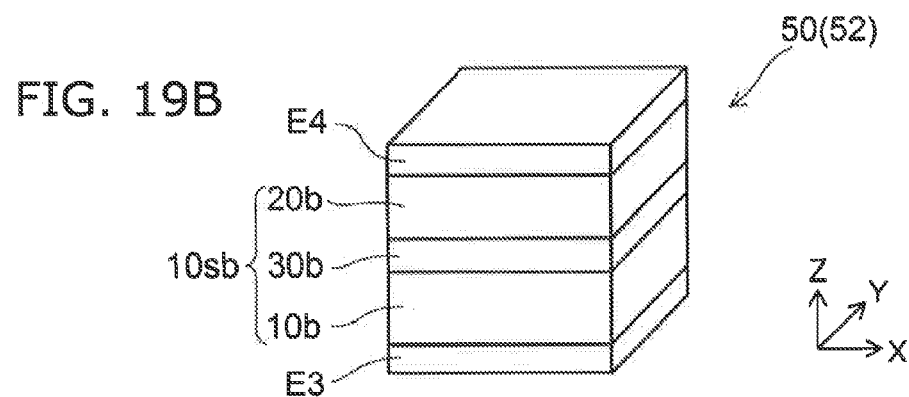
Figure 19C:
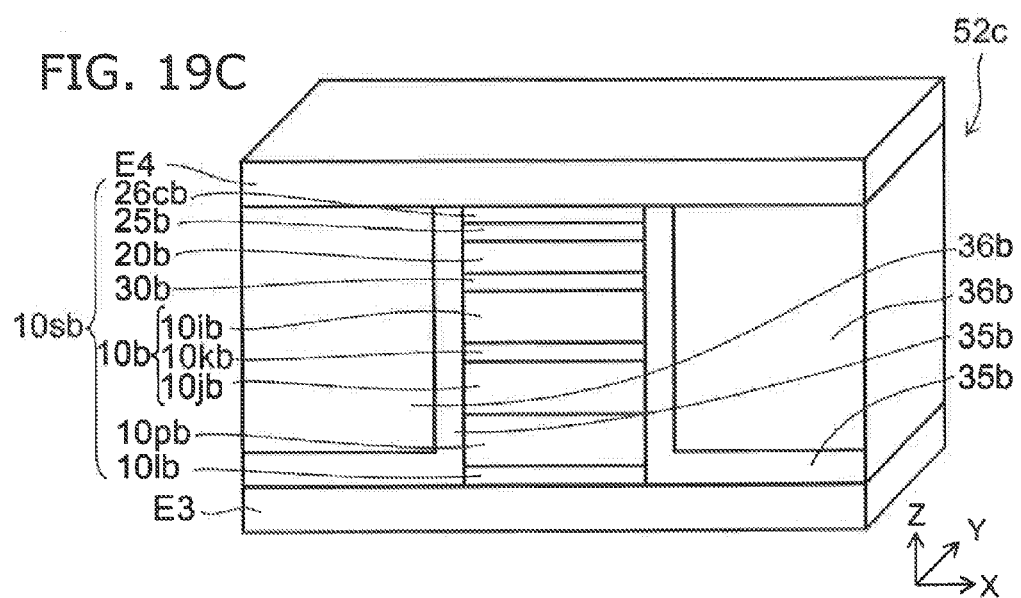

FIG. 19A to FIG. 19C are schematic perspective views illustrating a current sensor according to a second embodiment.

FIG. 19A shows the configuration of the current sensor 201 according to the second embodiment.

As shown in FIG. 19A, the current sensor 201 according to the embodiment includes multiple sensor elements 50. For example, the current sensor 201 includes the first sensor element 51 and a second sensor element 52. The current sensor 201 may further include the power line 70.

In the example, the first sensor element 51 and the second sensor element 52 are arranged with (e.g., separated from) the power line 70 in a direction intersecting the direction in which the power line 70 extends. For example, the magnetic field H1 is generated at the position of the first sensor element 51 by the current I1; and a magnetic field H2 is generated at the position of the second sensor element 52 by the current I1 The current sensor 201 senses the current I1 by using the magnetic field H1 and the magnetic field H2.

Thus, the current sensor according to the embodiment may include multiple sensor elements. Two sensor elements are provided in the current sensor 201. The number of sensor elements in the current sensor according to the embodiment is arbitrary and may be three or more. For example, the distance (the shortest distance) between the first sensor element 51 and the power line 70 is shorter than the distance (the shortest distance) between the second sensor element 52 and the power line 70.

FIG. 19B is a schematic perspective view showing the configuration of the second sensor element 52.

As shown in FIG. 19B, the second sensor element 52 includes a third electrode E3, a fourth electrode E4, and a second stacked body 10sb.

The second stacked body 10sb is provided between the third electrode E3 and the fourth electrode E4. The second stacked body 10sb includes a third magnetic layer 10b, a fourth magnetic layer 20b, and a second intermediate layer 30b.

The third magnetic layer 10b is provided between the third electrode E3 and the fourth electrode E4. The fourth magnetic layer 20b is provided between the third magnetic layer 10b and the fourth electrode E4. The second intermediate layer 30b is provided between the third magnetic layer 10b and the fourth magnetic layer 20b.

In the example, the stacking direction (the direction from the third magnetic layer 10b toward the fourth magnetic layer 20b) of the second sensor element 52 is aligned with the Z-axis direction. However, in the embodiment, the stacking direction of the second sensor element 52 is not limited to the Z-axis direction.

At least a portion of the fourth magnetic layer 20b is amorphous. The magnetization (the direction of the magnetization) of the fourth magnetic layer 20b changes according to the magnetic field (the magnetic field H2). The fourth magnetic layer 20b is, for example, a free magnetic layer. The third magnetic layer 10b is, for example, a reference layer. The second intermediate layer 30b is a nonmagnetic layer.

Configurations, materials, etc., similar to those of the free magnetic layer, the fixed magnetic layer, the nonmagnetic layer, and the electrodes described in the first embodiment in regard to the sensor element 50 are applicable to the free magnetic layer, the fixed magnetic layer, the nonmagnetic layer, and the electrodes of the second sensor element 52. The configuration of the fourth magnetic layer 20b is similar to the configuration of the second magnetic layer 20. The configuration of the third magnetic layer 10b is similar to the configuration of the first magnetic layer 10. The configuration of the second intermediate layer 30b is similar to the configuration of the intermediate layer 30. The configurations of the third electrode E3 and the fourth electrode E4 are similar to the configurations of the first electrode E1 and the second electrode E2.

In other words, a configuration similar to that of the first sensor element 51 (the sensor elements 51a to 51f) is applicable to the second sensor element 52. The materials, sizes, etc., of the configuration of the second sensor element 52 may be different from those of the first sensor element 51.

FIG. 19C is a schematic perspective view showing the configuration of the second sensor element 52 (a sensor element 52c).

As shown in FIG. 19C, the third electrode E3, the fourth electrode E4, and the second stacked body 10sb are provided in the sensor element 52c as well. In the example, a foundation layer 10lb, a pinning layer 10pb, a first fixed magnetic layer 10ib, a second fixed magnetic layer 10jb, a magnetic coupling layer 10kb, and a capping layer 26cb are provided in the sensor element 52c. A second functional layer 25b is provided between the fourth magnetic layer 20b and the fourth electrode E4. Configurations and materials similar to those described in the first embodiment are applicable to the configurations and materials of these components.

In the example, an insulating layer 35b and the hard bias layer 36 (a second hard bias layer 36b and a second magnetic bias layer) are further provided. The configurations of these components are similar to the configurations described in the first embodiment. The second hard bias layer 36b is provided between the third electrode E3 and the fourth electrode E4. The second hard bias layer 36b is arranged with the second stacked body in a fourth direction intersecting a third direction from the third electrode toward the fourth electrode. The current can be sensed with high precision by multiply providing the sensor elements.

Figure 20A:
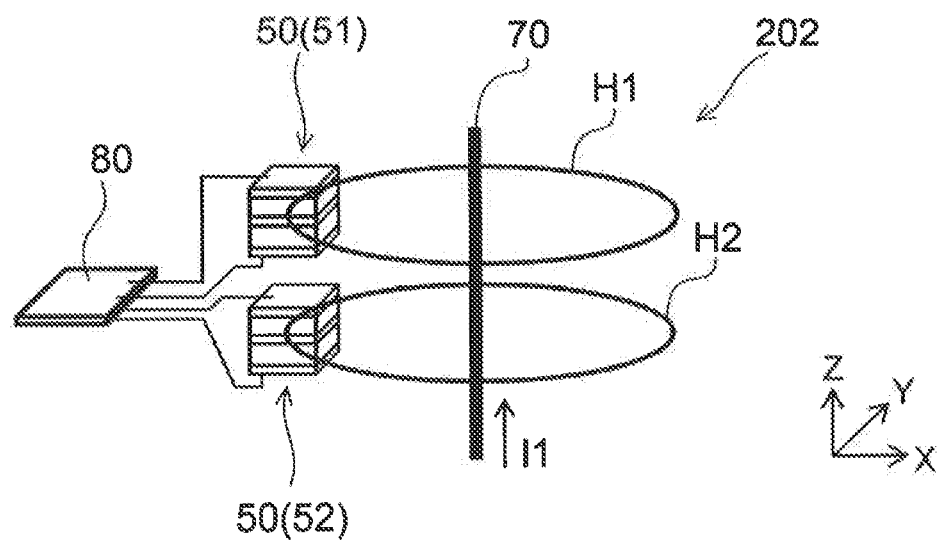
FIG. 20A and FIG. 20B are schematic views illustrating a current sensor according to the second embodiment.
Figure 20B:
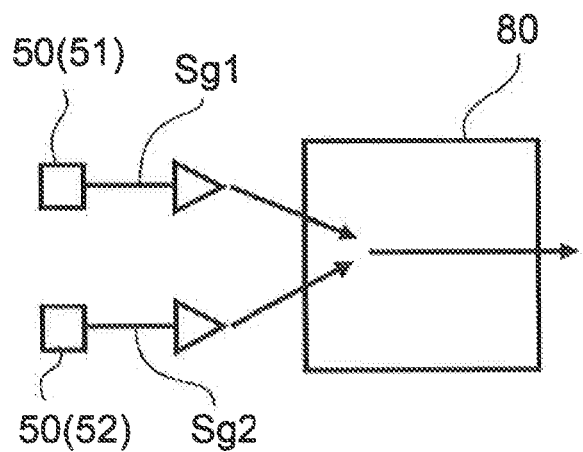

FIG. 20A and FIG. 20B are schematic views illustrating a current sensor according to the second embodiment.

FIG. 20A shows the current sensor 202 according to the embodiment. As shown in FIG. 20A, the current sensor 202 includes the first sensor element 51 and the second sensor element 52. The current sensor 201 may further include the power line 70. The configurations described in regard to the current sensor 201 are applicable to these components. In the example, the distance (the shortest distance) between the first sensor element 51 and the power line 70 is substantially the same as the distance (the shortest distance) between the second sensor element 52 and the power line 70. For example, the distance between the first sensor element 51 and the power line 70 is not less than 0.9 times and not more than 1.1 times the distance between the second sensor element 52 and the power line 70.

The current sensor according to the embodiment may include a processor 80. For example, the processor 80 is electrically connected to the first sensor element 51 and the second sensor element 52.

FIG. 20B is a schematic view showing an operation of the current sensor according to the embodiment.

As shown in FIG. 20B, for example, a first signal Sg1 that corresponds to the magnetic field H1 is obtained from the first sensor element 51. A second signal Sg2 that corresponds to the magnetic field H2 is obtained from the second sensor element 52. The processor 80 processes the first signal Sg1 and the second signal Sg2.

For example, multiple sensor elements having mutually-different responses to the magnetic field are used. In other words, for example, the sensing precision of the first sensor element 51 is set to be higher than the sensing precision of the second sensor element 52 when a small current of about 10 mA flows in the power line 70. For example, the sensing precision of the second sensor element 52 is set to be higher than the sensing precision of the first sensor element 51 when a large current of about 100 A flows in the power line 70.

For example, the processor 80 processes the first signal Sg1 and the second signal Sg2 according to the magnitude of the current flowing in the power line 70. The processor 80 outputs a signal based on one selected from the first signal Sg1 and the second signal Sg2 based on the magnitude of the current determined from at least one selected from the first signal Sg1 and the second signal Sg2. For example, the signal of the sensor element having high precision is selected according to the magnitude of the current. For example, the first signal Sg1 is selected when a small current of about 10 mA flows. The second signal Sg2 is selected when a large current of about 100 A flows.

Thus, multiple sensor elements are provided. The magnitude of the current that can be sensed with high precision is different between the multiple sensor elements. Thereby, the precision with which the current is sensed can be increased for an extremely wide current range.

The magnitude of the current that can be sensed with high precision can be adjusted by adjusting the distance between the stacked body and the hard bias layer. For example, the distance between the first hard bias layer 36 and the first stacked body 10s is set to be shorter than the distance between the second hard bias layer 36b and the second stacked body 10sb.

For example, the magnitude of the current that can be sensed with high precision can be adjusted by adjusting the magnetic thickness of the hard bias layer. For example, the magnetic thickness of the first hard bias layer 36 is set to be thicker than the magnetic thickness of the second hard bias layer. Thereby, the precision with which the current is sensed can be increased for a wide dynamic range.

Further, although a hard bias layer of a magnetically hard material is used as the bias layer in the example recited above, the bias layer is not limited to the hard bias layer; and another bias mechanism may be used as long as a magnetic bias can be applied. For example, biasing in which an antiferromagnetic layer is stacked with a magnetic layer may be used. Such a mechanism has the advantage that, for example, even when external magnetic field noise is applied, the bias magnetic field becomes ineffective instantaneously; but the bias due to the antiferromagnetic layer returns the mode to the original bias mode when the ferromagnetic field noise is gone. Such a bias mechanism that uses a such an antiferromagnetic layer is effective in the case where it is important to prevent the effects of such ferromagnetic field noise that degrades the strength of the hard bias.

Figure 21:
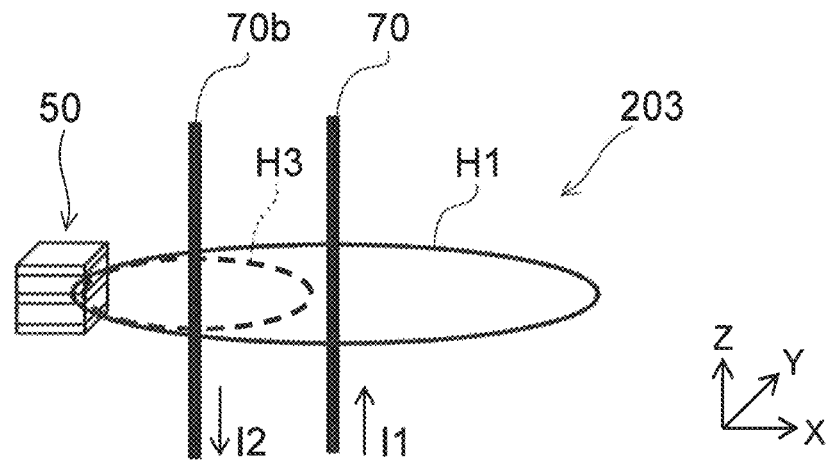
FIG. 21 is a schematic perspective view illustrating a current sensor according to the second embodiment.

FIG. 21 is a schematic perspective view illustrating a current sensor according to the second embodiment.

As shown in FIG. 21, the current sensor 203 includes the sensor element 50, the power line 70 (a first power line 70a), and a second power line 70b.

The configurations described in regard to the current sensor 200 are applicable to the power line 70 and the sensor element 50. A magnetic field H3 is generated at the position of the sensor element 50 by a current I2 flowing through the second power line 70b. For example, the current I2 flows so that the magnetic field at the position of the sensor element 50 due to the magnetic field H3 reduces (e.g., cancels) the magnetic field H1. The current I1 that flows through the power line 70 may be sensed based on the current I2.

Figure 22:
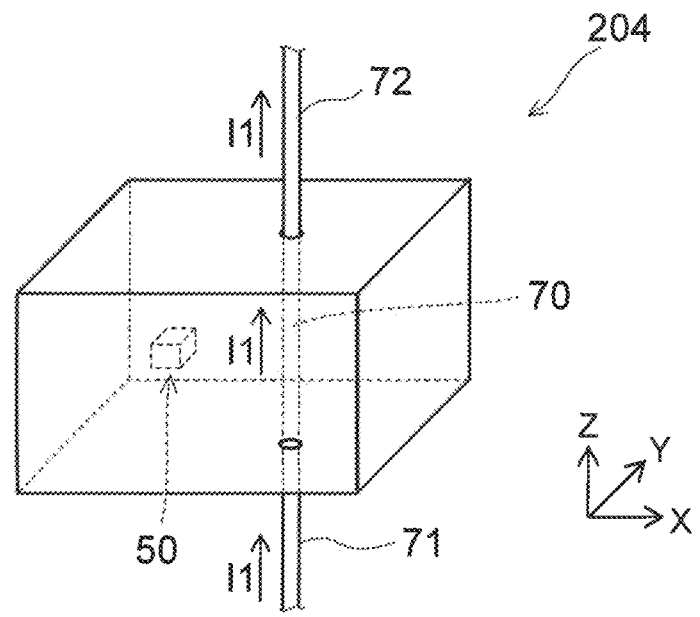
FIG. 22 is a schematic perspective view illustrating a current sensor according to the second embodiment.

FIG. 22 is a schematic perspective view illustrating a current sensor according to the second embodiment.

As shown in FIG. 22, the current sensor 204 includes the sensor element 50 and the power line 70. One end of the power line 70 is electrically connected to a power line 71. The other end of the power line 70 is electrically connected to power line 72. The current I1 flows in the power line 70 via the power line 71 and the power line 72. The sensor element 50 senses the current I1 using the magnetic field generated by the current I1.

Third Embodiment

FIG. 23A to FIG. 23C are schematic views illustrating a current sensor module according to a third embodiment.

FIG. 23A is a schematic perspective view illustrating the current sensor module 250 according to the embodiment.

FIG. 23B is a perspective plan view illustrating the current sensor module 250.

FIG. 23C is a perspective plan view illustrating the current sensor module 250.

In FIG. 23A to FIG. 23C, some of the components are not shown for easier viewing of the drawings.

Current sensor modules are applicable to, for example, smart meters and HEMS (Home Energy Management System) applications for household appliances. A smart meter is used, for example, for measuring electrical power. The smart meter measures, for example, voltage and current. It is possible to measure the voltage using a conventional semiconductor element. Therefore, by adding the current sensor according to the embodiment, the current sensor module functions not only as a current sensor but also as a smart meter. In the case where the current sensor module is used in a HEMS application, the current sensor module is used to continuously monitor the power consumption amount of the household appliances.

As shown in FIG. 23A to FIG. 23C, the current sensor module 250 includes a housing 300, the power line 70, and the sensor element 50. Further, the current sensor module 250 includes an insulator 301, a power line supporter 302, a substrate supporter 303, an electronic substrate module 304, and a sensor substrate module 305. For example, the power line 70, the sensor element 50, the insulator 301, the power line supporter 302, the substrate supporter 303, the electronic substrate module 304, and the sensor substrate module 305 are contained inside the housing 300.

In the example, the housing 300 has a first housing surface 300a and a second housing surface 300b. The second housing surface 300b is separated from the first housing surface 300a.

A direction from the first housing surface 300a toward the second housing surface 300b is taken as a Z1-axis direction. One direction perpendicular to the Z1-axis direction is taken as an X1-axis direction. One direction perpendicular to the Z1-axis direction and perpendicular to the X1-axis direction is taken as a Y1-axis direction.

A display unit 306 is provided in the second housing surface 300b of the housing 300. The display unit 306 displays, to the outside, the measured electrical power amount.

For example, a pair of power lines is connected to the housing. For example, one of the pair of power lines is electrically connected to one end of the power line 70. For example, the other of the pair of power lines is electrically connected to the other end of the power line 70. Thereby, the power line 70 is energized; and the electrical power amount can be measured. The current I1 that flows in the power line 70 is, for example, alternating current of about 50 to 60 Hz. The current I1 may be direct current. FIG. 23A to FIG. 23C show the direction of the current I1 to describe the direction of the magnetic field H1 generated by the current I1. This shows the case, as in direct current, where the direction of the current does not change. In the case where the current I1 is alternating current, the direction of the current I1 changes to have reverse polarities over time. FIG. 23A to FIG. 23C show the case where the current I1 is single-phase alternating current of about 100 V to 200 V. The current I1 according to the embodiment may be three-phase alternating current. In the case of three-phase alternating current, three pairs of power lines from the outside are connected to the housing. This is similar for each of the current sensor modules described below.

For example, the power line 70 extends in a direction aligned with the Z1-axis direction. For example, the current I1 flows from the lower portion to the upper portion of the housing (flows along the Z1-axis direction). The power line 70 is fixed to the interior of the housing 300 by the insulator 301 and the power line supporter 302. The insulator 301 is disposed between the power line 70 and the power line supporter 302. The power line supporter 302 is disposed between the insulator 301 and the housing 300. The power line supporter (a first supporter) 302 regulates the relative positions of the power line 70 and the housing 300.

The relative position of the sensor element 50 with respect to the housing 300 is substantially fixed. The relative position of the power line 70 with respect to the housing 300 is substantially fixed. Thereby, the distance between the sensor element 50 and the power line 70 does not change easily over time. The distance between the sensor element 50 and the power line 70 is set not to change. Thereby, the current can be sensed with high precision.

The electronic substrate module 304 is substantially fixed to the housing 300 via the substrate supporter 303. A substrate supporter (a second supporter) 303 regulates the relative positional relationship between the housing 300 and the current sensor. The sensor substrate module 305 is provided on the electronic substrate module 304. The sensor element 50 is provided on the sensor substrate module 305. The electronic substrate module 304 is fixed to the housing 300; and the sensor substrate module 305 is fixed to the electronic substrate module 304. Thereby, the relative position of the sensor element 50 with respect to the housing 300 is substantially fixed. The distance between the power line 70 and the sensor element 50 does not change easily over time.

In the current sensor module 250, the electronic substrate module 304 and the sensor substrate module 305 are arranged with the power line 70 in a direction perpendicular to the direction (the Z1-axis direction) in which the current I1 flows through the power line 70.

As shown in FIG. 23C, the direction of the current-produced magnetic field at the sensor substrate module 305 vicinity is, for example, the X1-axis direction.

Figure 24A:
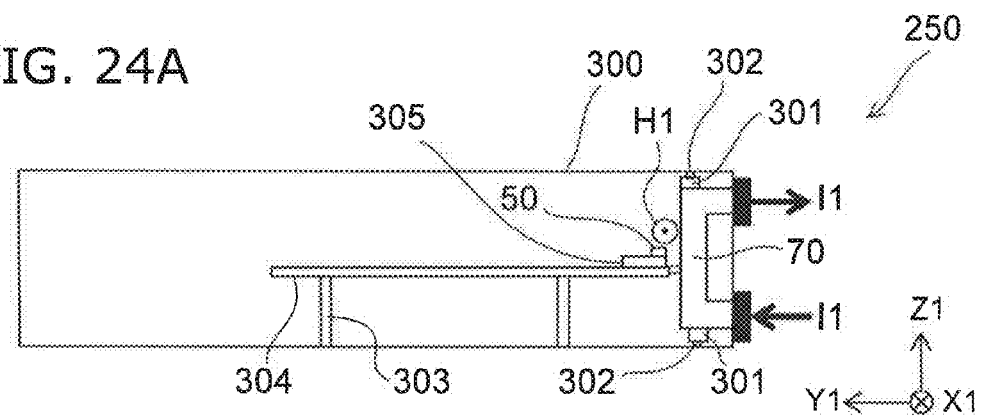
FIG. 24A to FIG. 24C are schematic views illustrating the operation of the current sensor module according to the third embodiment.
Figure 24B:
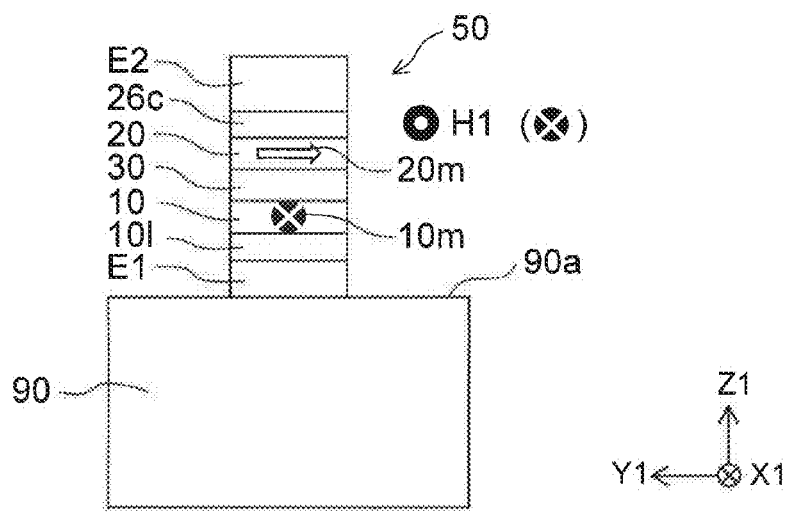
Figure 24C:
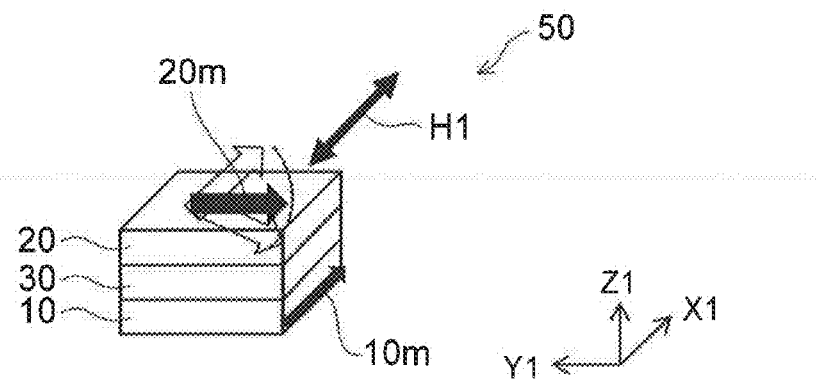

FIG. 24A to FIG. 24C are schematic views illustrating the operation of the current sensor module according to the third embodiment.

FIG. 24A is a perspective plan view illustrating the current sensor module 250.

FIG. 24B is a schematic cross-sectional view illustrating the sensor element 50 used in the current sensor module 250.

FIG. 24C is a schematic perspective view illustrating the sensor element 50 used in the current sensor module 250.

As shown in FIG. 24B, the sensor element 50 includes, for example, a substrate 90. The substrate 90 has a substrate surface 90a. The substrate surface 90a is a plane (in the example, the X1-Y1 plane) substantially parallel to the major surface of the sensor substrate module 305. The first electrode E1 is provided on the substrate surface 90a. The first electrode E1 is disposed between the substrate surface 90a and the second electrode E2.

As shown in FIG. 24A to FIG. 24C, the direction of the magnetization 20m of the second magnetic layer 20 is, for example, any direction in the X1-Y1 plane when the magnitude of the current I1 is zero. When the magnitude of the current I1 is zero, the direction of the magnetization 20m is a direction perpendicular to the direction (the Z1-axis direction) in which the power line 70 extends. For example, the direction (the Z-axis direction) from the first magnetic layer 10 toward the second magnetic layer 20 is parallel to the Z1-axis direction.

For example, the substrate surface 90a is substantially perpendicular to the direction in which the power line 70 extends. The sensor element 50 (the first sensor element) is provided on the substrate surface 90a. The direction from the first magnetic layer 10 toward the second magnetic layer 20 is substantially parallel (or antiparallel) to the direction in which the power line 70 extends. When the current I1 does not flow, the direction of the magnetization 20m is substantially parallel (or antiparallel) to the direction from the power line 70 toward the sensor element 50. Thereby, alternating current of any polarity can be sensed with good linearity.

For the dispositions of the power line and the current sensor as shown in FIG. 24A to FIG. 24C, the power line is disposed (the power line 70 extends) in the cross section thickness direction (e.g., the stacking direction of the stacked body 10s) of the current sensor module as shown in FIG. 24A. In such a case, as shown in FIG. 24B, the magnetizations (the direction of the magnetization 10m and the direction of the magnetization 20m) of the current sensor are disposed to be in a plane parallel to the surface of the current sensor module (in a plane perpendicular to the stacking direction). Such a disposition has the advantage of being resistant to external noise. For example, in the case where an external magnetic field is applied from the surface (e.g., the first housing surface 300a or the second housing surface 300b) of the current sensor module where the external magnetic field noise is most easily applied, the magnetic field is applied in a direction orthogonal to the surface. However, the magnetization of the current sensor is aligned to be, for example, in a direction parallel to the surface. Therefore, the magnetic field in the direction orthogonal to the surface does not become a noise source easily. Such an alignment of the magnetization is superior because the alignment reduces the effects of the external magnetic field without adding extra mechanisms. For example, a magnetic shield is provided in the cross-sectional direction of the current sensor module as necessary because of the effects of the external magnetic field from the cross-sectional direction (e.g., the X1-direction or the Y1-direction) of the current sensor module. In such a case, because this cross-sectional area is, for example, the lowest cross-sectional area in the current sensor module, the cost increase for adding the magnetic shield can be, for example, suppressed to be a minimum.

Also, because it is possible to adhere the substrate surface of the current sensor as-is to the electronic substrate module 304, the effects of alignment shift, etc., are small; and the manufacturing cost necessary for maintaining high precision can be, for example, suppressed to be a minimum.

The characteristics are similar also for the examples shown in FIG. 24A to FIG. 24C, FIG. 25A to FIG. 25C, FIG. 26A to FIG. 26C, FIG. 27A to FIG. 27C, and FIG. 40A to FIG. 40C described below.

Because advantages such as those recited above are not obtained for the examples shown in FIG. 31A to FIG. 31C, FIG. 32A to FIG. 32C, FIG. 33A, FIG. 33B, and FIG. 34 of other examples described below, the embodiment is more favorable for the examples shown in FIG. 23A to FIG. 23C, FIG. 24A to FIG. 24C, FIG. 25A to FIG. 25C, FIG. 26A to FIG. 26C, FIG. 27A to FIG. 27C, and FIG. 40A to FIG. 40C.

Figure 25A:
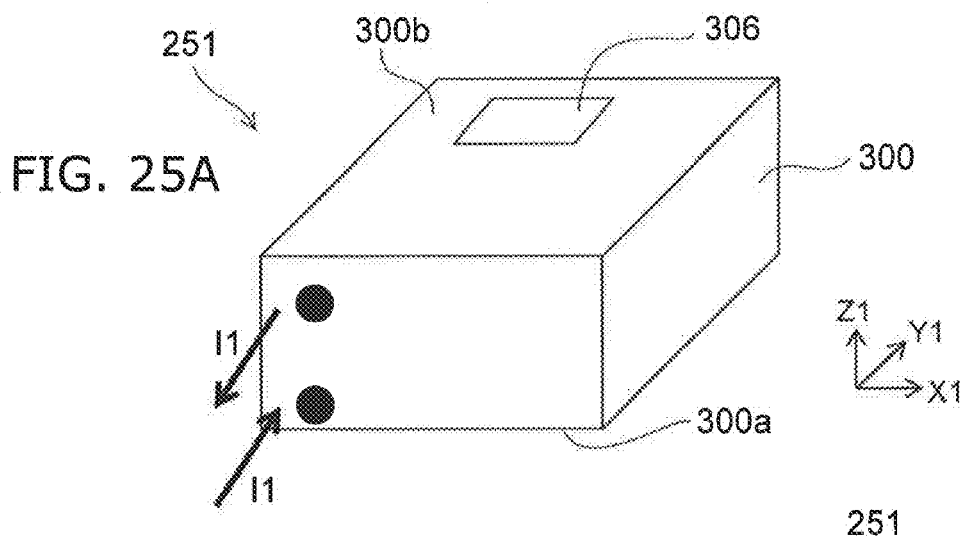
FIG. 25A to FIG. 25C are schematic views illustrating a current sensor module according to the third embodiment.
Figure 25B:
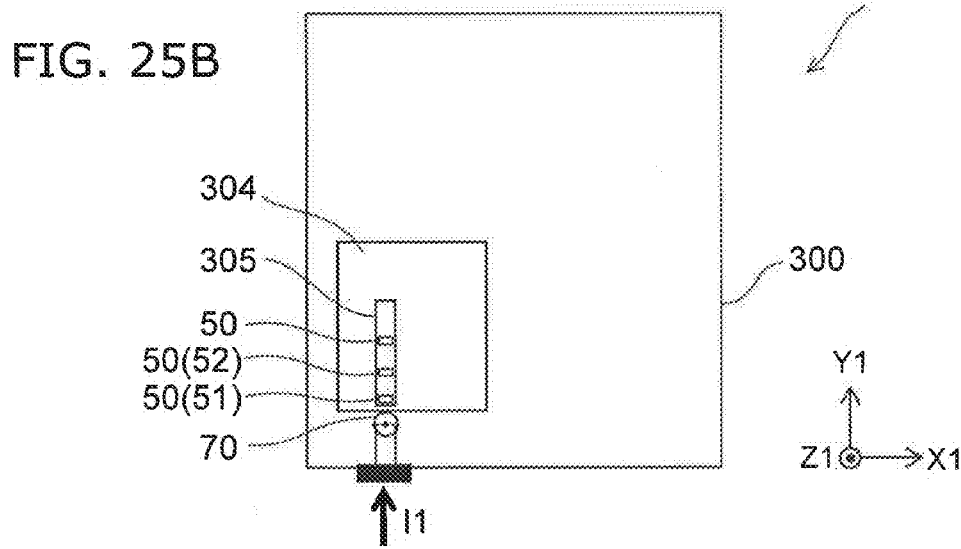
Figure 25C:
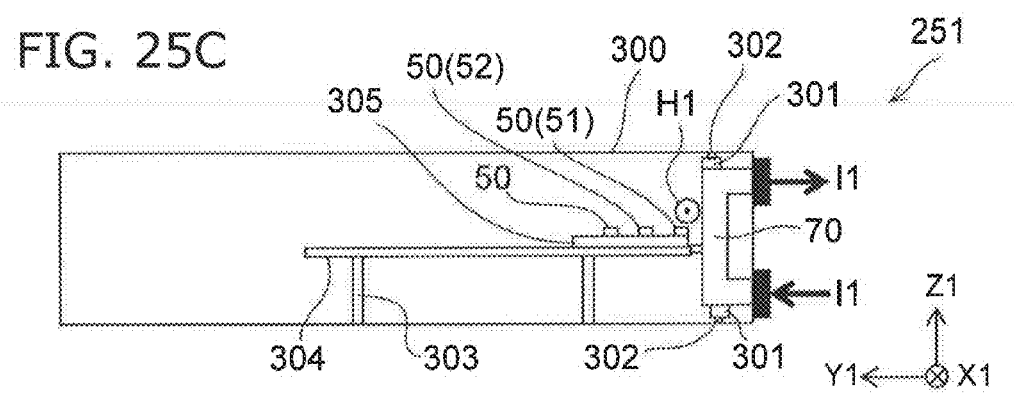

FIG. 25A to FIG. 25C are schematic views illustrating a current sensor module according to the third embodiment.

FIG. 25A is a schematic perspective view illustrating the current sensor module 251 according to the embodiment.

FIG. 25B is a perspective plan view illustrating the current sensor module 251.

FIG. 25C is a perspective plan view illustrating the current sensor module 251.

In FIG. 25A to FIG. 25C, some of the components are not shown for easier viewing of the drawings.

The housing 300, the power line 70, the sensor element 50, the insulator 301, the power line supporter 302, the substrate supporter 303, the electronic substrate module 304, and the sensor substrate module 305 are provided in the current sensor module 251 as well. Configurations similar to the configurations described in regard to the current sensor module 250 are applicable to these components. Multiple sensor elements 50 are provided in the current sensor module 251. The sensor elements 50 are provided respectively at multiple positions having mutually-different distances from the power line 70. Thereby, current of a wide dynamic range can be sensed. The distances between the power line 70 and each of the multiple sensor elements 50 are different from each other. Thereby, the magnitude of the magnetic field H1 generated by the current I1 is different according to the position of each of the multiple sensor elements 50.

For example, the multiple sensor elements 50 include the first sensor element 51 and the second sensor element 52. The second sensor element 52 is separated from the first sensor element 51 in a direction (e.g., the Y1-direction) intersecting the direction in which the power line 70 extends. For example, the distance between the first sensor element 51 and the power line 70 is shorter than the distance between the second sensor element 52 and the power line 70.

For example, the sensor element can sense the state in which a large current flows by being disposed at a position distal to the power line. For example, the sensor element can sense the state in which a faint current flows by being disposed at a position proximal to the power line. By such a sensor element disposition, current having a wide range of values can be sensed.

Figure 26A:
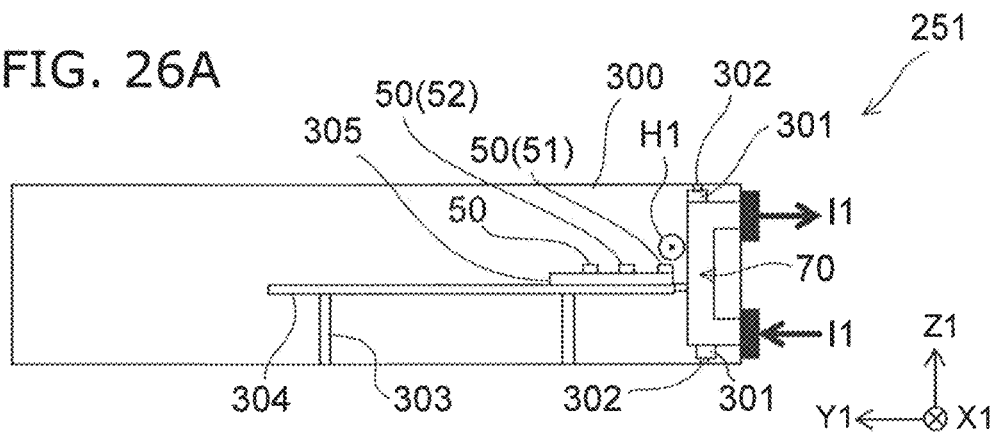
FIG. 26A to FIG. 26C are schematic views illustrating operations of the current sensor module according to the third embodiment.
Figure 26B:
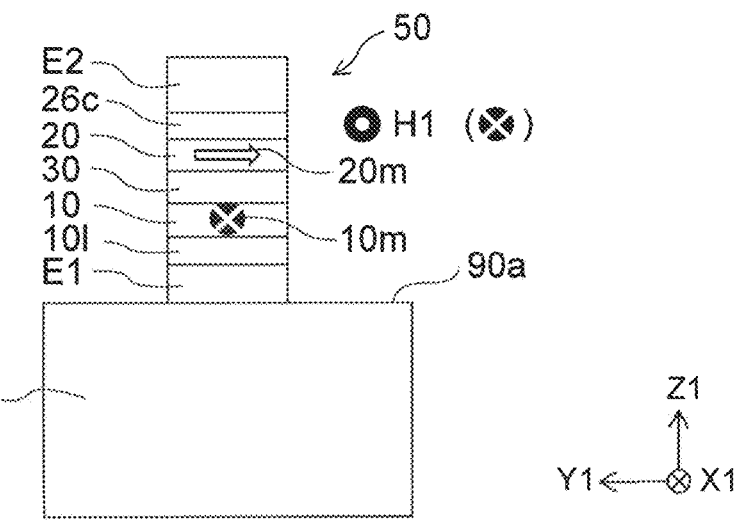
Figure 26C:
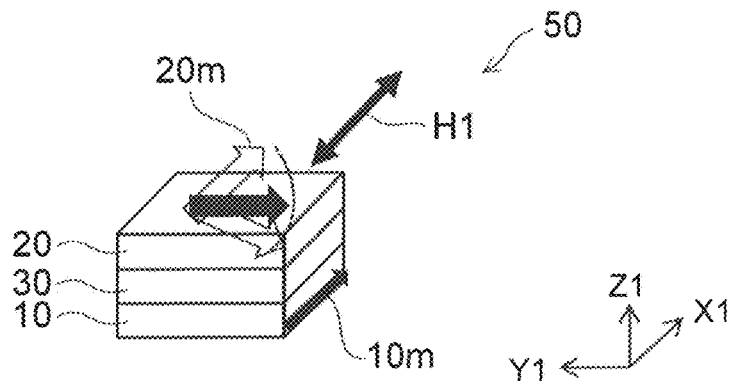

FIG. 26A to FIG. 26C are schematic views illustrating operations of the current sensor module according to the third embodiment.

FIG. 26A is a perspective plan view illustrating the current sensor module 251.

FIG. 26B is a schematic cross-sectional view illustrating the sensor element 50 used in the current sensor module 251.

FIG. 26C is a schematic perspective view illustrating the sensor element 50 used in the current sensor module 251.

In each of the sensor elements 50 as shown in FIG. 26A to FIG. 26C, the direction of the magnetization 20m of the second magnetic layer 20 is, for example, a direction perpendicular to the direction (the Z1-axis direction) in which the power line 70 extends when the magnitude of the current I1 is zero.

Figure 27A:
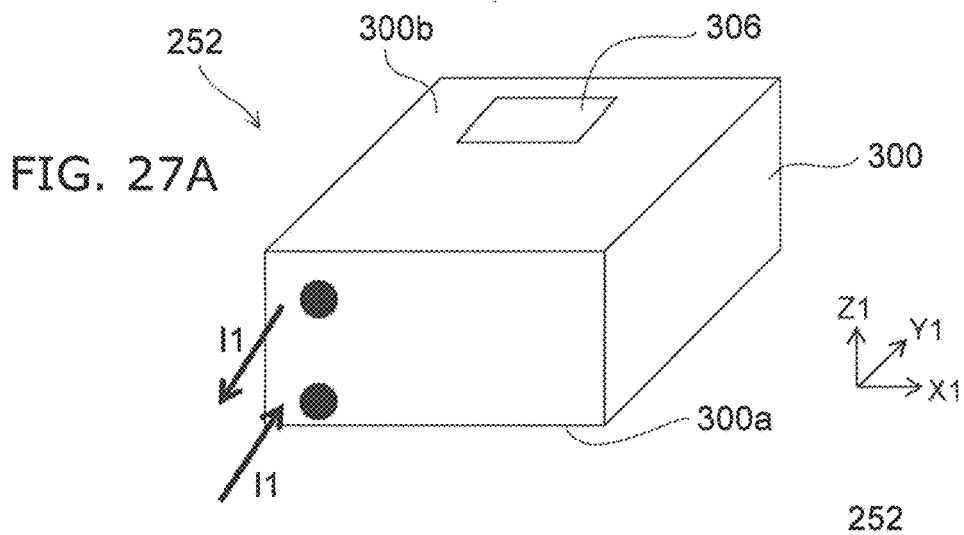
FIG. 27A to FIG. 27C are schematic views illustrating a current sensor module according to the third embodiment.
Figure 27B:
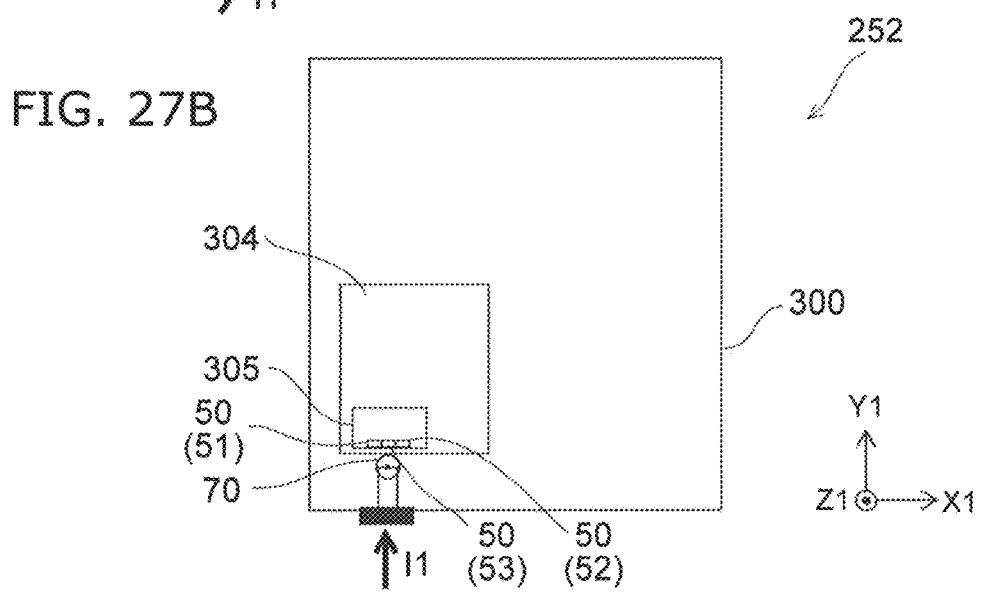
Figure 27C:
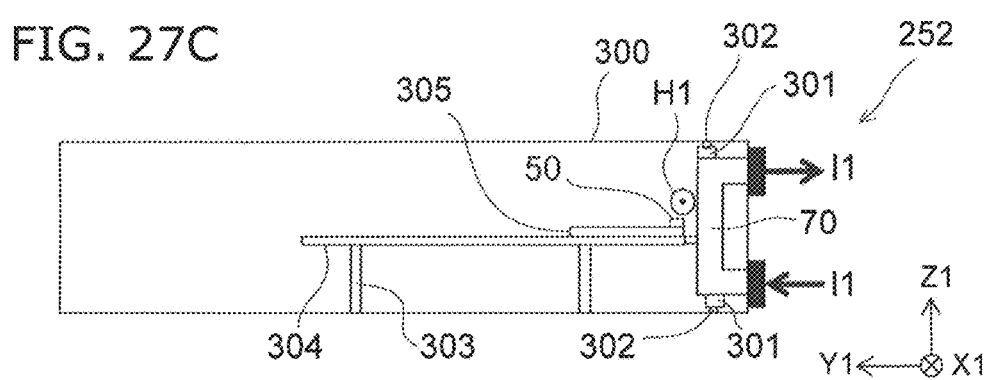

FIG. 27A to FIG. 27C are schematic views illustrating a current sensor module according to the third embodiment.

FIG. 27A is a schematic perspective view illustrating the current sensor module 252 according to the embodiment.

FIG. 27B is a perspective plan view illustrating the current sensor module 252.

FIG. 27C is a perspective plan view illustrating the current sensor module 252.

In FIG. 27A to FIG. 27C, some of the components are not shown for easier viewing of the drawings.

The housing 300, the power line 70, the sensor element 50, the insulator 301, the power line supporter 302, the substrate supporter 303, the electronic substrate module 304, and the sensor substrate module 305 are provided in the current sensor module 252 as well. Configurations similar to the configurations described in regard to the current sensor module 250 are applicable to these components. Multiple sensor elements 50 are provided in the current sensor module 252. In the current sensor module 252, the multiple sensor elements 50 are provided at positions at substantially the same distance from the power line 70.

For example, the multiple sensor elements 50 include the first sensor element 51 and the second sensor element 52. For example, the distance between the first sensor element 51 and the power line 70 is substantially the same as the distance between the second sensor element 52 and the power line 70. For example, the distance between the first sensor element 51 and the power line 70 is not less than 0.9 times and not more than 1.1 times the distance between the second sensor element 52 and the power line 70.

The current sensor module 252 differs from the current sensor module 251 in that the distance to the power line is substantially constant for each of the multiple sensor elements 50. However, the sensitivity of each of the multiple sensor elements 50 to the magnetic field may be different. For example, multiple sensor elements having mutually-different sensitivities to the magnetic field are provided. Thereby, the current value to be sensed is different between the multiple sensor elements 50. Thereby, current having a wide range of values can be sensed.

FIG. 28A and FIG. 28B are schematic perspective views illustrating sensor elements used in the current sensor module according to the third embodiment.

FIG. 28A shows the first sensor element 51 and the second sensor element 52 used in the current sensor module 252. In the example, the sensor elements 50 include hard bias layers. The first sensor element 51 includes the first hard bias layer 36. The second sensor element 52 includes the second hard bias layer 36b. The hard bias layers apply bias magnetic fields to the free magnetic layers.

In the sensor elements 50, the sensitivity to the magnetic field can be changed by changing the distance between the hard bias layer and the free magnetic layer.

For example, the distances (L1a and L1b) between the first hard bias layer 36 and the second magnetic layer 20 are longer than the distances (L2A and L2b) between the second hard bias layer 36b and the fourth magnetic layer 20b. In the example, the sensitivity to the magnetic field of the second sensor element 52 is higher than the sensitivity to the magnetic field of the first sensor element 51. The first sensor element 51 is used to sense a small current. The magnetic field intensity of the second hard bias layer 36b of the second sensor element 52 is large. Thereby, the sensitivity to the magnetic field decreases. The second sensor element 52 is used to sense a large current.

FIG. 28B shows the first sensor element 51 and the second sensor element 52. In the example, the sensor elements 50 include hard bias layers. The first sensor element 51 includes the first hard bias layer 36. The second sensor element 52 includes the second hard bias layer 36b.

For example, a thickness $t_{1a}$ (and a thickness $t_{1b}$) (lengths along the Z-axis direction) of the first hard bias layer 36 is thinner than a thickness $t_{2a}$ (and a thickness $t_{2b}$) (lengths along the Z-axis direction) of the second hard bias layer 36b. In such a case, the sensitivity to the magnetic field of the first sensor element 51 becomes high. The first sensor element 51 is used to sense a small current. The magnetic field intensity of the second hard bias layer 36b of the second sensor element 52 is large. Thereby, the sensitivity to the magnetic field decreases. The second sensor element 52 is used to sense a large current.

Figure 29:
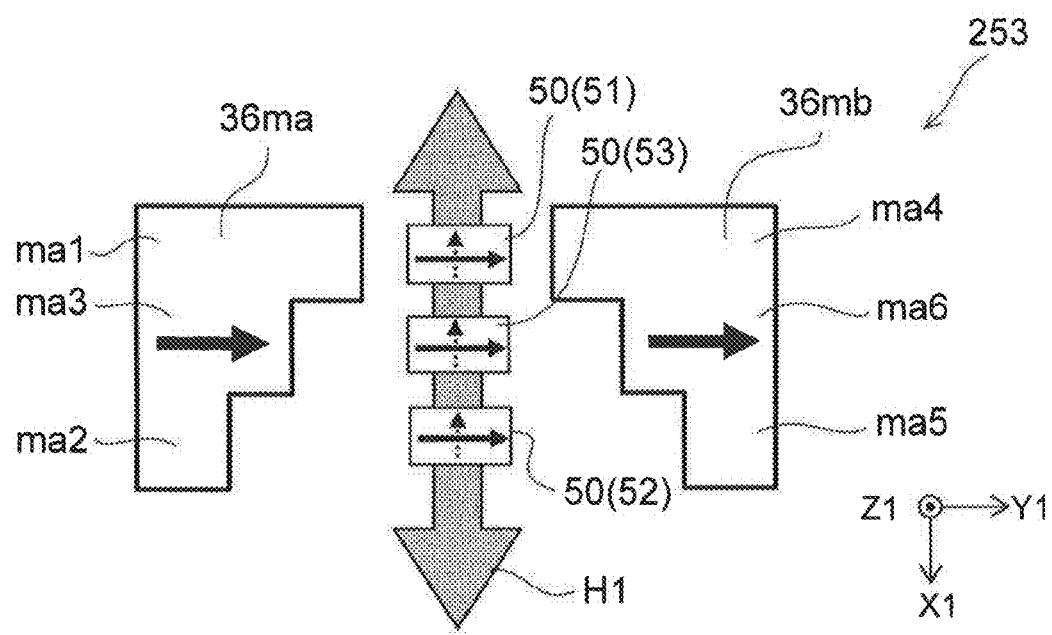
FIG. 29 is a schematic perspective view illustrating the configuration of a current sensor module according to the third embodiment.

FIG. 29 is a schematic perspective view illustrating the configuration of a current sensor module according to the third embodiment.

FIG. 29 shows a portion of the configuration of the current sensor module 253 according to the embodiment. The housing 300, the power line 70, the sensor element 50, the insulator 301, the power line supporter 302, the substrate supporter 303, the electronic substrate module 304, and the sensor substrate module 305 are provided in the current sensor module 253 as well. Configurations similar to the configurations described in regard to the current sensor module 250 are applicable to these components. In the current sensor module 253, for example, multiple sensor elements 50 including the first sensor element 51, the second sensor element 52, and a third sensor element 53 are provided. The third sensor element 53 includes a third stacked body 10sc. For example, a configuration similar to that of the first sensor element 51 is applicable to the third sensor element 53. For example, the multiple sensor elements 50 are arranged in the X-axis direction. In the example, the third sensor element 53 is provided between the first sensor element 51 and the second sensor element 52.

The current sensor module 253 includes a first hard bias unit 36ma and a second hard bias unit 36mb. The first hard bias unit 36ma is arranged with the second hard bias unit 36mb in a direction intersecting the Z-axis direction. For example, the multiple sensor elements 50 are provided between the first hard bias unit 36ma and the second hard bias unit 36mb.

The first hard bias unit 36ma includes, for example, a first bias unit ma1, a second bias unit ma2, and a third bias unit ma3. For example, the second bias unit ma2 is separated from the first bias unit ma1 in the X-axis direction. The third bias unit ma3 is provided between the first bias unit ma1 and the second bias unit ma2.

The second hard bias unit 36mb includes, for example, a fourth bias unit ma4, a fifth bias unit ma5, and a sixth bias unit ma6. For example, the fourth bias unit ma4 is separated from the fifth bias unit ma5 in the X-axis direction. The sixth bias unit ma6 is provided between the fourth bias unit ma4 and the fifth bias unit ma5.

For example, the first sensor element 51 is provided between the first bias unit ma1 and the fourth bias unit ma4. The second sensor element 52 is provided between the second bias unit ma2 and the fifth bias unit ma5. The third sensor element 53 is provided between the third bias unit ma3 and the sixth bias unit ma6.

The distance between the first hard bias unit 36ma and the first sensor element 51 is shorter than the distance between the first hard bias unit 36ma and the second sensor element 52. The distance between the second hard bias unit 36mb and the first sensor element 51 is shorter than the distance between the second hard bias unit 36mb and the second sensor element 52.

FIG. 30A to FIG. 30J are schematic views illustrating a method for manufacturing the current sensor module according to the third embodiment.

FIG. 30A to FIG. 30J show the method for manufacturing a portion of the current sensor module 253. The method for manufacturing the multiple sensor elements 50, the first hard bias unit 36ma, and the second hard bias unit 36mb is shown.

Figure 30A:
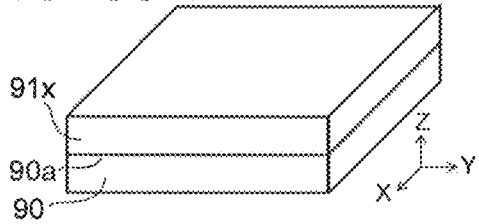
FIG. 30A to FIG. 30J are schematic views illustrating a method for manufacturing the current sensor module according to the third embodiment.

As shown in FIG. 30A, the substrate 90 has the substrate surface 90a. A film 91x that is used to form lower electrodes 91 is stacked on a first surface 90a. In the example, the first surface 90a is substantially parallel to the X-Y plane.

Figure 30B:
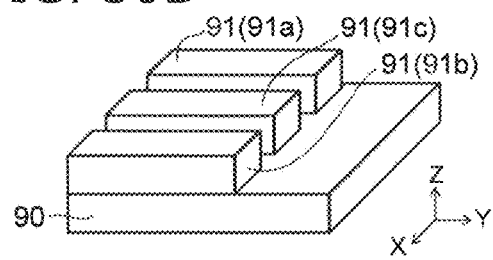

As shown in FIG. 30B, the lower electrodes 91 are formed by patterning the film 91x. For example, the lower electrodes 91 include first to third lower electrode units 91a to 91c. The first to third lower electrode units 91a to 91c are separated from each other in a direction parallel to the X-Y plane. The third lower electrode unit 91c is provided between the first lower electrode unit 91a and the second lower electrode unit 91b.

Figure 30C:
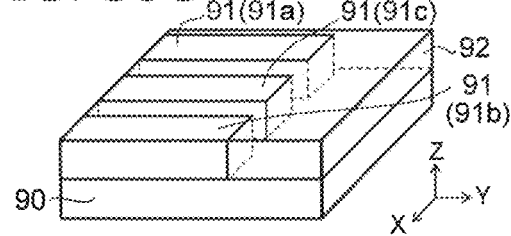

As shown in FIG. 30C, an insulating layer 92 is stacked on the substrate 90. The insulating layer 92 is arranged with the lower electrodes 91 in a direction parallel to the X-Y plane. The insulating layer 92 insulates the first to third lower electrode units 91a to 91c from each other.

Figure 30D:
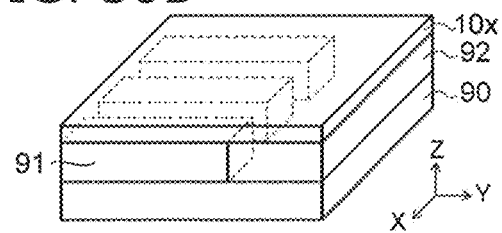

As shown in FIG. 30D, a stacked film 10x that is used to form the first stacked body 10s, the second stacked body 10sb, the third stacked body 10sc, etc., is stacked on the lower electrodes 91 and the insulating layer 92. The stacked film 10x includes films used to form the first magnetic layer 10, the second magnetic layer 20, the intermediate layer 30, etc.

Figure 30E:
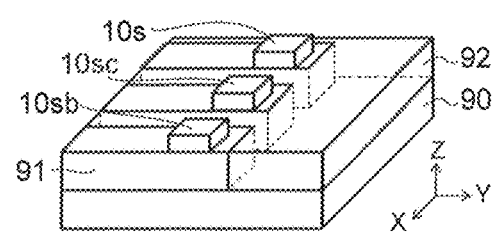

As shown in FIG. 30E, the first stacked body 10s, the second stacked body 10sb, the third stacked body 10sc, etc., are formed by patterning the stacked film 10x. The first stacked body 10s is formed on the first lower electrode unit 91a. The second stacked body 10sb is formed on the second lower electrode unit 91b. The third stacked body 10sc is formed on the third lower electrode unit 91c.

Figure 30F:
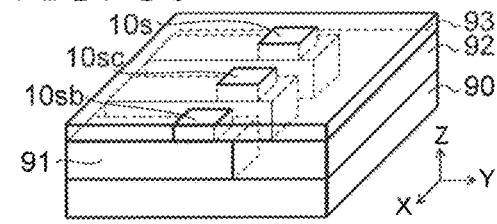

As shown in FIG. 30F, an insulating layer 93 is stacked on the lower electrodes 91 and the insulating layer 92. The insulating layer 93 is arranged with the first stacked body 10s, the second stacked body 10sb, and the third stacked body 10sc in a direction parallel to the X-Y plane. The insulating layer 93 insulates the first stacked body 10s, the second stacked body 10sb, and the third stacked body 10sc from each other.

Figure 30G:
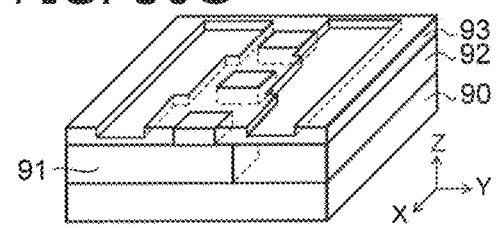

The insulating layer 92 is patterned as shown in FIG. 30G. A portion of the insulating layer 92 is removed at positions where the first hard bias unit 36ma and the second hard bias unit 36mb are to be provided.

Figure 30H:
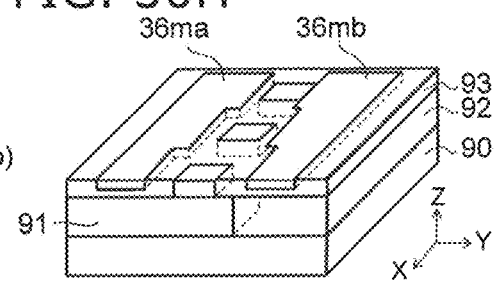

As shown in FIG. 30H, the first hard bias unit 36ma and the second hard bias unit 36mb are formed on portions of the insulating layer 92.

Figure 30I:
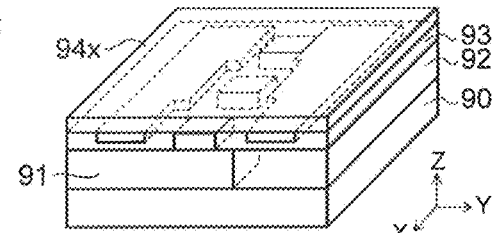

As shown in FIG. 30I, a film 94x that is used to form upper electrodes is stacked on the first stacked body 10s, the second stacked body 10sb, the third stacked body 10sc, the first hard bias unit 36ma, the second hard bias unit 36mb, and the insulating layer 93.

Figure 30J:
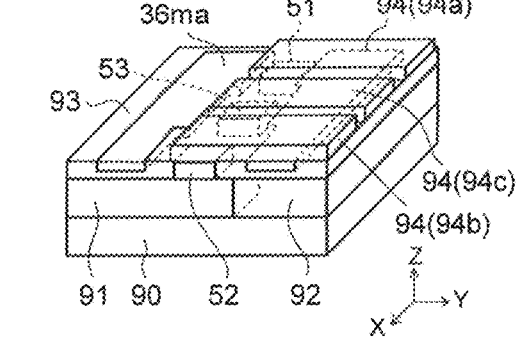

As shown in FIG. 30J, upper electrodes 94 are formed by patterning the film 94x. The upper electrodes 94 include first to third upper electrode units 94a to 94c. The first upper electrode unit 94a is formed on the first stacked body 10s. The second upper electrode unit 94b is formed on the second stacked body 10sb. The third upper electrode unit 94c is formed on the third stacked body 10sc. Thereby, the first to third sensor elements 51 to 53 are formed.

Thus, the hard bias layers (the first hard bias unit 36ma and the second hard bias unit 36mb) and the multiple sensor elements 50 can be formed simultaneously. The increase of the number of processes can be suppressed for processes that form multiple sensor elements 50 having mutually-different sensitivities to the magnetic field. Thereby, the increase of the manufacturing cost can be suppressed.

Figure 31A:
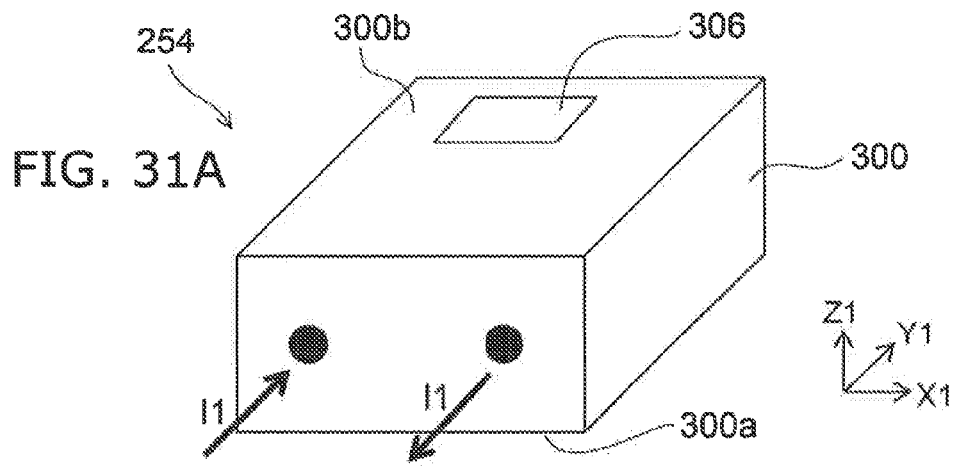
FIG. 31A to FIG. 31C are schematic views illustrating a current sensor module according to the third embodiment.
Figure 31B:
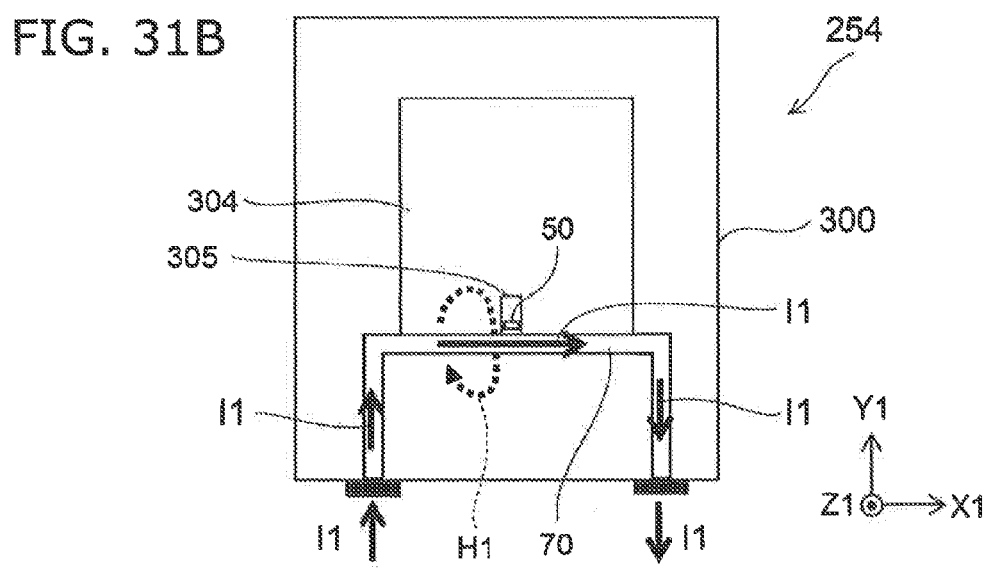
Figure 31C:
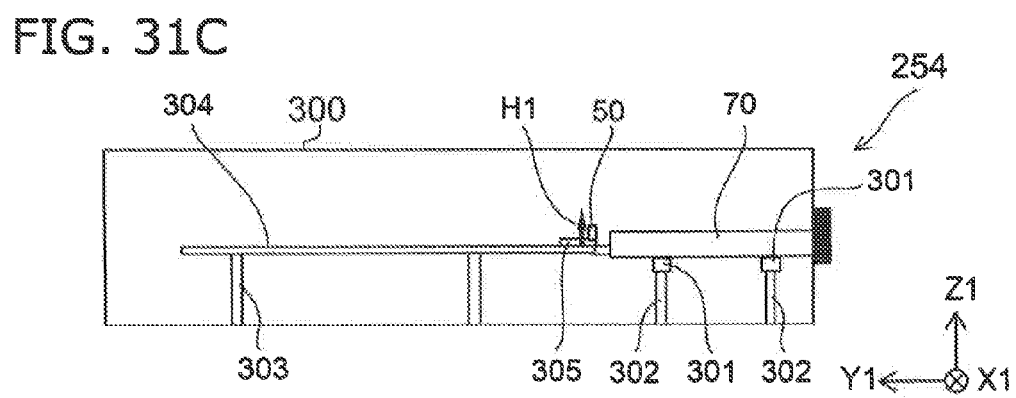

FIG. 31A to FIG. 31C are schematic views illustrating a current sensor module according to the third embodiment.

FIG. 31A is a schematic perspective view illustrating the current sensor module 254 according to the embodiment.

FIG. 31B is a perspective plan view illustrating the current sensor module 254.

FIG. 31C is a perspective plan view illustrating the current sensor module 254.

In FIG. 31A to FIG. 31C, some of the components are not shown for easier viewing of the drawings.

The housing 300, the insulator 301, the power line supporter 302, the substrate supporter 303, the electronic substrate module 304, and the sensor substrate module 305 are provided in the current sensor module 254 as well. Configurations similar to the configurations described in regard to the current sensor module 250 are applicable to these components.

In the current sensor module 254, the power line 70 extends in a direction parallel to the X1-Y1 plane. For example, the current I1 flows along the X1-axis direction.

Figure 32A:
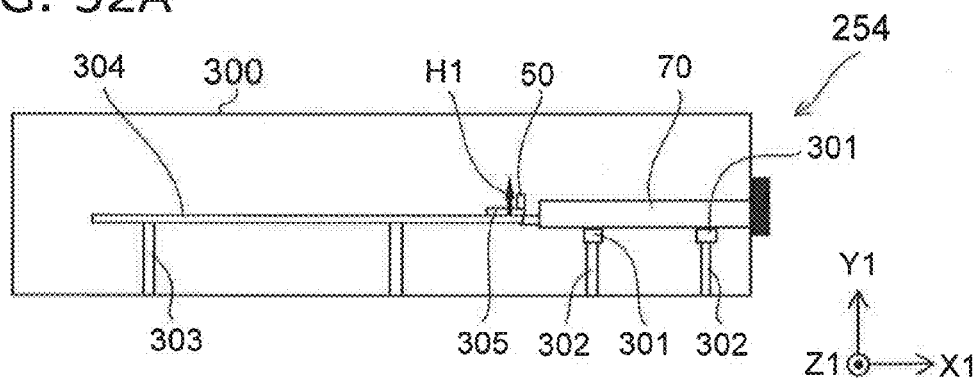
FIG. 32A to FIG. 32C are schematic views illustrating operations of the current sensor module according to the third embodiment.
Figure 32B:
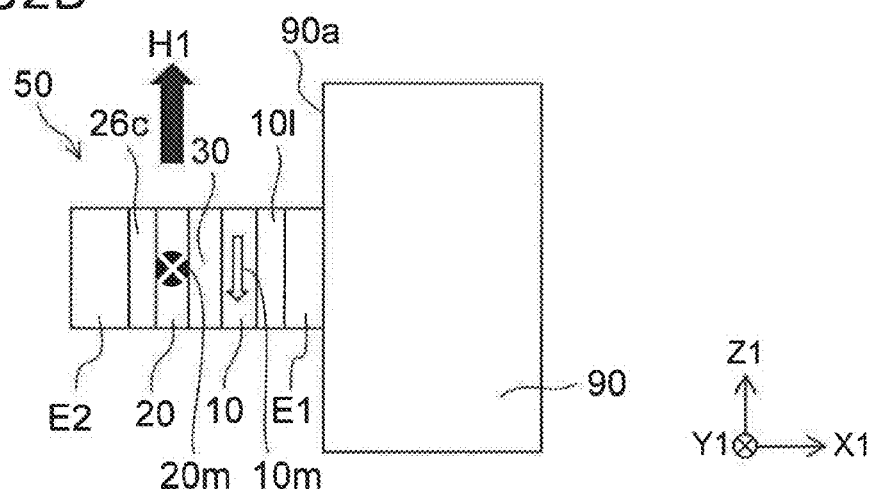
Figure 32C:
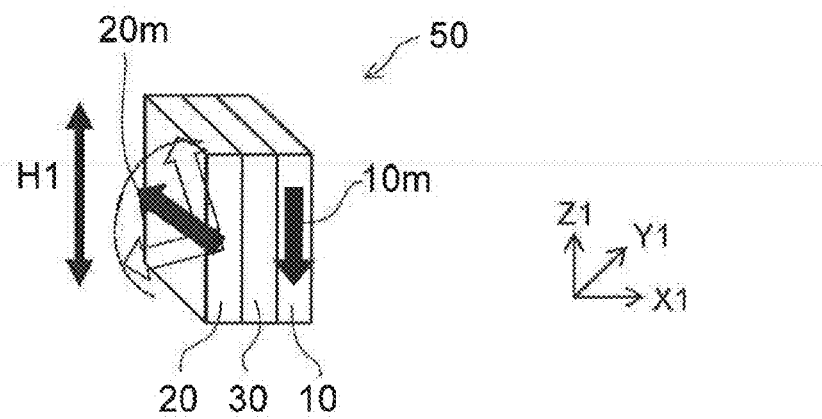

FIG. 32A to FIG. 32C are schematic views illustrating operations of the current sensor module according to the third embodiment.

FIG. 32A is a perspective plan view illustrating the current sensor module 254.

FIG. 32B is a schematic cross-sectional view illustrating the sensor element 50 used in the current sensor module 254.

FIG. 32C is a schematic perspective view illustrating the sensor element 50 used in the current sensor module 254.

In each of the sensor elements 50 as shown in FIG. 32A to FIG. 32C, the direction of the magnetization 20m of the second magnetic layer 20 is, for example, a direction in a plane parallel to the direction (e.g., the X1-axis direction) in which the power line 70 extends when the magnitude of the current I1 is zero. The direction of the magnetization 20m is, for example, a direction parallel to the direction in which the power line 70 extends when the magnitude of the current I1 is zero. The direction (the Z-axis direction) from the first magnetic layer 10 toward the second magnetic layer 20 is a direction in the X1-Y1 plane and is, for example, parallel to the Y1-axis direction.

The substrate surface 90a is, for example, substantially parallel to the direction in which the power line 70 extends. The sensor element 50 (the first sensor element) is provided on the substrate surface 90a. The direction from the first magnetic layer 10 toward the second magnetic layer 20 is substantially perpendicular to the direction in which the power line 70 extends. The direction of the magnetization 20m is substantially parallel (or antiparallel) to the direction in which the power line 70 extends when the current I1 does not flow. Thereby, alternating current of any polarity can be sensed.

Figure 33A:
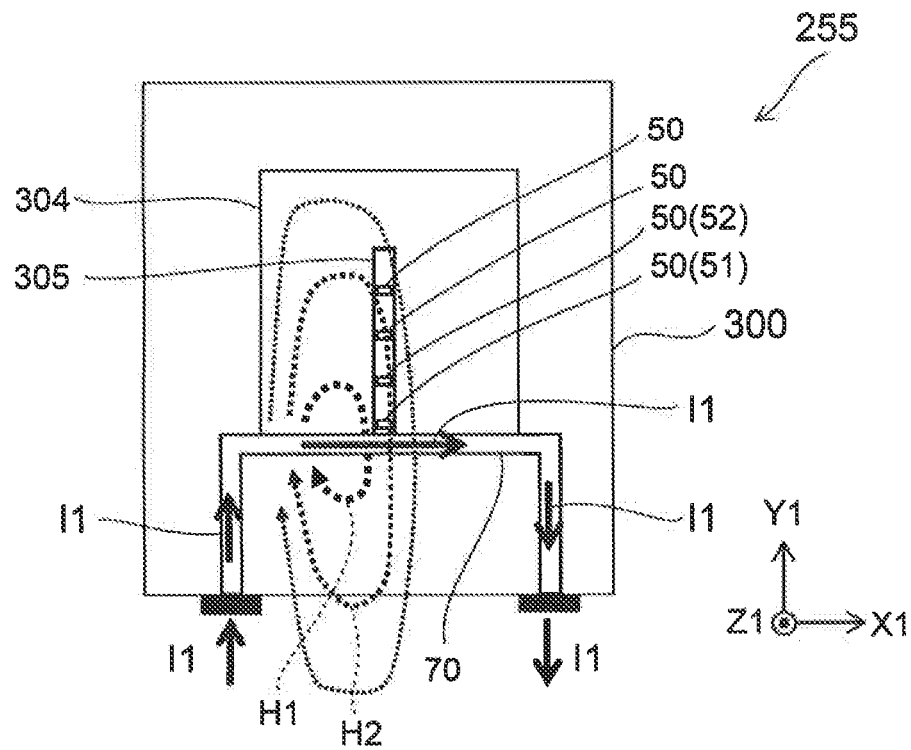
FIG. 33A and FIG. 33B are perspective plan views illustrating a current sensor module according to the third embodiment.
Figure 33B:
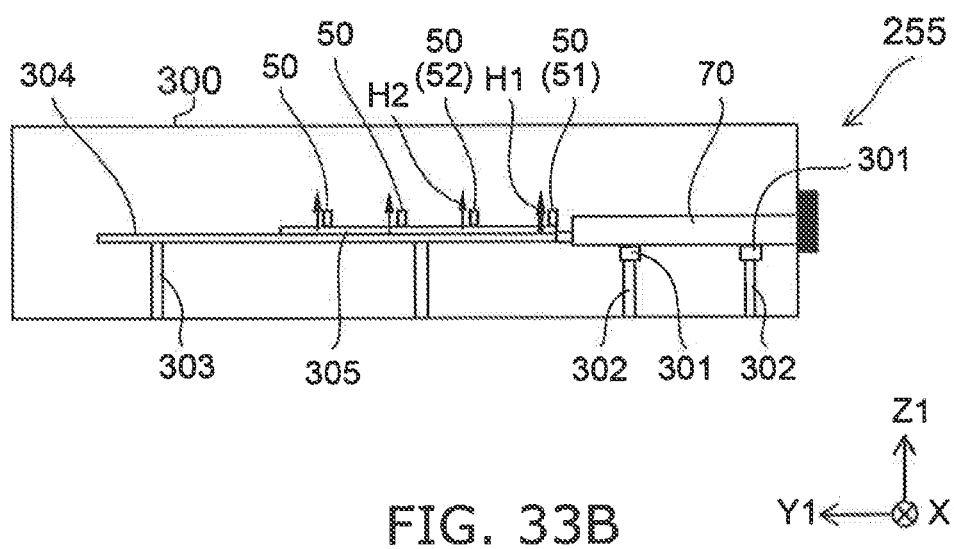

FIG. 33A and FIG. 33B are perspective plan views illustrating a current sensor module according to the third embodiment.

As shown in FIG. 33A and FIG. 33B, multiple sensor elements 50 are provided in the current sensor module 255. Otherwise, a configuration similar to that of the current sensor module 254 is applicable to the current sensor module 255.

For example, the multiple sensor elements 50 are separated from each other in a direction (e.g., the Y1-axis direction) intersecting the direction (e.g., the X1-axis direction) in which the power line 70 extends. For example, the multiple sensor elements 50 include the first sensor element 51 and the second sensor element 52. For example, the second sensor element 52 is separated from the first sensor element 51 in the Y1-axis direction. For example, the distance between the power line 70 and the first sensor element 51 is shorter than the distance between the power line 70 and the second sensor element 52. By such a disposition, current having a wide range of values can be sensed.

Figure 34:
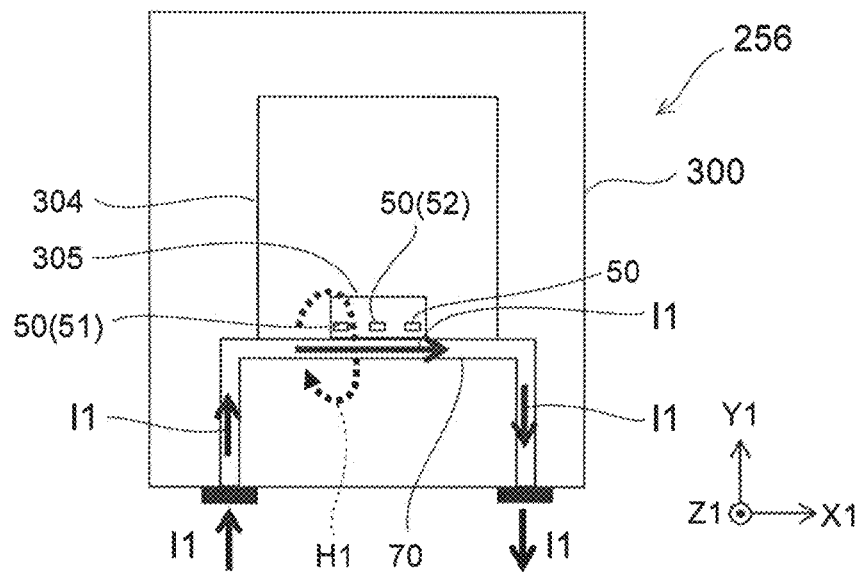
FIG. 34 is a perspective plan view illustrating a current sensor module according to the third embodiment.

FIG. 34 is a perspective plan view illustrating a current sensor module according to the third embodiment. As shown in FIG. 34, the multiple sensor elements 50 are provided in the current sensor module 256. Otherwise, a configuration similar to that of the current sensor module 254 is applicable to the current sensor module 256.

The multiple sensor elements 50 are disposed to be proximal to each other in, for example, the direction in which the power line 70 extends. Unlike the case of FIG. 33, the distance to the power line is the same for each of the multiple sensor elements 50. Therefore, the elements may not be provided to be separated from each other. It is possible to provide the elements to be proximal to each other. To reduce the manufacturing cost, unlike FIG. 34, a configuration is possible in which multiple current sensors are multiply provided on the same substrate. It is possible to reduce the cost by making the multiple current sensors on the same substrate.

Multiple sensor elements having mutually-different sensitivities to the magnetic field are provided. Thereby, for example, current having a wide range of values can be sensed. As shown in FIG. 28 and FIG. 29, methods for changing the sensitivity include methods for changing the strength of the magnetic field from the bias layer, etc.

Figure 35:
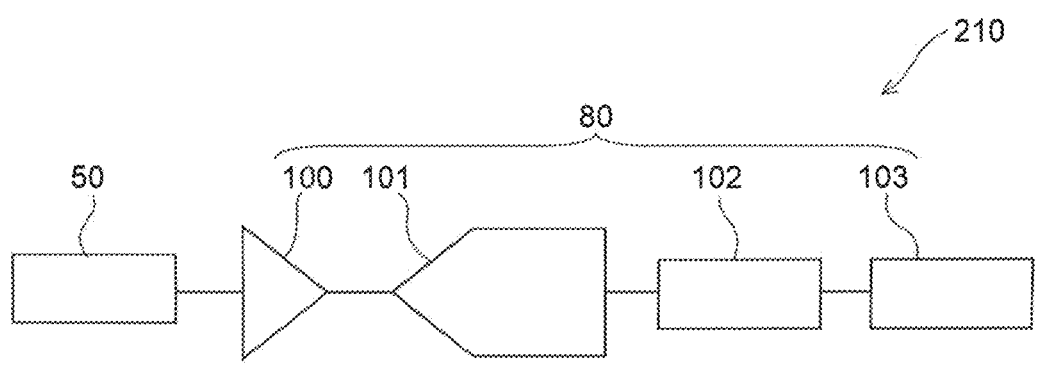
FIG. 35 is a schematic view illustrating a current sensor according to the third embodiment.

FIG. 35 is a schematic view illustrating a current sensor according to the third embodiment.

For example, the current sensor 210 according to the embodiment includes the sensor element 50 and the processor 80. The processor 80 includes an amplifier 100, an analog-to-digital converter (ADC) 101, memory 102, and a communication circuit 103.

The output signal (the first signal Sg1 obtained from the first sensor element 51) of the sensor element 50 is amplified by the amplifier 100. The signal that is amplified is converted into a digital signal by the analog-to-digital converter 101. The digital signal that is converted is retained in the memory 102. The digital signal that is retained in the memory 102 is transmitted to a peripheral device by the communication circuit 103.

FIG. 36A to FIG. 36D are schematic views illustrating operations of the current sensor module according to the third embodiment.

FIG. 36A to FIG. 36D show the response to the magnetic field of the sensor element 50 of the current sensor module 250. In the example, the direction of the magnetization 10m of the first magnetic layer 10 is parallel to the X-axis direction.

Figure 36A:
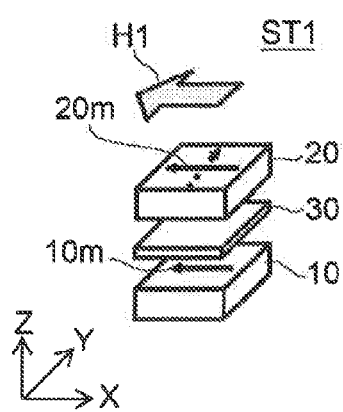
FIG. 36A to FIG. 36D are schematic views illustrating operations of the current sensor module according to the third embodiment.

FIG. 36A shows the sensor element 50 in a first state ST1. A magnetic field Hs1 is applied to the sensor element 50 in the first state ST1. The magnetic field Hs1 is generated by the current flowing in the power line 70. For example, the direction of the magnetic field Hs1 is parallel to the direction of the magnetization 20m. The magnitude of the magnetic field Hs1 is Hs. For example, the direction of the magnetization 10m of the first magnetic layer 10 is parallel to the direction of the magnetization 20m in the first state ST1.

Figure 36B:
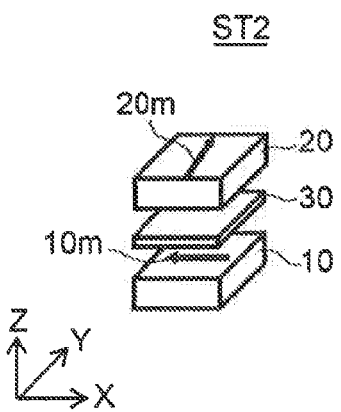

FIG. 36B shows the sensor element 50 in a second state ST2. For example, the current does not flow in the power line 70 in the second state ST2. A magnetic field is not applied to the sensor element 50. For example, the direction of the magnetization 10m of the first magnetic layer 10 is perpendicular to the direction of the magnetization 20m in the second state ST2.

Figure 36C:
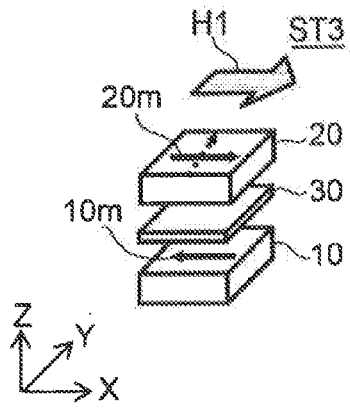

FIG. 36C shows the sensor element 50 in a third state ST3. A magnetic field Hs2 is applied to the sensor element 50 in the third state ST3. The magnetic field Hs2 is generated by the current flowing in the power line 70. For example, the direction of the magnetic field Hs2 is antiparallel to the direction of the magnetization 20m. The magnitude of the magnetic field Hs2 is Hs. The direction of the magnetization 10m is antiparallel to the direction of the magnetization 20m in the second state ST2.

Figure 36D:
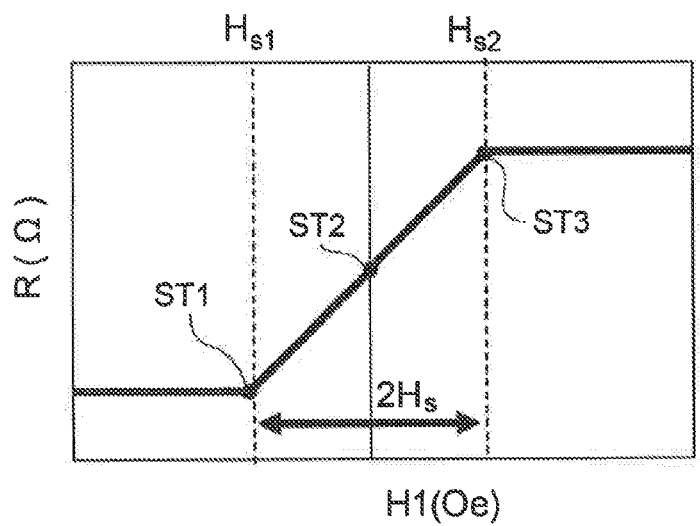

FIG. 36D shows the response to the magnetic field of the sensor element 50. The horizontal axis of FIG. 36D is the magnetic field H1. The vertical axis of FIG. 36D is the electrical resistance R of the sensor element 50. As shown in FIG. 36D, for example, the electrical resistance R changes linearly with the magnetic field H1 when a magnetic field H1 less than Hs is applied in a direction parallel to the X-axis. The sensor element 50 can sense a magnetic field less than Hs.

Figure 37:
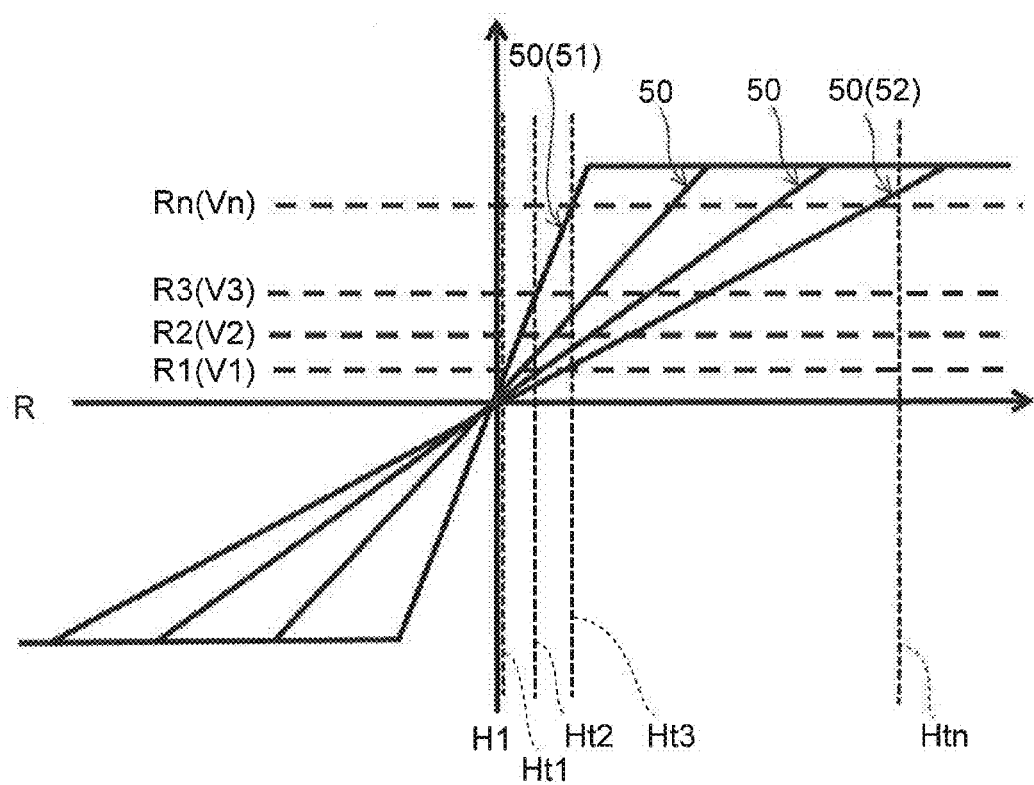
FIG. 37 is a schematic view illustrating operations of the current sensor module according to the third embodiment.

FIG. 37 is a schematic view illustrating operations of the current sensor module according to the third embodiment.

FIG. 37 shows the response to the magnetic field of the sensor element 50 of the current sensor module 252.

The horizontal axis of FIG. 37 is the magnetic field H1. The vertical axis of FIG. 37 is the electrical resistance R of the sensor element 50. For example, multiple sensor elements 50 having mutually-different sensitivities to the magnetic field are provided in the current sensor module 252.

As shown in FIG. 37, for example, the tilt of the electrical resistance R with respect to the magnetic field H1 for the first sensor element 51 is larger than the tilt of the electrical resistance R with respect to the magnetic field H2 for the second sensor element 52. In other words, the sensitivity to the magnetic field of the first sensor element 51 is higher than the sensitivity to the magnetic field of the second sensor element 52.

For example, the first sensor element 51 can measure current corresponding to a magnetic field having a magnitude in the range of not less than Ht1 and not more than Ht3. In the first sensor element 51, the magnetic field having the magnitude in the range of not less than Ht1 and not more than Ht3 corresponds to, for example, a resistance change from R1 to R3. The resistance change from R1 to R3 corresponds to, for example, an output voltage from V1 to V3.

For example, the second sensor element 52 can measure a current corresponding to a magnetic field having a magnitude in the range of not less than Ht3 and not more than Htn. In the second sensor element 52, the magnetic field having the magnitude in the range of not less than Ht3 and not more than Htn corresponds to, for example, an output voltage from V3 to Vn.

For example, the output voltage of the first sensor element 51 for the magnetic field having the magnitude of Ht3 is different from the output voltage of the second sensor element 52 for the magnetic field having the magnitude of Ht3. The output voltage for the same magnetic field is different according to the element. Therefore, the magnitude of the magnetic field can be measured by identifying the sensor element from which the output voltage is output.

Figure 38:
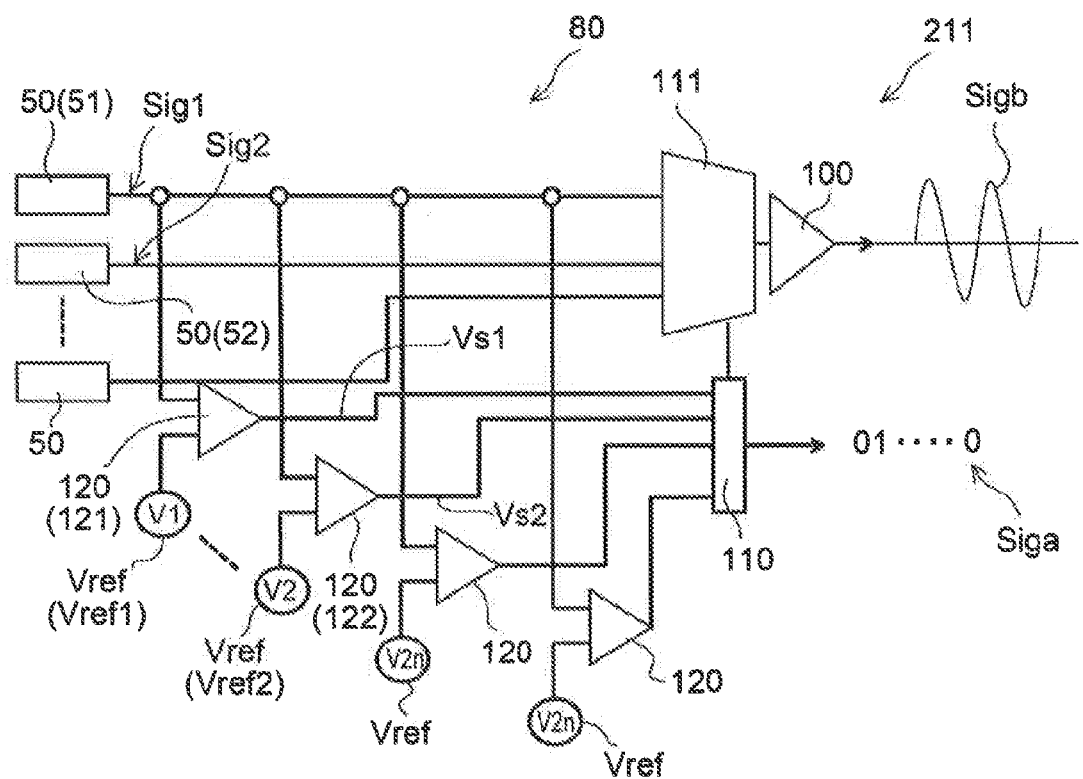
FIG. 38 is a schematic view illustrating a current sensor according to the third embodiment.

FIG. 38 is a schematic view illustrating a current sensor according to the third embodiment.

The current sensor 211 according to the embodiment includes the multiple sensor elements 50 and the processor 80. In the example, the processor 80 includes multiple comparators 120, a register 110, a multiplexer 111, and the amplifier 100. For example, the multiple sensor elements 50 include the first sensor element 51 and the second sensor element 52. The processor 80 includes a first comparator 121 and a second comparator 122.

The multiple sensor elements 50 are connected to the multiple comparators 120 and the multiplexer 111. Each of the comparators 120 is preset to, for example, a reference value Vref. Each of the comparators 120 compares the reference value Vref and the output of one of the multiple sensor elements 50. For example, "1" is output when the output of the sensor element 50 is larger than the reference value Vref; and "0" is output when the output of the sensor element 50 is smaller than the reference value Vref.

Each of the multiple comparators 120 selects, for example, the sensor element 50 estimated to output the appropriate value for the magnetic field and transmits the selected result to the register 110 (the operation value is output). The register 110 retains an element selection signal Siga (an element selection value) based on the operation values output from each of the comparators 120 and transmits the element selection signal Siga to the multiplexer 111.

The multiplexer 111 is connected to the multiple sensor elements 50. The multiplexer 111 outputs the output of one of the sensor elements 50 to the amplifier 100 based on the element selection signal Siga. Thus, for example, the sensor elements are selected uniquely by the multiplexer 111. The amplifier 100 amplifies the output of the selected sensor element 50 and outputs the output as an analog signal Sigb. Thereby, an appropriate output for the magnetic field can be obtained.

For example, a first reference value Vref1 is predetermined for the first comparator 121; and a second reference value Vref2 is predetermined for the second comparator 122. The first comparator 121 compares the first reference value Vref1 and the first signal Sig1 output by the first sensor element 51 and outputs a first operation value Vs1 to the register 110. The second comparator 122 compares the second reference value Vref2 and the second signal Sig2 output by the second sensor element 52 and outputs a second operation value Vs2 to the register 110. The register 110 retains the element selection value based on the first operation value Vs1 and the second operation value Vs2 and outputs the element selection value to the multiplexer 111. The multiplexer 111 outputs a signal based on the element selection value, the first signal Sig1, and the second signal Sig2.

The current sensor according to the embodiment can sense a current with high precision for a wide dynamic range. As described above, for example, the current sensor according to the embodiment is used in a current sensor module. The current sensor according to the embodiment may be used in the electric power measurement of household electronic appliances. For example, the current sensor according to the embodiment may be used in a HEMS.

Figure 39:
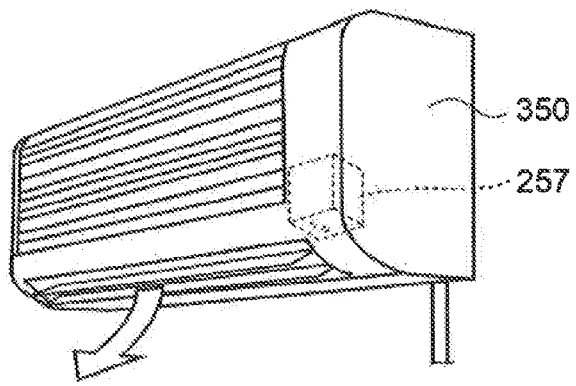
FIG. 39 is a schematic view illustrating a current sensor module according to the third embodiment.

FIG. 39 is a schematic view illustrating a current sensor module according to the third embodiment.

As shown in FIG. 39, the electrical power of a household electronic appliance 350 can be measured using the current sensor module 257 according to the embodiment.

Figure 40A:
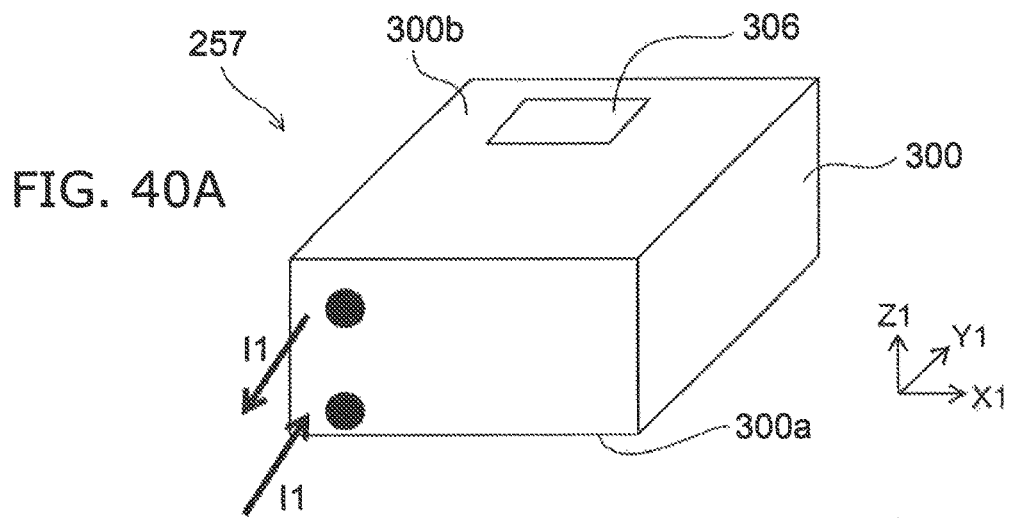
FIG. 40A to FIG. 40C are schematic views illustrating the current sensor module according to the third embodiment.
Figure 40B:
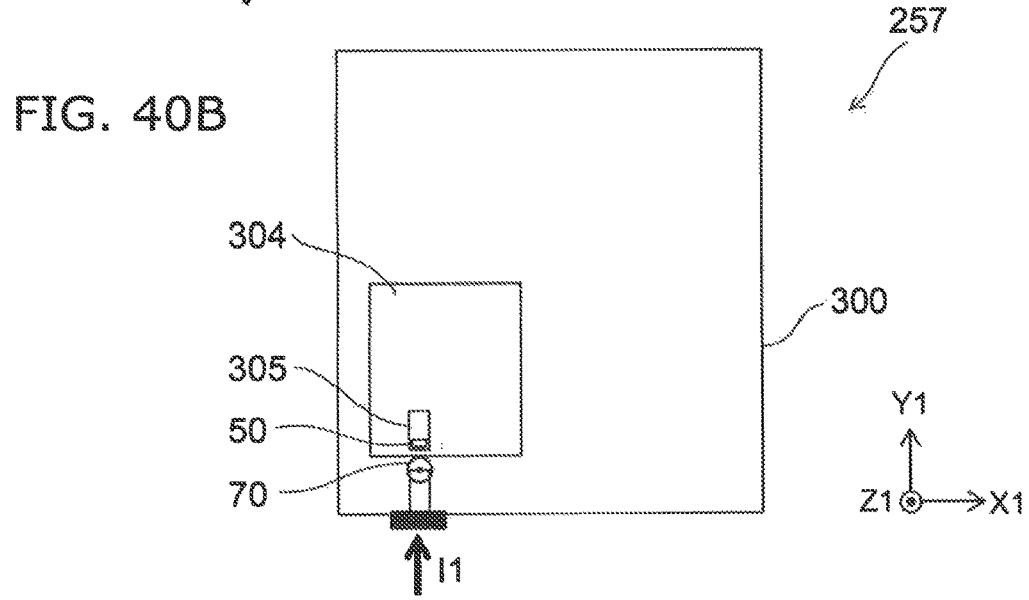
Figure 40C:
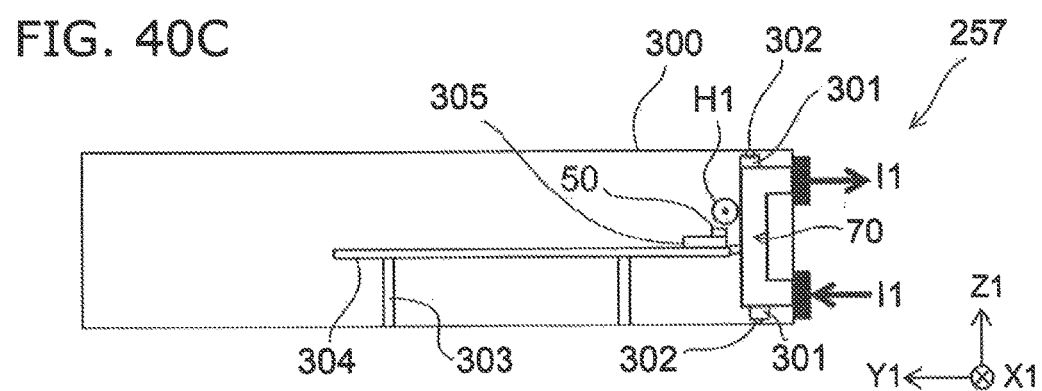

FIG. 40A to FIG. 40C are schematic views illustrating the current sensor module according to the third embodiment.

As shown in FIG. 40, the current sensor module 257 includes the housing 300, the power line 70, the sensor element 50, the insulator 301, the power line supporter 302, the substrate supporter 303, the electronic substrate module 304, and the sensor substrate module 305. A configuration similar to that of the current sensor module 250 is applicable to the current sensor module 257. Configurations similar to those of the current sensor modules 251 to 256 are applicable to the current sensor module 257. In the current sensor module 257 as well, it is favorable for the relative positions of the household electronic appliance 350 and the current sensor module 257 not to change easily. The power line 70 is connected to the power line of the household electronic appliance 350. Thereby, the electrical power can be measured.

FIG. 41A to FIG. 41D are schematic views illustrating the current sensor module according to the third embodiment.

FIG. 41A to FIG. 41D show the sensor element 50 (51g) used in the current sensor module according to the third embodiment.

As shown in FIG. 41A, the sensor element 51g includes the first electrode E1, the second electrode E2, the foundation layer 10l, the pinning layer 10p, the first magnetic layer 10, the intermediate layer 30, the second magnetic layer 20, and the capping layer 26c. The configurations described in regard to the sensor element 50 are applicable to these components. An in-stack bias layer 60 is further provided in the sensor element 51g. The in-stack bias layer 60 is provided between the second magnetic layer 20 and the capping layer 26c.

The in-stack bias layer 60 includes a decoupling layer 61, a bias magnetic layer 62, and a bias pinning layer 63. The bias magnetic layer 62 includes a first bias magnetic layer 62a, a second bias magnetic layer 62b, and a bias magnetic coupling layer 62c.

The decoupling layer 61 is provided between the second electrode E2 and the second magnetic layer 20. The bias magnetic layer 62 is provided between the decoupling layer 61 and the second electrode E2. The bias pinning layer 63 is provided between the bias magnetic layer 62 and the second electrode E2. The first bias magnetic layer 62a is provided between the decoupling layer 61 and the bias pinning layer 63. The second bias magnetic layer 62b is provided between the first bias magnetic layer 62a and the bias pinning layer 63. The bias magnetic coupling layer 62c is provided between the first bias magnetic layer 62a and the second bias magnetic layer 62b. The decoupling layer 61 is nonmagnetic. The bias pinning layer 63 pins the magnetization direction of the bias magnetic layer 62.

FIG. 41B to FIG. 41D show a method for manufacturing the sensor element 51g.

The sensor element 51g is annealed in a magnetic field as shown in FIG. 41B. In the example, the direction of a magnetization 10jm of the second fixed magnetic layer 10j is parallel to the X-axis direction. A first anneal is performed in a state in which a magnetic field Hx is applied in a direction parallel to the direction of the magnetization 10jm. At this time, the direction of a magnetization 62m of the bias magnetic layer 62 is parallel to the X-axis direction.

Subsequently, as shown in FIG. 41C, a second anneal is performed in a state in which a magnetic field Hy is applied in a direction perpendicular to the direction of the magnetization 10jm. At this time, the direction of the magnetization 62m of the bias magnetic layer 62 is parallel to the Y-axis direction.

As shown in FIG. 41D, the direction of the magnetization 62m is parallel to the Y-axis direction at room temperature.

A bias magnetic field may be applied to the first magnetic layer 10 by an in-stack bias layer. For example, one of the thickness of the decoupling layer 61, the thickness of the first bias magnetic layer 62a, the thickness of the second bias magnetic layer 62b, or the thickness of the bias pinning layer 63 is adjusted. Thereby, the sensitivity to the magnetic field of the sensor element 51g can be changed.

According to the embodiment, a high-precision current sensor can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the first electrode, the second electrode, the third electrode, the fourth electrode, the first stacked body, the second stacked body, the first magnetic layer, the second magnetic layer, the third magnetic layer, the fourth magnetic layer, the intermediate layer, the second intermediate layer, the first sensor element, the second sensor element, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all current sensors and all current sensor modules practicable by an appropriate design modification by one skilled in the art based on the current sensors and the current sensor modules described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A current sensor, comprising:
   a first sensor element including:
   a first electrode;
   a second electrode; and
   a first stacked body provided between the first electrode and the second electrode, the first stacked body including:
      a first magnetic layer;
      a second magnetic layer provided between the first magnetic layer and the second electrode; and
      a first intermediate layer provided between the first magnetic layer and the second magnetic layer, the first intermediate layer being nonmagnetic;
   a power line;
   a second sensor element including:
      a third electrode;
      a fourth electrode; and
      a second stacked body provided between the third electrode and the fourth electrode, the second stacked body including:
         a third magnetic layer;
         a fourth magnetic layer provided between the third magnetic layer and the fourth electrode; and
         a second intermediate layer provided between the third magnetic layer and the fourth magnetic layer, the second intermediate layer being nonmagnetic; and
   a processor processing a first signal and a second signal, the first signal being obtained from the first sensor element, the second signal being obtained from the second sensor element,
   a magnetization of the second magnetic layer being configured to change according to a magnetic field generated by a current flowing through the power line,
   a magnetization of the fourth magnetic layer being configured to change according to the magnetic field,
   wherein the processor outputs a signal based on one selected from the first signal and the second signal based on a magnitude of the current determined from at least one selected from the first signal and the second signal.

2. The sensor according to claim 1, wherein the first stacked body further includes a first functional layer provided between the second magnetic layer and the second electrode, the first functional layer including at least one selected from an oxide and a nitride.

3. The sensor according to claim 2, wherein
   the first functional layer includes at least one selected from an oxide material and a nitride material,
   the oxide material includes at least one first element selected from a first group consisting of Mg, Al, Si, Ti, V, Cr, Zn, Zr, Nb, Mo, Hf, Ta, and W, and
   the nitride material includes at least one second element selected from the first group.

4. The sensor according to claim 1, wherein the first sensor element is arranged with the power line in a direction intersecting an extension direction of the power line.

5. The sensor according to claim 1,
   wherein a concentration of boron in at least a portion of the fourth magnetic layer is not less than 5 atomic percent and not more than 35 atomic percent.

6. The sensor according to claim 5, wherein the second stacked body further includes a second functional layer provided between the fourth magnetic layer and the fourth electrode, the second functional layer including at least one selected from an oxide and a nitride.

7. The sensor according to claim 6, wherein
   the second functional layer includes at least one selected from an oxide material and a nitride material,
   the oxide material includes at least one first element selected from a first group consisting of Mg, Al, Si, Ti, V, Cr, Zn, Zr, Nb, Mo, Hf, Ta, and W, and
   the nitride material includes at least one second element selected from the first group.

8. The sensor according to claim 1,
   wherein the second sensor element is arranged with the power line in a direction intersecting an extension direction of the power line.

9. The sensor according to claim 1, wherein a distance between the first sensor element and the power line having the flowing current is shorter than a distance between the second sensor element and the power line.

10. A current sensor, comprising:
    a first sensor element including:
    a first electrode;
    a second electrode; and
    a first stacked body provided between the first electrode and the second electrode, the first stacked body including:
       a first magnetic layer;
       a second magnetic layer provided between the first magnetic layer and the second electrode; and
       a first intermediate layer provided between the first magnetic layer and the second magnetic layer, the first intermediate layer being nonmagnetic;
    a power line; and
    a second sensor element including:
       a third electrode;
       a fourth electrode; and
       a second stacked body provided between the third electrode and the fourth electrode, the second stacked body including:
          a third magnetic layer;
          a fourth magnetic layer provided between the third magnetic layer and the fourth electrode; and
          a second intermediate layer provided between the third magnetic layer and the fourth magnetic layer, the second intermediate layer being nonmagnetic,
    wherein
       the first sensor element further includes a first magnetic bias layer provided between the first electrode and the second electrode, the first magnetic bias layer being arranged with the first stacked body in a second direction intersecting a first direction from the first electrode toward the second electrode,
       the second sensor element further includes a second magnetic bias layer provided between the third electrode and the fourth electrode, the second magnetic bias layer is arranged with the second stacked body in a fourth direction intersecting a third direction from the third electrode toward the fourth electrode, a magnetization of the second magnetic layer is configured to change according to a magnetic field generated by a current flowing through the power line, a distance between the first magnetic bias layer and the first stacked body is shorter than a distance between the second magnetic bias layer and the second stacked body.

11. A current sensor, comprising:
a first sensor element including:
   a first electrode;
   a second electrode; and
   a first stacked body provided between the first electrode and the second electrode, the first stacked body including:
      a first magnetic layer;
      a second magnetic layer provided between the first magnetic layer and the second electrode; and
      a first intermediate layer provided between the first magnetic layer and the second magnetic layer, the first intermediate layer being nonmagnetic;
a power line; and
a second sensor element including:
   a third electrode;
   a fourth electrode; and
   a second stacked body provided between the third electrode and the fourth electrode, the second stacked body including:
      a third magnetic layer;
      a fourth magnetic layer provided between the third magnetic layer and the fourth electrode; and
      a second intermediate layer provided between the third magnetic layer and the fourth magnetic layer, the second intermediate layer being nonmagnetic,
wherein
   the first sensor element further includes a first magnetic bias layer provided between the first electrode and the second electrode, the first magnetic bias layer being arranged with the first stacked body in a second direction intersecting a first direction from the first electrode toward the second electrode,
   the second sensor element further includes a second magnetic bias layer provided between the third electrode and the fourth electrode, the second magnetic bias layer is arranged with the second stacked body in a fourth direction intersecting a third direction from the third electrode toward the fourth electrode,
   a magnetic thickness of the first magnetic bias layer is thicker than a magnetic thickness of the second magnetic bias layer.

12. A current sensor, comprising:
a first sensor element including:
   a first electrode;
   a second electrode; and
   a first stacked body provided between the first electrode and the second electrode, the first stacked body including:
      a first magnetic layer;
      a second magnetic layer provided between the first magnetic layer and the second electrode; and
      a first intermediate layer provided between the first magnetic layer and the second magnetic layer, the first intermediate layer being nonmagnetic; and
a power line,
a magnetization of the second magnetic layer being configured to change according to a magnetic field generated by a current flowing through the power line, wherein
   the first sensor element further includes:
      a decoupling layer provided between the second electrode and the second magnetic layer, the decoupling layer being nonmagnetic;
      a bias magnetic layer provided between the decoupling layer and the second electrode; and
      a bias pinning layer provided between the bias magnetic layer and the second electrode, the bias pinning layer pinning a magnetization direction of the bias magnetic layer.

13. The sensor according to claim 1, wherein
the processor includes:
   an amplifier amplifying the first signal;
   an analog-to-digital converter converting the amplified first signal into a digital signal;
   memory retaining the digital signal; and
   a communication circuit transmitting the digital signal.

14. A current sensor, comprising:
a first sensor element including:
   a first electrode;
   a second electrode; and
   a first stacked body provided between the first electrode and the second electrode, the first stacked body including:
      a first magnetic layer;
      a second magnetic layer provided between the first magnetic layer and the second electrode; and
      a first intermediate layer provided between the first magnetic layer and the second magnetic layer, the first intermediate layer being nonmagnetic; and
a power line;
a second sensor element including:
   a third electrode;
   a fourth electrode; and
   a second stacked body provided between the third electrode and the fourth electrode, the second stacked body including:
      a third magnetic layer;
      a fourth magnetic layer provided between the third magnetic layer and the fourth electrode; and
      a second intermediate layer provided between the third magnetic layer and the fourth magnetic layer, the second intermediate layer being nonmagnetic; and
a processor processing a first signal and a second signal, the first signal being obtained from the first sensor element, the second signal being obtained from the second sensor element,
a magnetization of the second magnetic layer being configured to change according to a magnetic field generated by a current flowing through the power line,
wherein
   the processor includes:
      a register;
      a multiplexer;
      a first comparator comparing the first signal and a first reference value and outputting a first operation value to the register, the first reference value being predetermined; and
      a second comparator comparing the second signal and a second reference value and outputting a second operation value to the register, the second reference value being predetermined, the register retains an element selection value based on the first operation value and the second operation value and outputs the element selection value to the multiplexer, and the multiplexer outputs a signal based on the element selection value, the first signal, and the second signal.

15. The sensor according to claim 1,
a concentration of boron in at least a portion of the second magnetic layer is not less than 5 atomic percent and not more than 35 atomic percent.

16. A current sensor module, comprising:

the current sensor according to claim 1;

a housing;

a first supporter regulating relative positions of the power line and the housing; and a second supporter regulating relative positions of the current sensor and the housing.

17. The module according to claim 16, wherein
a direction from the first magnetic layer toward the second magnetic layer is parallel to an extension direction of the power line, and
a direction of the magnetization of the second magnetic layer is parallel to a direction from the power line toward the first sensor element when the current is not flowing.

18. The module according to claim 16, wherein
a direction from the first magnetic layer toward the second magnetic layer is perpendicular to an extension direction of the power line, and
a direction of the magnetization of the second magnetic layer is parallel to the extension direction of the power line when the current is not flowing.

19. The sensor according to claim 1, wherein at least a portion of the second magnetic layer is amorphous.

20. The sensor according to claim 1, wherein at least a portion of the fourth magnetic layer is amorphous.

* * * * *